US012635502B2

(12) United States Patent
Chang

(10) Patent No.: US 12,635,502 B2
(45) Date of Patent: May 19, 2026

(54) DUMMY PATTERN STRUCTURE FOR REDUCING DISHING

(71) Applicant: Taiwan Semiconductor Manufacturing Company, Ltd., Hsinchu (TW)

(72) Inventor: Jen-Yuan Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 953 days.

(21) Appl. No.: 17/652,485

(22) Filed: Feb. 25, 2022

(65) Prior Publication Data

US 2023/0140683 A1      May 4, 2023

Related U.S. Application Data

(60) Provisional application No. 63/274,929, filed on Nov. 2, 2021.

(51) Int. Cl.
*H01L 23/52* (2006.01)
*H01L 21/321* (2006.01)
(Continued)

(52) U.S. Cl.
CPC .... *H01L 23/53238* (2013.01); *H01L 21/3212* (2013.01); *H01L 21/7684* (2013.01);
(Continued)

(58) Field of Classification Search
CPC ........... H01L 23/53238; H01L 21/3212; H01L 21/7684; H01L 21/76877; H01L 23/5226; H01L 24/03; H01L 25/0657; H01L 25/50;
H01L 24/80; H01L 2224/05546; H01L 2224/05557; H01L 2224/05567; H01L 2224/05573; H01L 2224/06183; H01L 2224/0807; H01L 2224/08112; H01L 2224/08121; H01L 2224/08123; H01L 2224/08145; H01L 2224/80895; H01L 2224/80896; H01L 2225/06513; H01L 2225/06541; H01L 2225/06544;
(Continued)

(56) References Cited

U.S. PATENT DOCUMENTS

2019/0363068 A1* 11/2019 Hotta ...................... H01L 24/80
2021/0305223 A1* 9/2021 Shih ........................ H01L 24/96
2022/0013502 A1* 1/2022 Lee ..................... H01L 23/5385

* cited by examiner

*Primary Examiner* — Samuel Park
(74) *Attorney, Agent, or Firm* — KILPATRICK TOWNSEND & STOCKTON LLP

(57) ABSTRACT

A semiconductor package includes: a first die, a second die and a bonding member arranged between the first and second die, wherein the bonding member is configured to facilitate a bonding between the first and second die and comprises a first area and a second area. The first area is configured with a first set of bonding pads configured to provide electrical connections between the first and second dies. The second area is configured with a second set of bonding pads configured to provide electrical connections between the first and second die, wherein a quantity of bonding pads in the first set is larger than a quantity of bonding pads in the second set. The second area is configured with a dummy structure in one or more spaces where a bonding pad is not present in the second area, the dummy structure not providing an electrical connection.

20 Claims, 34 Drawing Sheets

(51) Int. Cl.
    *H01L 21/768*        (2006.01)
    *H01L 23/00*         (2006.01)
    *H01L 23/522*       (2006.01)
    *H01L 23/532*       (2006.01)

(52) U.S. Cl.
    CPC .... *H01L 21/76877* (2013.01); *H01L 23/5226*
             (2013.01); *H01L 24/03* (2013.01)

(58) Field of Classification Search
    CPC ..... H01L 2225/06551; H01L 21/76898; H01L
                 24/05; H01L 24/08
    See application file for complete search history.

wafer 3
backside metallization
wafer 2
backside metallization
wafer 1

301a
302c
301b
302b
301a

312

104
103

311

401c    401b    401a     40

433

411    411    411

413

413
418

410b

414

413
418

410a

414

417

413

41

419

433

427

425

420a 440    428    424    423

42

428     421     428

421b

429

430

440

417    419

427    425

535

516

B ------- B'

540

545

535

540

516  516 516 516

1000

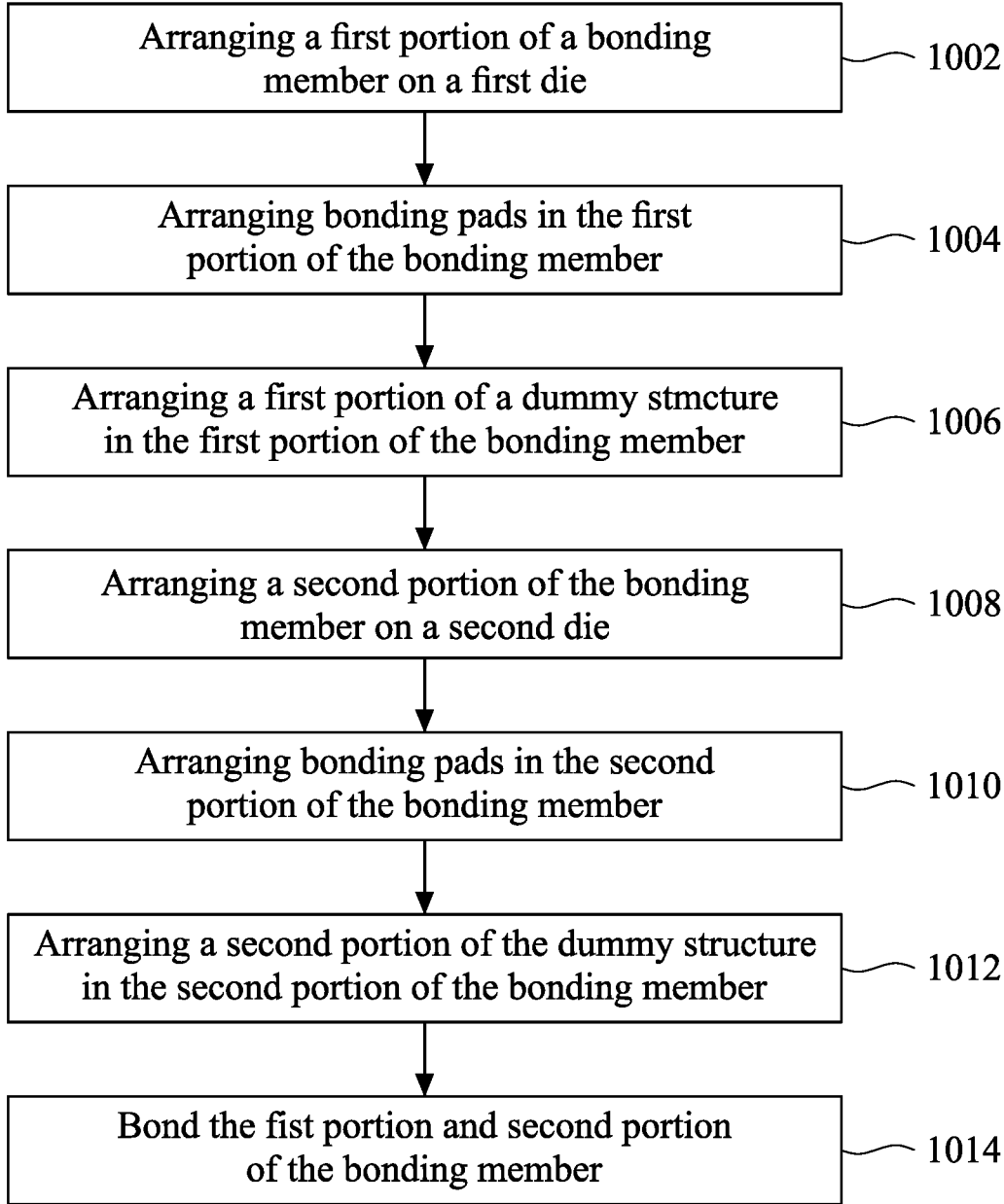

Arranging a first portion of a bonding member on a first die — 1002

Arranging bonding pads in the first portion of the bonding member — 1004

Arranging a first portion of a dummy stmcture in the first portion of the bonding member — 1006

Arranging a second portion of the bonding member on a second die — 1008

Arranging bonding pads in the second portion of the bonding member — 1010

Arranging a second portion of the dummy structure in the second portion of the bonding member — 1012

Bond the fist portion and second portion of the bonding member — 1014

FIG. 10 wafer 3
backside metallization
wafer 2
backside metallization
wafer 1 wafer 3
backside metallization
wafer 2
backside metallization
wafer 1

Individual die

1304
Dielectric
layers

Individual bar

21000

DUMMY PATTERN STRUCTURE FOR REDUCING DISHING

CROSS-REFERENCES TO RELATED APPLICATIONS

The present application claims priority to U.S. Provisional Patent Application No. 63/274,929, filed on Nov. 2, 2021, the entire disclosure of which is incorporated herein by reference.

TECHNICAL FIELD

The present disclosure relates to pattern layouts for stacked die assemblies, and more particularly to metal layer structures for reducing dishing and erosion effects.

BACKGROUND

Semiconductor dies can be electrically connected with other circuitry in a package substrate. The package substrate provides for electrical connection to other circuitry on a printed circuit board. Semiconductor dies can have different functions and are difficult to be processed using same semiconductor processing techniques, so they are manufactured separately. A large multi-functional device having high performance can be obtained by assembling multiple dies into the device. The multiple dies can be stacked together to form die groups, and the die groups are planarized to have a flat surface for bonding to a planar substrate. The planarization can be achieved by chemical mechanically polishing (CMP) processes. However, different layers of the dies or die groups may have different materials with different polish rates that can cause dishing and erosion effects.

Moreover, different die groups and the package substrate have different coefficients of thermal expansion (CTEs). For example, a silicon substrate in a device die may have a CTE of 2.5 ppm/° C., a dielectric layer may have a CTE between about 0.5 ppm/° C. to about 8 ppm/° C., while the package substrate may have a CTE of about 18 ppm/° C. The significantly different CTEs may cause warpage in the package substrate at high temperatures, e.g., in a solder reflow or during operation. The warpage in the package substrate can cause die and/or bump cracks and material delamination.

BRIEF DESCRIPTION OF THE DRAWINGS

The present disclosure is best understood from the following detailed description when read with the accompanying figures. It is noted that, in accordance with the standard practice in the industry, various features are not drawn to scale. In fact, the dimensions of the various features may be arbitrary increased or reduced for clarity of discussion.

FIG. 10 illustrates a method 1000 for fabricating a semiconductor package in accordance with the present disclosure.

DETAILED DESCRIPTION

Figure 1:
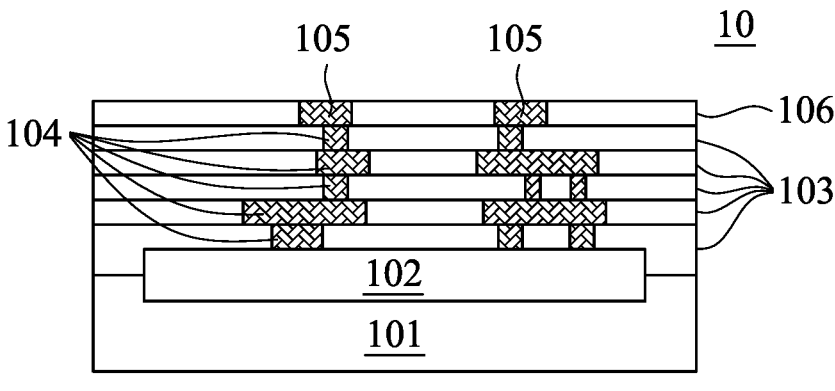
FIG. 1 is a cross-sectional view of a semiconductor device structure according to some exemplary embodiments.

The following disclosure provides many different embodiments or examples for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Prepositions, such as "on" and "side" (as in "sidewall") are defined with respect to the conventional plane or surface being on the top surface of the wafer or substrate, regardless of the orientation of the wafer or substrate. The term "horizontal" is defined as a plane parallel to the conventional plane or surface of a wafer or substrate, regardless of the orientation of the wafer or substrate. The term "vertical" refers to a direction perpendicular to the horizontal as defined above, i.e., perpendicular to the surface of a substrate. The terms "first," "second," "third," and "fourth" may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

There are many packaging technologies to house the semiconductors such as the 2D fan-out (chip-first) IC integration, 2D flip chip IC integration, PoP (package-on-package), SiP (system-in-package) or heterogeneous integration, 2D fan-out (chip-last) IC integration, 2.1D flip chip IC integration, 2.1D flip chip IC integration with bridges, 2.1D fan-out IC integration with bridges, 2.3D fan-out (chip-first) IC integration, 2.3D flip chip IC integration, 2.3D fan-out (chip-last) IC integration, 2.5D (solder bump) IC integration, 2.5D (μbump) IC integration, μbump 3D IC integration, μbump chiplets 3D IC integration, bumpless 3D IC integration, bumpless chiplets 3D IC integration, SoIC™ and/or any other packaging technologies. It should be understood various embodiments disclosed herein although are described and illustrated in a context of a specific semiconductor packaging technology, it is not intended to limit the present disclosure only to that packaging technology. One skilled in the art would understand those embodiments may be applied in other semiconductor technologies in accordance with principles, concepts, motivations, and/or insights provided by the present disclosure.

System on integrated chip (SoIC) is a recent development in advanced packaging technologies. SoIC technology integrates both homogeneous and heterogeneous chiplets into a single System-on-Chip (SoC)-like chip with a smaller footprint and thinner profile, which can be holistically integrated into advanced WLSI (aka CoWoS® service and InFO). From external appearance, the newly integrated chip is just like a general SoC chip yet embedded with desired and heterogeneously integrated functionalities. SoIC realizes 3D chiplets integration with additional advantages in performance, power and form factor. Among many other features, the SoIC™ features ultra-high-density-vertical stacking for high performance, low power, and min RLC (resistance-inductance-capacitance). SoIC integrates active and passive chips into a new integrated-SoC system to achieve better form factor and performance. US Patent Publication #20200168527, entitled "SoIC chip architecture" provides some descriptions about some example SoIC structures. US Patent Publication #20200168527 is incorporated by reference in its entirety. Another example of SoIC can be found at https://3dfabric.tsmc.com/english/dedicatedFoundry/technology/SoIC.htm, which is also incorporated by reference in the present disclosure in its entirety.

Numerous benefits and advantages are achieved by way of the present disclosure over conventional techniques. For example, embodiments provide a dummy structure arranged in a bonding member between two stacked dies. The dummy structure in those embodiments has a shape to achieve a desired pattern density within the bonding member to help prevent dishing effects in the bonding member. These and other embodiments of the disclosure, along with many of its advantages and features, are described in more detail in conjunction with the text below and corresponding figures.

Exemplary embodiments described herein relate to multi-chip devices having vertically stacked chips disposed on a base substrate. As used herein, chips and dies are used interchangeably and refer to pieces of a semiconductor wafer, to which a semiconductor manufacturing process has been performed, formed by separating the semiconductor wafer into individual dies. A chip or die can include a processed semiconductor circuit having a same hardware layout or different hardware layouts, same functions or different functions. In general, a chip or dies has a substrate, a plurality of metal lines, a plurality of dielectric layers interposed between the metal lines, a plurality of vias electrically connecting the metal lines, and active and/or passive devices. The dies can be assembled together to be a multi-chip device or a die group. As used herein, a chip or die can also refer to an integrated circuit including a circuit configured to process and/or store data. Examples of a chip, die, or integrated circuit include a field programmable gate array (e.g., FPGA), a processing unit, e.g., a graphics processing unit (GPU) or a central processing unit (CPU), an application specific integrated circuit (ASIC), memory devices (e.g., memory controller, memory), and the like.

Numerous benefits and advantages are achieved by way of the present disclosure over conventional techniques. For example, embodiments provide conductive material structures embedded in a bonding layer that can reduce or eliminate voids in a bonded structure, for example, such as stacked dies, chip on wafer (CoW), wafer on wafer (WoW), and/or any other bonded structure. Embodiments overcome problems associated with planarization of semiconductor devices, in particularly, when the planarization involves using polishing processes that can cause dishing of conductive structures, which may adversely affect the yield and reliability of hybrid bonding. In various embodiments, a process is employed during fabricating a multi-die structure to cause one or more portions of a barrier layer higher than dielectric layer and/or conductive material at a bonding interface of the multi-die structure. In those embodiments, when two dies in the multi-die structure are bonded at the bonding interface, the exposed barrier layer of one of the two dies can be pressed into the conductive material of the opposing die to help reduce or eliminate one or more voids in the bonding interface after the two dies are bonded. These and other embodiments of the disclosure, along with many of its advantages and features, are described in more detail in conjunction with the text below and corresponding figures.

Dies and Die Groups in Accordance with the Present Disclosure

In this section, an example individual die structure, an example stacked die structure in a die group, and an example wafer on wafer configuration having the example stacked die structure are provided to illustrate some embodiments where the present disclosure may be applied. It should be understood that the examples shown in this section are merely illustrative for understanding how the present disclosure may be applied in those examples. Thus, these examples should not be construed as being intended to limit the present disclosure. One skilled in the art will understand the present disclosure may be applied in other semiconductor packaging technologies wherever appropriate.

An Example Individual Die Structure In Accordance With the Present Disclosure

FIG. 1 is across-sectional view of a semiconductor device 10 according to some exemplary embodiments. Referring to FIG. 1, the semiconductor device 10 includes a substrate 101, an active region 102 formed on a surface of the substrate 101, a plurality of dielectric layers 103, a plurality of metal lines and a plurality of vias 104 formed in the dielectric layers 103, and a metal structure 105 in a top intermetal layer 106. In an embodiment, the semiconductor device 10 also includes passive devices, such as resistors, capacitors, diodes, inductors, and the like. The substrate 101 can be a semiconductor substrate or a non-semiconductor substrate. For example, the substrate 101 may include a bulk silicon substrate. In some embodiments, the substrate 101 may include an elementary semiconductor, such as silicon or germanium in a crystalline structure, a compound semiconductor, e.g., silicon germanium, silicon carbide, gallium arsenic, gallium phosphide, indium phosphide, indium arsenide, and/or indium antimonide, or combinations thereof. Substrate 101 may also include a semiconductor-on-insulator (SOI) substrate. In an embodiment, the substrate 101 is a silicon layer of an SOI substrate. The substrate 101 can include various doped regions depending on design requirements, e.g., n-type wells or p-type wells. The doped regions are doped with p-type dopants, e.g., boron, n-type dopants, e.g., phosphorous or arsenic, or combination thereof. The active region 102 may include transistors. The dielectric layers 103 may include interlayer dielectric (ILD) and intermetal dielectric (IMD) layers. The ILD and IMD layers may be low-k dielectric layers which have dielectric constants (k values) smaller than a predetermined value, e.g., about 3.9, smaller than about 3.0, smaller than about 2.5 in some embodiments. In some other embodiments, the dielectric layers 103 may include non-low-k dielectric materials having dielectric constants equal to or greater than 3.9. The metal lines and vias may include copper, aluminum, nickel, tungsten, cobalt, or alloys thereof.

An Example Stacked Die Structure In Accordance With the Present Disclosure

Figure 2:
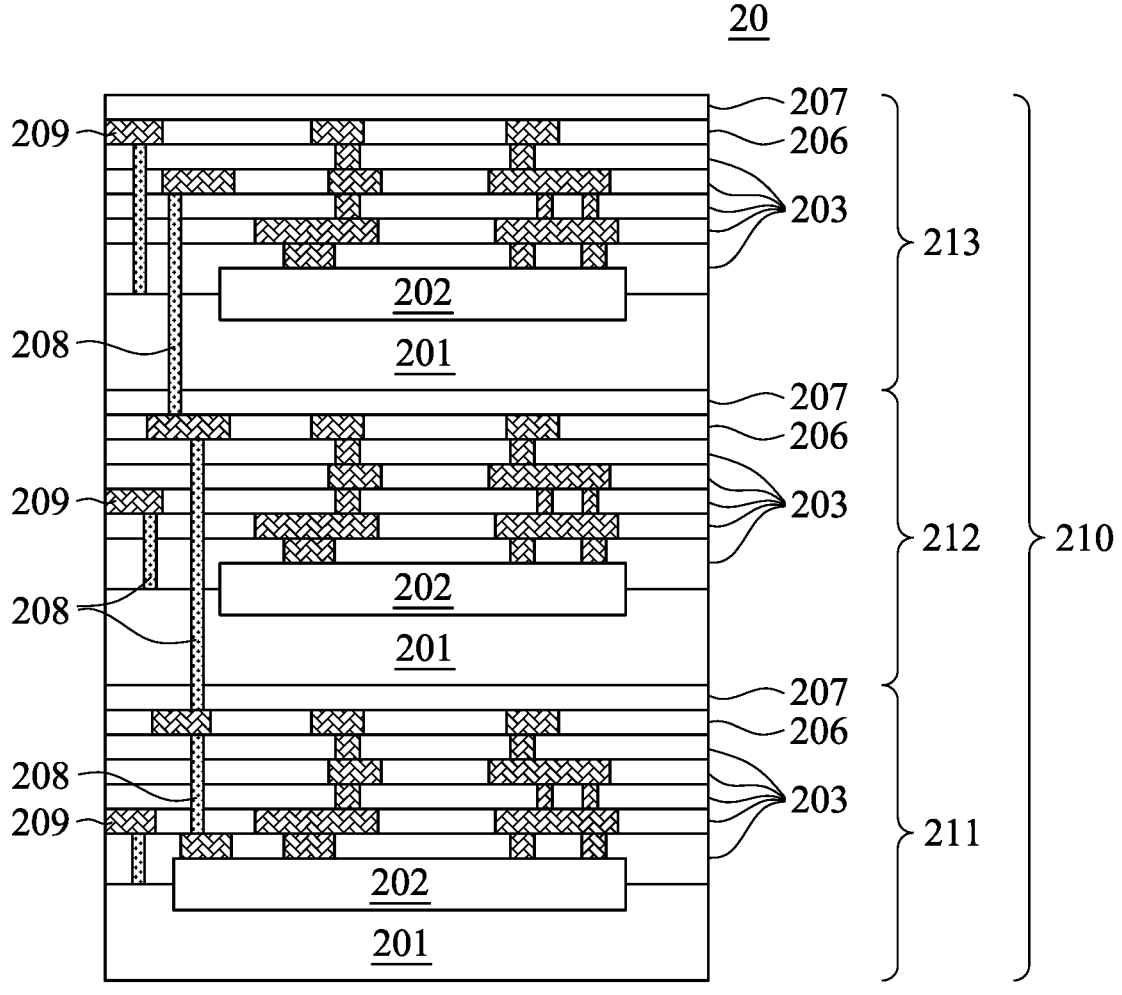
FIG. 2 is a cross-sectional view of a die group having a plurality of dies stacked on top of each other according to some embodiments.

FIG. 2 is a cross-sectional view of a die group 20 having a plurality of dies stacked on top of each other according to some embodiments. Referring to FIG. 2, the die group 20 includes a stacked dies structure 210 including a plurality of dies stacked on top of each other in a substantially horizontal arrangement. In an embodiment, each of the dies can a semiconductor device similar to the semiconductor device 10 of FIG. 1. For example, the stacked dies structure 210 includes stacked dies 211, 212, and 213. In an embodiment, the stacked dies are separated from each other by a passivation layer 207. Each of the stacked dies 211, 212, and 213 includes a substrate 201, an active region 202 formed on a surface of the substrate 201, a plurality of dielectric layers 203, a plurality of metal lines and a plurality of vias 204 formed in the dielectric layers 203, and a passivation layer 207 on a top intermetal layer 206. In an embodiment, a stacked die can also include passive devices, such as resistors, capacitors, diodes, inductors, and the like. The substrate 201 can be a semiconductor substrate or a non-semiconductor substrate. For example, the substrate 201 may include a bulk silicon substrate. In some embodiments, the substrate 201 may include an elementary semiconductor, such as silicon or germanium in a crystalline structure, a compound semiconductor, e.g., silicon germanium, silicon carbide, gallium arsenic, gallium phosphide, indium phosphide, indium arsenide, or combinations thereof. Possible substrate 201 may also include a semiconductor-on-insulator (SOI) substrate. In an embodiment, the substrate 201 is a silicon layer of an SOI substrate. The substrate 201 can wells. The doped regions are doped with p-type dopants, e.g., boron, n-type dopants, e.g., phosphorous or arsenic, or combination thereof. The active region 102 may include transistors. The dielectric layers 203 may include interlayer dielectric (ILD) and intermetal dielectric (IMD) layers. The ILD and IMD layers may be low-k dielectric layers which have dielectric constants (k values) smaller than a predetermined value, e.g., about 3.9, smaller than about 3.0, smaller than 2.5 in some embodiments. In some other embodiments, the dielectric layers 203 may include non-low-k dielectric materials having dielectric constants equal to or greater than 3.9. The metal lines and vias may include copper, aluminum, nickel, tungsten, or alloys thereof.

The die group 20 may also include one or more through silicon vias (TSVs) or through oxide vias (TOVs) 208 configured to electrically connect one or more of the metal lines in the stacked dies 211, 212, and 213 with each other. The one or more through silicon vias or through oxide vias 208 may include copper, aluminum, tungsten, or alloys thereof. In some embodiments, each of the stacked dies 211, 212, and 213 may also include a side metal interconnect structure 209 on a sidewall of the stack dies. The side metal interconnect structure 209 may include one or more metal wirings extending through an exposed surface of the plurality of dielectric layers 203. The side metal interconnect structure 209 may be formed at the same time as the metal layers and exposed to the side surface of the die group 20 after the dies 211, 212, and 213 have been bonded together and the side surface is polished by a chemical mechanical polishing (CMP) process.

In some embodiments, the die group 20 can be formed by bonding a plurality of wafers together using fusion bonding, eutectic bonding, metal-to-metal bonding, hybrid bonding processes, and the like. A fusion bonding includes bonding an oxide layer of a wafer to an oxide layer of another wafer. In an embodiment, the oxide layer can include silicon oxide. In an eutectic bonding process, two eutectic materials are placed together, and are applied with a specific pressure and temperature to melt the eutectic materials. In the metal-to-metal bonding process, two metal pads are placed together, a pressure and high temperature are provided to the metal pads to bond them together. In the hybrid bonding process, the metal pads of the two wafers are bonded together under high pressure and temperature, and the oxide surfaces of the two wafers are bonded at the same time.

In some embodiments, each wafer may include a plurality of dies, such as semiconductor devices of FIG. 1. The bonded wafers contain a plurality of die groups having a plurality of stacked dies. The bonded wafers are singulated by mechanical sawing, laser cutting, plasma etching, and the like to separate into individual die groups that can be the die group 20 as shown in FIG. 2.

Figure 3A:
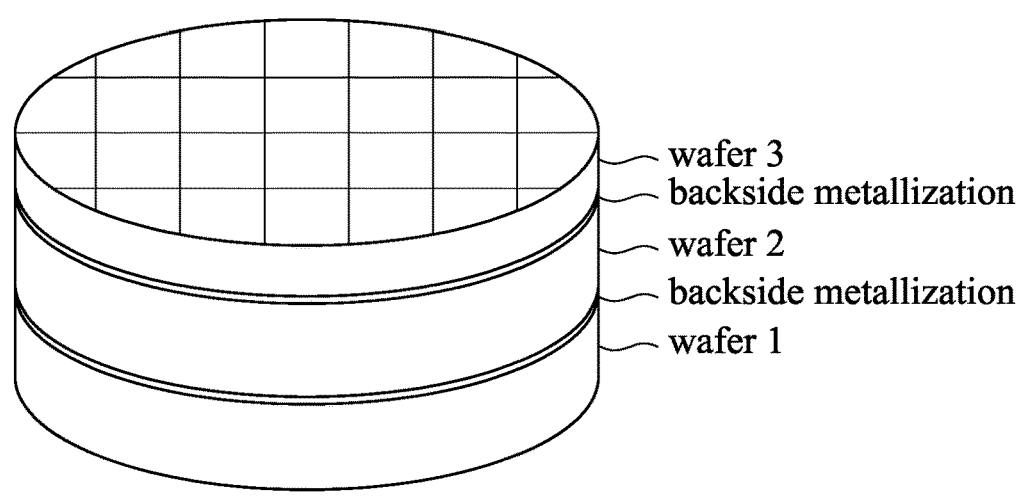
FIG. 3A is a simplified perspective view illustrating a plurality of wafers stacked on top of each other in a three-dimensional (3D) configuration according to some embodiments.

An Example Wafer on Wafer (WoW) Configuration In Accordance With the Present Disclosure FIG. 3A is a simplified perspective view illustrating a plurality of wafers stacked on top of each other in a three-dimensional (3D) configuration according to some embodiments. Referring to FIG. 3A, a first wafer 301a is a base wafer on which a plurality of dies can be formed. A second wafer 301b is an intermediate wafer on which a plurality of dies can be formed, and a third wafer 301c is a top wafer on which a plurality of dies can be formed. The wafers may have through-substrate vias and/or through-oxide vias and backside bonding layer (e.g., metallization layer and/or dielectric layer) 302b, 302c and are bonded together to form a 3D stacked wafer configuration using any known bonding techniques, e.g., fusion bonding, eutectic bonding, metal bonding, hybrid bonding, and the like. The three wafers 301a, 301b, and 301c are electrically connected to each other through-substrate vias (TSVs), through-oxide vias (TOVs), and/or backside metallization layer and dielectric layer. The wafers each can have different dies. For example, the first wafer 301a may include dies of central processing units, graphics processing units, and logic; the second wafer 301b may include dies of memory devices and memory controllers; and the third wafer 301c may include dies of bus interfaces, input/output ports, and communication and networking devices. In the example shown in FIG. 3A, three wafers are used, but it is understood that the number is illustrative only and is chosen for describing the example embodiment and should not be limiting. In some embodiments, a passivation layer is formed on the upper surface of each of the wafers and includes a thickness to provide separation between the substrate and the metallization layer. In an embodiment, the passivation layer includes an oxide material.

Figure 3B:
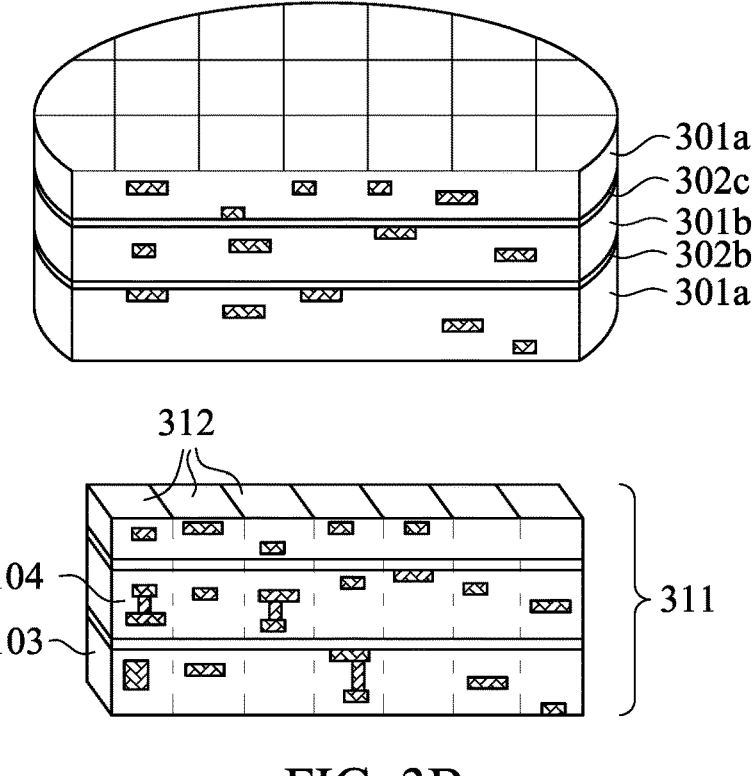
FIG. 3B is a simplified perspective view illustrating the stacked wafer configuration of FIG. 3A that has been cut and separated into individual bars according to an exemplary embodiment.

FIG. 3B is a simplified perspective view illustrating the stacked wafer configuration of FIG. 3A that has been cut and separated into individual bars according to an exemplary embodiment. For example, the stacked wafers can be cut into individual bars 311 and individual die groups 312 by mechanical sawing, plasma etching, laser cutting, and the like. Referring to FIG. 3B, each of the wafers include a substrate, a plurality of dielectric layers including interlayer dielectric layers (ILDs) and intermetal dielectric layers (IMDs), and a plurality of metal lines and a plurality of vias 104 formed in the dielectric layers 103. The dies of the stacked wafers are electrically coupled to each other through-substrate vias and through-oxide vias. In some embodiments, the individual bars are placed on a polishing board, and the surfaces of the bars are polished prior to being diced or singulated into die groups.

Figure 3C:
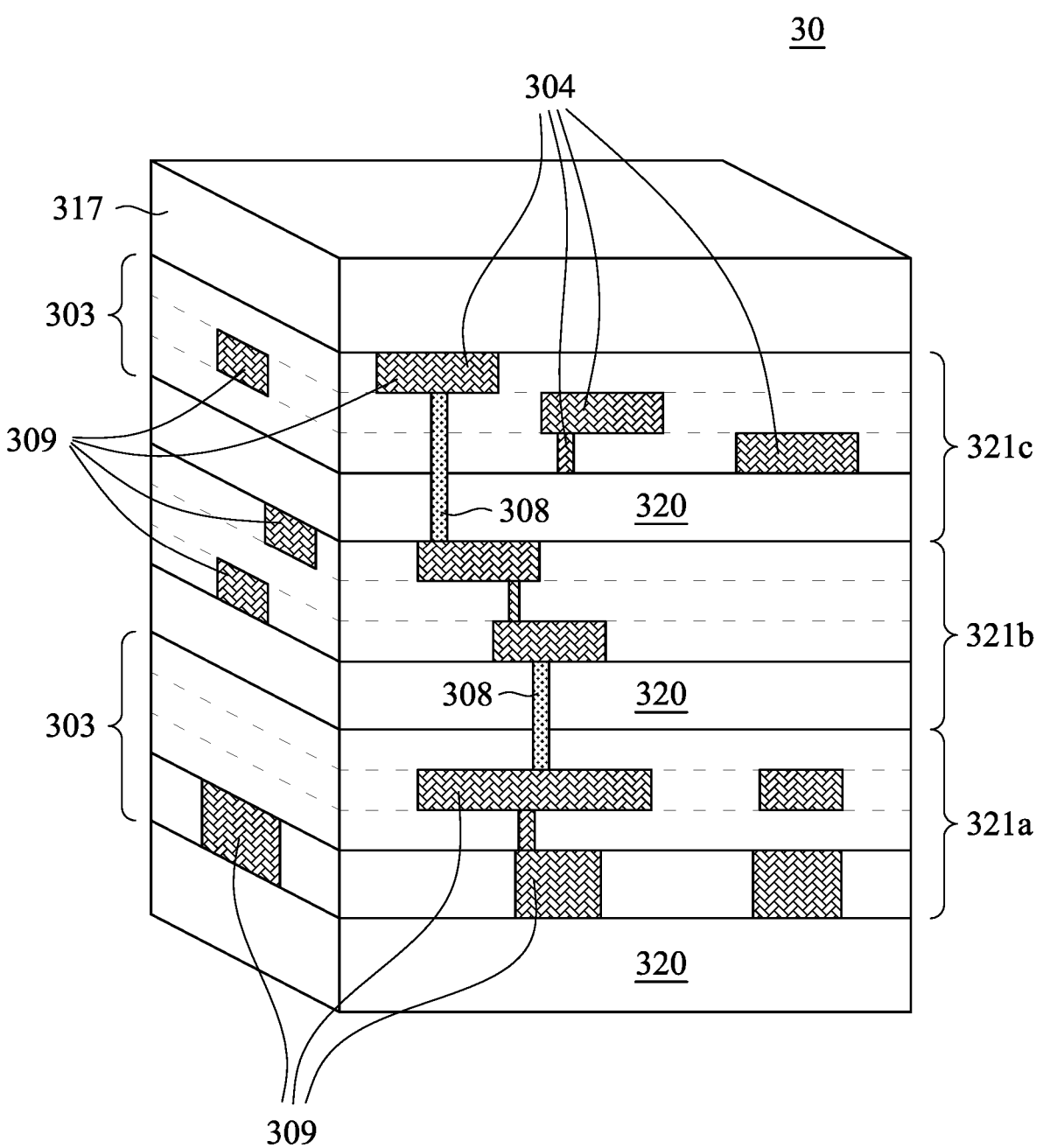
FIG. 3C is a simplified perspective view of an individual die group including a plurality of stacked dies according to an exemplary embodiment.

FIG. 3C is a simplified perspective view of an individual die group 30 including a plurality of stacked dies according to an exemplary embodiment. Referring to FIG. 3C, the die group 30 includes a first die 321a, a second die 321b, and a third die 321c stacked on top of each other. Each of the first, second, and third dies may include a substrate 320, an active region including a plurality of active devices (not shown), a plurality of dielectric layers 303, and a plurality of metal lines and vias 304 in the dielectric layers. The dies are electrically coupled to each other by through-substrate vias and through-oxide vias 308. The die group 30 further includes a metal structure 309 exposed on a side surface of the die group 30. In an embodiment, the die group 30 also includes a bonding layer 317 including an oxide material, e.g., silicon oxide. In some embodiments, the bonding layer 317 may include a plurality of bonding films. In some embodiments, the die group 30 includes a plurality of semiconductor dies or chips similar to those of FIG. 2.

Sideway Stacking of Dies in a Die Group

Attention is now directed to stacking of individual dies within a die group. In general, there may be two ways of stacking individual dies within a die group-horizontal (or co-planar) and vertical (or sideway) stacking. In co-planar stacking, individual dies are laid flat such that their substrates are faced towards (or away from) a base substrate where the die group is located. An example of a co-planar stacking of the individual dies in the die group is shown in FIG. 2. In sideway stacking, individual dies are "stood" sideway against each other in the die group such that their substrates are placed sideway with respect to the base substrate. As a conceptual illustration, thus not intended to be limiting, sideway stacking of individual dies in a die group may be visualized as standing books between two book ends on a shelf, where the books are individual dies (a bottom cover of a given one of the books may be visualized as a substrate of that book), and shelf may be visualized as a base substrate where the die group is located. In co-planar stacking, the books are piled on top of one another on the shelf.

An Example Sideway Stacking of Dies in A Die Group

Figures 4A, 4B:
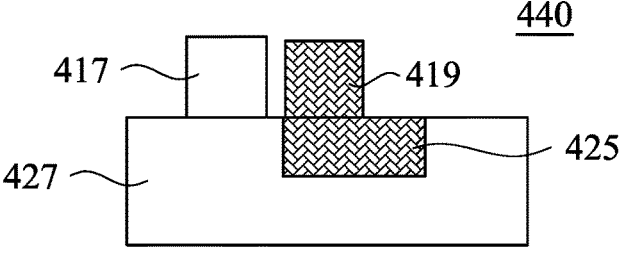
FIG. 4A is a simplified cross sectional view of a multi-die structure according to an exemplary embodiment.
FIG. 4B is a cross-sectional view of an enlarged portion of the multi-die structure of FIG. 4A

FIG. 4A is a simplified cross sectional view of a multi-die structure 40 according to an exemplary embodiment. FIG. 4A illustrates an example sideway stacking of individual dies in a die group in accordance various embodiments. Referring to FIG. 4A, the multi-die structure 40 includes a first die group 41 having an upper surface 410a and a lower surface 410b, and a second die group 42 having an upper surface 420a, the first and second die groups are disposed substantially perpendicular to each other. The first die group 41 includes a plurality of dies 401a, 401b, and 401c stacked next to each other, each die includes a substrate 411, a plurality of dielectric layers 413, a plurality of metal lines and vias 414 in the dielectric layers 413. The dies 401a, 401b, and 401c are electrically coupled to each other by through-substrate vias and through-oxide vias 418. The first die group 41 also includes a passivation layer 417 on the upper surface 410a, and a side metal structure 419 disposed on a planar side surface of the first die group 41. The passivation layer 417 includes an oxide material. In an embodiment, the passivation layer 417 is free of a metal interconnect structure. The first die group 41 may be similar or the same as the die group 20 of FIG. 2 or die group 30 of FIG. 3C, so that a description of which will not be repeated herein for the sake of brevity.

The second die group 42 includes a substrate 421, a plurality of dielectric layers 423, a plurality of metal lines and vias 424 in the dielectric layers 423, a passivation layer 427 on an upper surface 420a of the second die group 42. The passivation layer 427 includes an oxide material. In an embodiment, the passivation layer 427 may be a hybrid passivation layer having a plurality of metal pads 425 in the oxide material and electrically separated from each other by the passivation layer. The second die group 42 also includes one or more through-silicon vias and through-oxide vias 428 electrically coupled to the metal structure 419 either directly or through the metal pad 425. In an embodiment, the second die group 42 does not include active devices (e.g., transistors) or passive devices (resistors, diodes, inductors). In an embodiment, the substrate 421 can include active and/or passive devices formed therein. The substrate 421 can include doped or undoped silicon, an active layer of a semiconductor-on-insulator (SOI) substrate or other semiconductor materials, e.g., germanium, a compound semiconductor including silicon carbide, gallium arsenic, gallium phosphide, indium phosphide, indium arsenide, an alloy semiconductor including SiGe, GaAsP, AlGaAs, GalnAs, GaInP, or combinations thereof. Other substrates, such as multi-layered or gradient substrates, may also be used. In an embodiment, devices, such as transistors, diodes, capacitors, resistors, may be formed in the substrate and may be interconnected by interconnect structures by metallization patterns in one or more dielectric layers 423. In the example shown in FIG. 4A, a single substrate 421 is used for the second die group 42, but it is understood that the number is illustrative only and is chosen for describing the example embodiment and should not be limiting. That is, the second die group 42 can include a stack of dies stacked on top of each other in some embodiments.

The first die group 41 is attached to the second die group 42 with the first and second passivation layers 417, 427 and/or by the side metal structure 419 and metal pads 425 in the hybrid passivation layer 427. In some embodiments, the first die group 41 and the second die group 42 are bonded by fusion bonding, direct bonding, dielectric bonding, metal bonding, hybrid bonding, or the like. In the fusion bonding, the oxide surfaces of the passivation layers 417, 427 are bonded together. In the metal bonding, a metal surface of the side metal structure 419 and a metal surface of the metal pads 425 are pressed against each other at an elevated temperature, the metal inter-diffusion causes the bonding of the side metal structure 419 and the metal pads 425. In the hybrid bonding, the metal surface of the side metal structure 419 and the metal surface of the metal pads 425 are bonded together and the oxide surfaces of the passivation layers 417, 427 are bonded together. In some embodiments, the second die group 42 is a base die group or bottom die group configured to provide mechanical support and electrical wirings to the attached first die group 41. The first die group 41 is referred to as a top die group, and the second die group 42 is referred to as a bottom die group. In some embodiments, the second die group 42 may have a plurality of bond pads 429 on a lower surface 421b of the substrate 421, each bond pad being electrically coupled to an under metal bump or micro bump 430 that is configured to provide electrical connection to external circuitry through a printed circuit board (PCB), interposer, or the like. In an embodiment, the metal pads 425 have a surface coplanar with an upper surface of the passivation layer 427. In some embodiments, the multi-die structure 40 also includes an around die dielectric 433 layer encapsulating the first die group 41 and the second die group 42 after they are bonded together. In an embodiment, the around die dielectric 433 includes tetraethyl orthosilicate (TEOS), silicon oxide, and the like.

FIG. 4B is a cross-sectional view of an enlarged portion (indicated by a dotted-line rectangle) 440 of the multi-die structure 40 of FIG. 4A. Referring to FIG. 4B, oxide surfaces of the first passivation layer 417 and second passivation layer 427 are fusion bonded together. The passivation layers 417 and 427 each include an oxide material and function as bonding layers. In an embodiment, the metal structure 419 and the metal pad 425 are metal-to-metal bonded together. In an embodiment, each of the metal structure 419 and the metal pad 425 may include copper for a copper-to-copper bonding. In an embodiment, each of the metal structure 419 and the metal pad 425 may include aluminum for an aluminum-to-aluminum bonding. In an embodiment, each of the metal structure 419 and the metal pad 425 may include tin or tin alloy for a tin-to-tin or tin alloy bonding. In an embodiment, the metal structure 419 and the metal pad 425 function as interconnect layers. In an embodiment, the metal structure 419 and the metal pad 425 function as bonding layers, rather than interconnect layers. In an embodiment, the metal structure 419 and the metal pad 425 function as thermal dissipation layers to mitigate hot spots in the die group. In an embodiment, the metal structure 419 and the metal pad 425 are connected to a grounding plane for electromagnetic shielding of some functional devices of the die group. In an embodiment, the metal structure 419 and the metal pad 425 can have more than one of the functions described above. In an embodiment, the metal pad 425 may include a micro metal bump or a solder bump. The metal pads have a coefficient of thermal expansion (CTE) higher than that of the passivation layers (i.e., oxide bonding layers). The different CTEs can cause problems in bonding the passivation layers, such as warpage and breakage (chip cracking) of the second die group 42.

Stacked Dies Using Hybrid Bonding

Figure 5A:
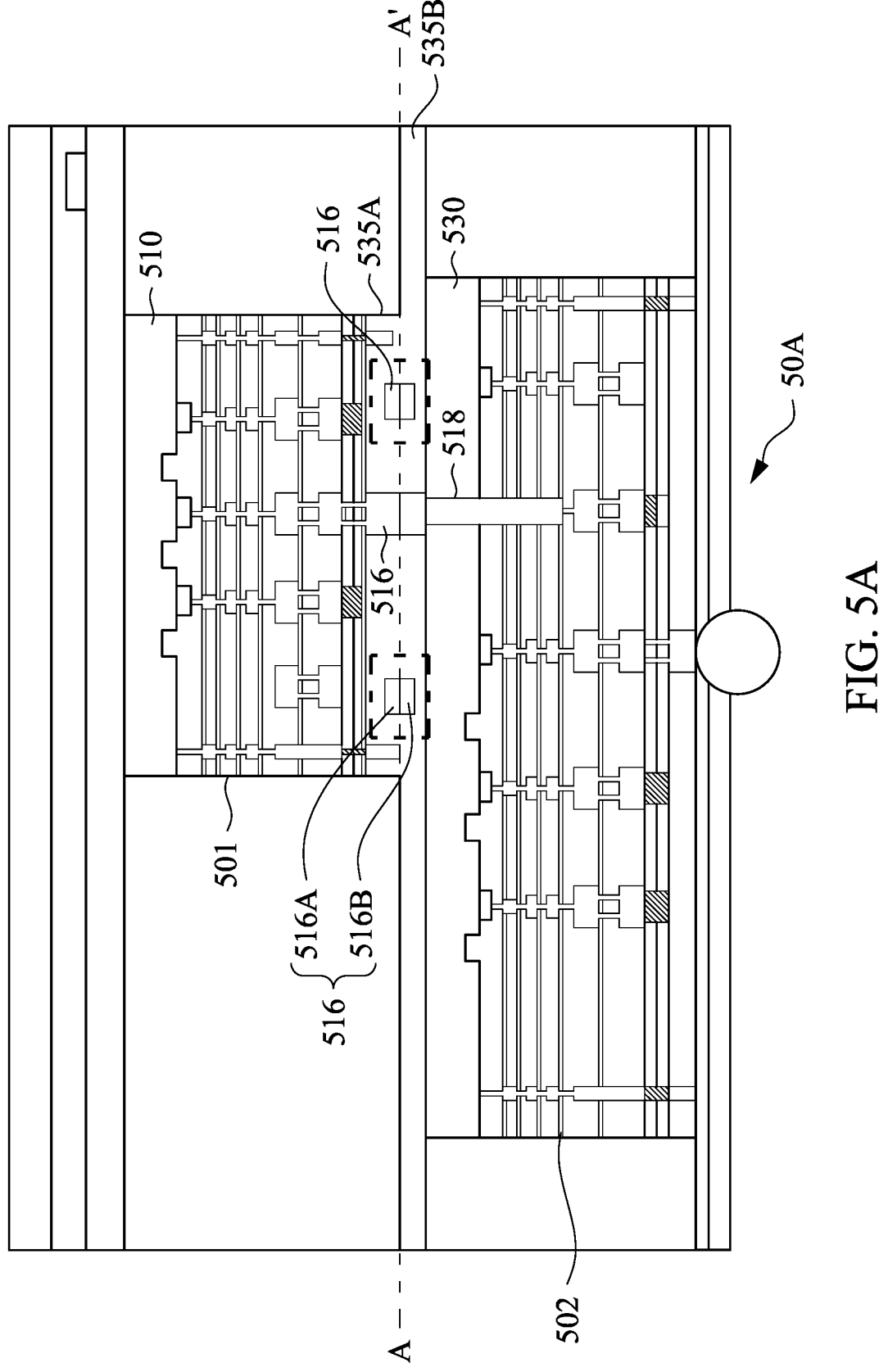
FIG. 5A is a cross-sectional view of a three-dimensional (3D) die group structure according to some embodiments.
Figure 5B:
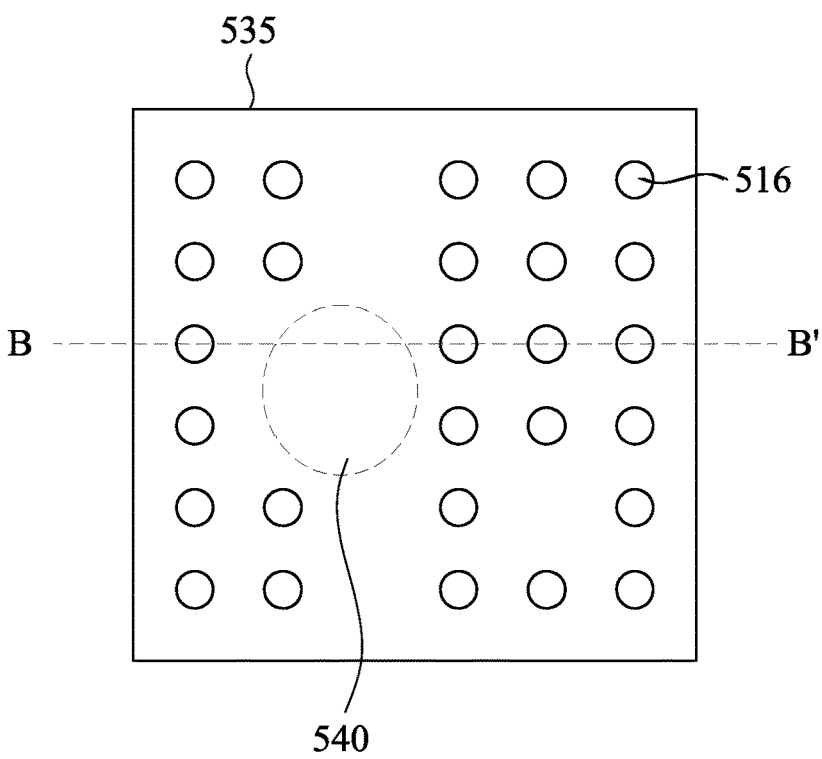
FIG. 5B illustrates a top view at cut line A-A' in FIG. 5A.
Figure 5C:
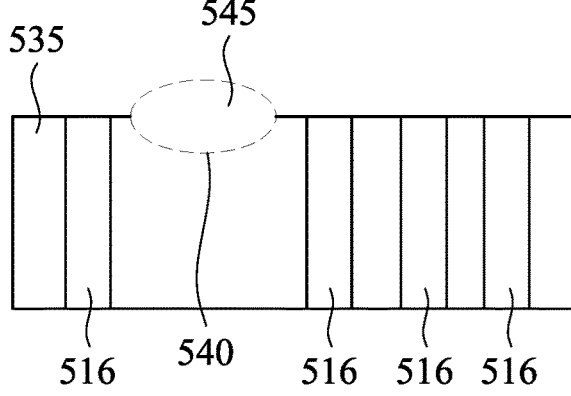
FIG. 5C illustrates a cross-section view the bonding member in FIG. 5B along B-B' cut line.

Attention is now directed to FIGS. 5A-C, where an example of die group structure having stacked dies is shown to illustrate a die group structure of interest to the present disclosure. It will be described with reference to FIGS. 1-4.

FIG. 5A is a cross-sectional view of an example three-dimensional (3D) die group structure 50A. Referring to FIG. 5A, the 3D die group structure 50A includes a first die 501, and a second die 502. In this example, the first die 501 is disposed on top of the second die 502 at a die bonding film 535. In this example, the first die 501 includes a substrate 510 and the second die 502 includes a substrate 530. Each of the first die 501 and the second die 502 also includes a plurality dielectric layers, and a plurality of metal lines and vias in the dielectric layers, similar to the semiconductor device 10 shown in FIG. 1. In this example, the second die 502 includes a through-via (TSV) 518 configured to provide an electrical connection between first die 501 and second die 502. The first die 501 and second die 502 can have same functions or different functions. For example, the first die 501 may comprise one or more central processing units, graphics processing units, and network interconnection units and the second die 502 may include one or more memory units configured to store data that are read by the processing units of the first die 501.

In this embodiment, the second die 502 functions as a support structure to the first die 501. As can be seen, the first die 501 and second die 502 in this example each has a bonding member 535A and 535B, respectively. Bonding members 535A and 535B both have a planar surface configured to facilitating the bonding of the first die 501 and second die 502. In this embodiments, the bonding members 535A and 535B are hybrid bonding members including an oxide material (e.g., silicon oxide such as SiON) and bond pads 516. Bond pads 516 may be formed of copper, aluminum, nickel, tungsten, or alloys thereof. In this example, for the bonding pads 516 shown, a first portion 516A of the bond pad 516 is in the bonding member 535A, and a second portion 516B of the bond pad 516 is in the bonding member 535B. As can be seen, a top surface of bonding member 535B and a top surface of the second portion 516B of the bonding pad 516 are level with each other, and the bottom surfaces of the first portion 516A and 535A are level with each other. This is achieved through a planarization that is performed during the formation of bond pads 516. The planarization may comprise Chemical Mechanical Polish (CMP).

Dishing Caused by CMP

In implementation, second portion 516B of the bonding pad 516 may electrically connected to second portion 516A of the bonding pad 516. FIG. 5B illustrates a top view at a cut line A-A' in FIG. 5A. As can be seen, bonding pads 516 (solid dots) may be distributed non-uniformly in the bonding member 535 such that at least one area 540 in the bonding member 535 does not have as many bonding pads 516 as other areas in bonding member 535. Such an area may be referred to as a bonding pad low density area in the bonding member 535. That is, this area in the bonding member 535 has a low bonding pad density. FIG. 5C illustrates a cross-section view the bonding member 535 in FIG. 5B along the B-B' cut line. As can be seen, in the area 540 and thereunder, there is no bonding pads 516 arranged in the bonding member 535. This may be due to an application of die group structure 50A does not need bonding pads 516 in the area 540 and thereunder. FIG. 5C thus shows a localized low pattern density for bonding pads 516, which can cause Cu dishing and/or SiO2 dishing during the aforementioned CMP process. Such dishing can cause a dish or void in the bonding member 535 to affect reliability of the bonding member 535 as di-electrical layer between first die 501 and second die 502.

Dummy Pattern

For addressing the dishing during the CMP process for the bonding member between stacked dies in a die group structure, various embodiments provide dummy patterns arranged in bonding pad low density area. In those embodiments, dummy patterns forming in active areas are arranged in the bonding pad low density areas in the bonding members between stacked dies. The dummy patterns do not form electrical connection between the stacked dies. That is, the dummy patterns do no connect to any portion of bonding pads in the bonding member between the stacked dies. An inactive area formed by a dummy pattern or dummy patterns may be referred to as a floating Cu island with no circuit connection on one or both sides of the Cu island. In those embodiments, a shape of a given Cu floating island can be a polygonal and/or non-angular shape.

In some embodiments, a dummy pattern is arranged in the bonding member between stacked dies according to a bonding pad pattern in the bonding member. In those embodiments, the dummy pattern is selected according to a distribution of the bonding pads in the bonding member. In one embodiment, the dummy pattern is selected to achieve an average pattern density in the bonding member such that the low density bonding pad area is filled with dummy pattern. In various embodiments, a minimum density of dummy patterns selected for a bonding pad low density area (such as 1 mm$^2$) is $\frac{1}{10}$ of a maximum density of dummy patterns selected for the bonding pad low density area.

Figure 6A:
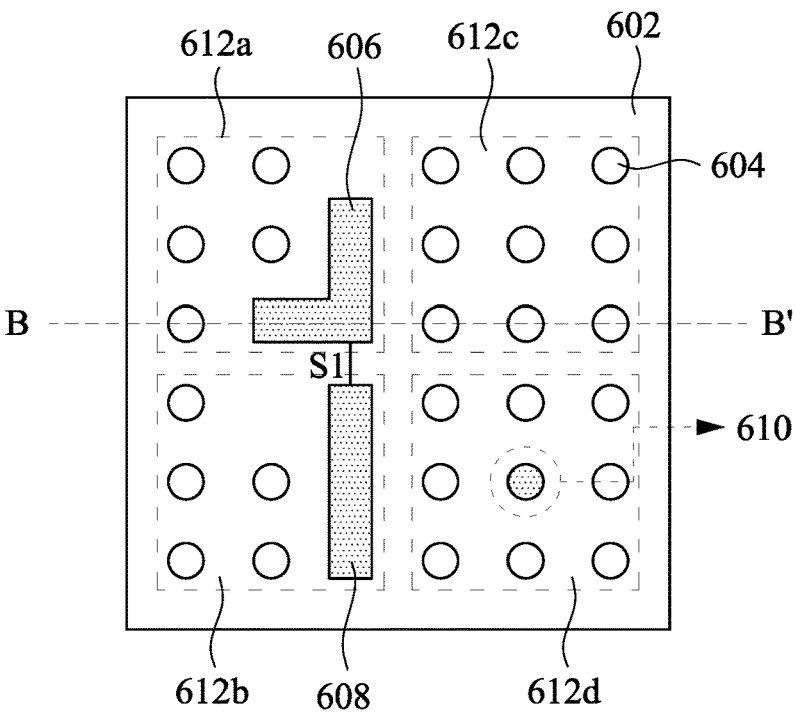
FIG. 6A illustrates a top view of a cross-section of an example bonding member similar to the bonding member shown in FIG. 5B.

FIG. 6A illustrates a top view of a cross-section of an example bonding member 602 similar to the bonding member shown in FIG. 5B. As can be seen, in FIG. 6 dummy patterns 606, 608, and 610 are arranged in bonding pad low density areas 612a, 612b and 612d to address the aforementioned dishing effect during the CMP process. In implementation, the dummy patterns 606, 608 and 610 can be formed of the same or similar materials of bonding pads 604. For example, the dummy patterns can be formed of copper, aluminum, nickel, tungsten, or alloys thereof. In various embodiments, the dummy patterns 606, 608 and/or 610 may comprise individual dummy pads similar to bonding pads 604, except that the dummy pads do not provide electrical connection as mentioned. However, this is not necessarily the only case. In some embodiments, the dummy patterns 606, 608 and/or 610 can be formed as trenches filled with one or more materials mentioned above.

Design Considerations for Dummy Patterns

As can be seen from FIG. 6A, the area 612a has 5 bonding pads 604, while its neighboring area 612c has 9 bonding pads 604. Thus, by comparison, the area 612a is a bonding pad low density area compared to area 612c. In this example, as can be seen, the dummy pattern 606 is thus filled in area 612a to as an inverse L shape. This shape is selected in this example to achieve more or less evenly distributed density patterns for areas 612a and 612c. As can be seen, the inverse L shape fills the spaces where bonding pads 604 are not present in the area 612. The dummy pattern 606 may be referred to having a combination polygonal shape. The dummy pattern 608 has a I shape in the area 612b to fill spaces therein where there is no bonding pad 604. The dummy pattern 608 may be referred to having a polygonal shape. The dummy pattern 610 has a circular shape like a bonding pad 604 to fill in the space in area 610 where there is no bonding pad 604. The dummy pattern 610 may be referred to having a non-angular shape. The shapes of dummy patterns 606, 608, 610 shown in FIG. 6A are merely illustrative to show that dummy patterns can be selected in however shape to fill spaces in an area in the bonding member between stacked dies where there is no bonding pad.

Figure 6B:
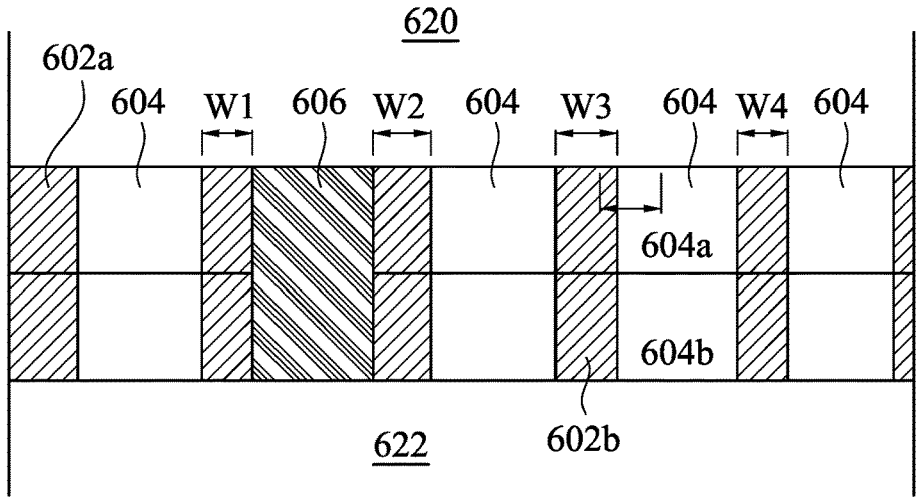
FIG. 6B illustrates a cross-section view of the bonding member along the cut line B-B' in FIG. 6A.

FIG. 6B illustrates a cross-section view of the bonding member 602 along the cut line B-B' in FIG. 6A. As can be seen, the bonding member 602 in this example has a first portion 602a, and a second portion 602b. The first portion 602a is in connection with a first die 620 similar to the first die 501 shown in FIG. 5A, and the second portion 602b is in connection with a second die 620 similar to the second die 502 shown in FIG. 5A. As still can be seen, the bonding pads 604 are formed in the bonding member 602 (602a and 602b) to provide electrical connections, while the dummy pattern 606 is formed in the bonding member 602 without electrical function to either the first die 620 or the second die 622. Accordingly, dummy pattern 606 is electrically floating.

In implementation, as shown, the dummy pattern 606 may be formed in the bonding member 602 to achieve an average pattern density in area 612a in the bonding member 602. As can be seen, in this example, the dummy pattern 606 is arranged such that a gap W1 and a gap W2 of the dummy pattern 606 both have a same width, in this example, as the gap W3 and the gap W4. In this way, an average pattern density in the bonding member area shown in FIG. 6B is achieved. However, it should be understood that this is not intended to be limiting. In other embodiments, the gap W1 and/or gap W2 of the dummy pattern with respect to the neighboring dummy pads 604 may be wider or narrower than the gaps between bonding pads 604 (such as W3 and W4). It is understood, bonding pads 604 may not necessarily be uniformly distributed in some other examples. For example, the bonding pads 604 in those embodiments may have uneven width due to a design choice of the die group housing the first and second die, a functional consideration for such a die group and/or any other factors. In those embodiments, the width of the dummy pattern with respect to the neighboring dummy pads may take an average width of the uneven width of the gaps among the bonding pads. In some embodiments, a width of a gap (such as W1 or W2) between a dummy pattern and a bonding pad is greater than 0.1 um to avoid an effect of inductive capacitance. In some embodiments, a space between two dummy patterns (such as S1 shown in FIG. 6A) is greater than 0.1 um to reduce erosion effect.

During fabrication, in some embodiments, the di-electric part of first portion 602a of bonding member 602 is bonded to the di-electric part of the second portion 602b of bonding member 602 through fusion bonding and the bonding pads 604 (first portion 604a and second portion 604b) are bonded through metal bonding. The bonding includes pre-bonding and an annealing. During the pre-bonding, a small pressing force is applied to press the first die and the second die against each other. The pre-bonding may be performed at the room temperature (for example, between about 21° C. to about 25° C.), although higher temperatures may be used.

After the pre-bonding, first portion 602a and second portion 602b are bonded to each other. The bonding strength is improved in a subsequent annealing step, in which the bonded dies 620 and 622 are annealed at a temperature between about 300° C. and about 400° C., for example. The annealing may be performed for a period of time between about 1 hour and 2 hours. When temperature rises, the OH bond in bonding member 602 break to form strong Si—O—Si bonds, and hence dies 620 and 622 are bonded to each other through fusion bonds (and through Van Der Waals force). In addition, during the annealing, the metal (such as copper) portions of bonding pads 604 and dummy patterns 606, 608 and 610 diffuse to each other in the bonding member 602, so that metal-to-metal bonds are also formed. Hence, the resulting bonds between dies 620 and 622 are hybrid bonds.

Figure 7:
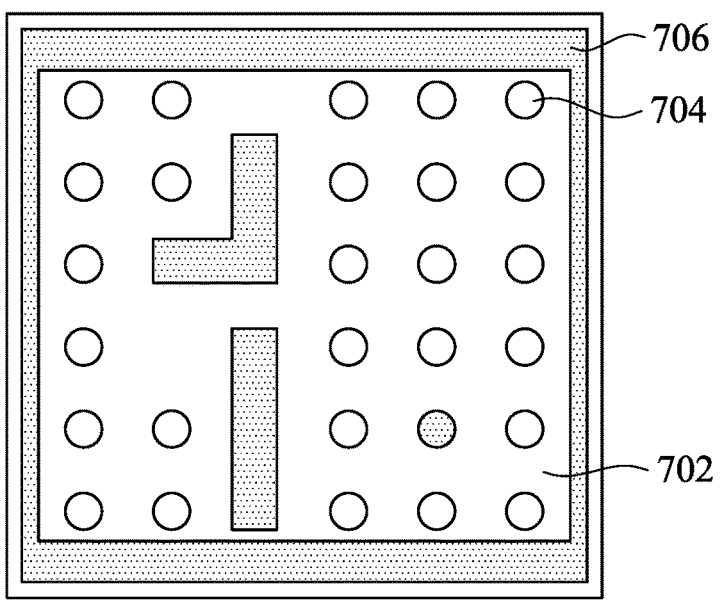
FIG. 7 illustrates another top view of another bonding member in accordance with the disclosure.

FIG. 7 illustrates another top view of another bonding member 702 in accordance with the disclosure. In this example, a rectangular dummy pattern 706 forms a seal ring around the bonding pads 704. The dummy pattern 706 may be formed of similar material to bonding pads 704, such as copper, aluminum, tungsten, alloy thereof and/or any other suitable materials. The dummy pattern 706 in this example can serve at least two purposes. One is that the dummy pattern 706 is arranged to achieve evenly distributed pattern density (with the metal materials in the bonding pads 704 and dummy patterns) such that it fills spaces in the bonding member 702 where there is not bonding pads. Another purpose is that it can serve as a guard to prevent moisture from entering into the area inside the dummy pattern 706. During fabrication, various processes such as CMP, and wet etching may introduce water into bonding member 702. The dummy pattern 706 can be arranged in an early stage of the fabrication to prevent moisture from the water entering into the area inside the dummy pattern 706 so to protect the bonding pads 704. In various embodiments, the dummy pattern 706 is formed around an edge of a stacked die such as first die 501 or second die 502 shown in FIG. 5A.

Figure 8:
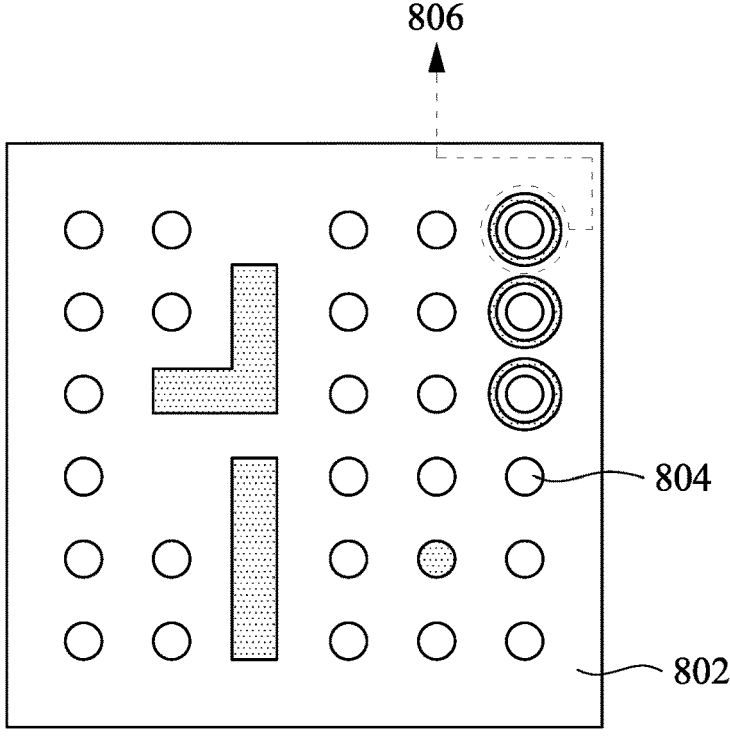
FIG. 8 illustrates still another top view of an example bonding member 802 in accordance with the disclosure.

FIG. 8 illustrates still another top view of an example bonding member 802 in accordance with the disclosure. As can be seen, in this example, individual guard rings 806 can be arranged around individual bonding pads 804 to 1) achieve better pattern density in the bonding member 802; 2) prevent moisture from entering into a vicinity of the bonding pads 806; and/or to serve any other purposes.

Figure 9A:
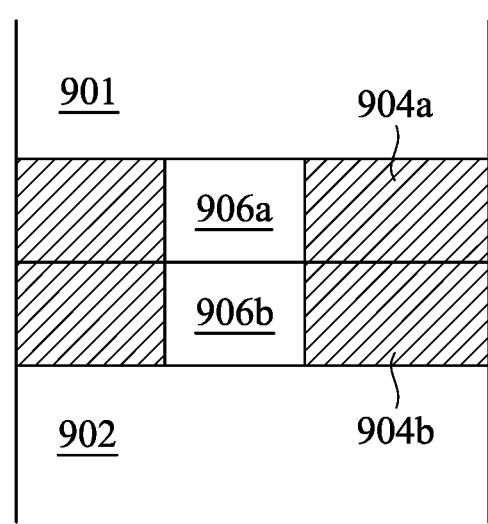
FIGS. 9A-F illustrate some example arrangements of dummy patterns in a bonding member between stacked dies in accordance with the disclosure.

FIGS. 9A-H illustrate some example arrangements of dummy patterns in a bonding member 904 between stacked dies 901 and 902 in accordance with the disclosure. In FIG. 9A, it is shown that the bonding member 904 has a first portion 904a connected to the first die 901 and a second portion 904b connected to the second die 902. As shown, a dummy pattern 906 in accordance with the disclosure is arranged in the bonding member 904. The dummy pattern 906 has a first portion 906a and a second portion 906b. As mentioned above, during fabrication the first portions 904a and 906a, and the second portions 904b and 906b are bonded together to form a hybrid bond for the first and second dies 901 and 902. As can be seen in FIG. 9A, in some embodiments, the first portion 906*a* of the dummy pattern 906 and the second portion 906*b* of the dummy pattern 906 have the same size and are bonded one to one.

Figure 9B:
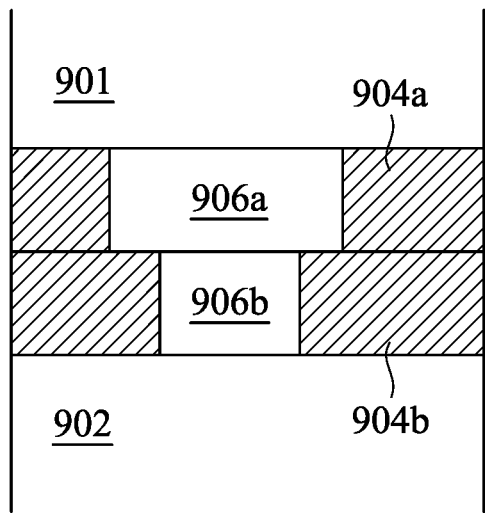
Figure 9C:
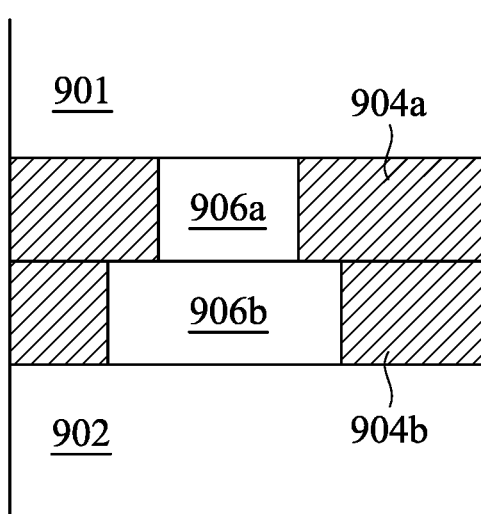

FIG. 9B shows, in some embodiments, some dummy patterns 906 in accordance with the disclosure have a larger first portion 906*a* than the second portion 906*b*. In those embodiments, such dummy patterns are bonded also one to one. FIG. 9C shows, in some embodiments, some dummy patterns 906 in accordance with the disclosure have a smaller first portion 906*a* than the second portion 906*b*. In those embodiments, such dummy patterns are bonded also one to one.

Figure 9D:
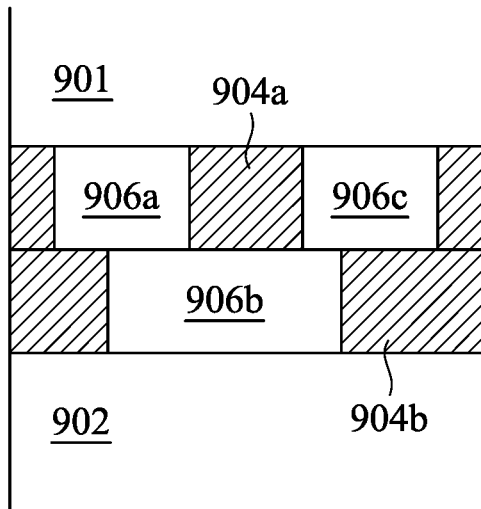
Figure 9E:
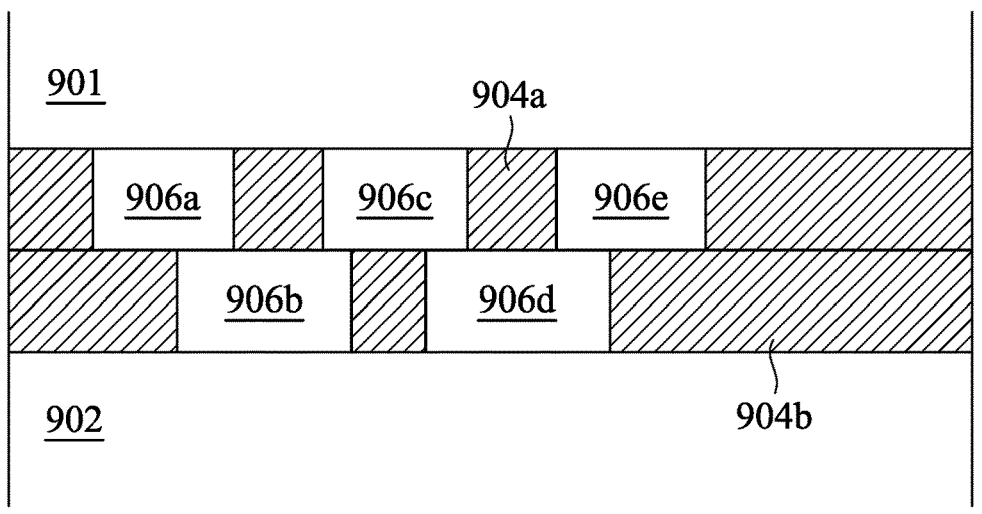
Figure 9F:
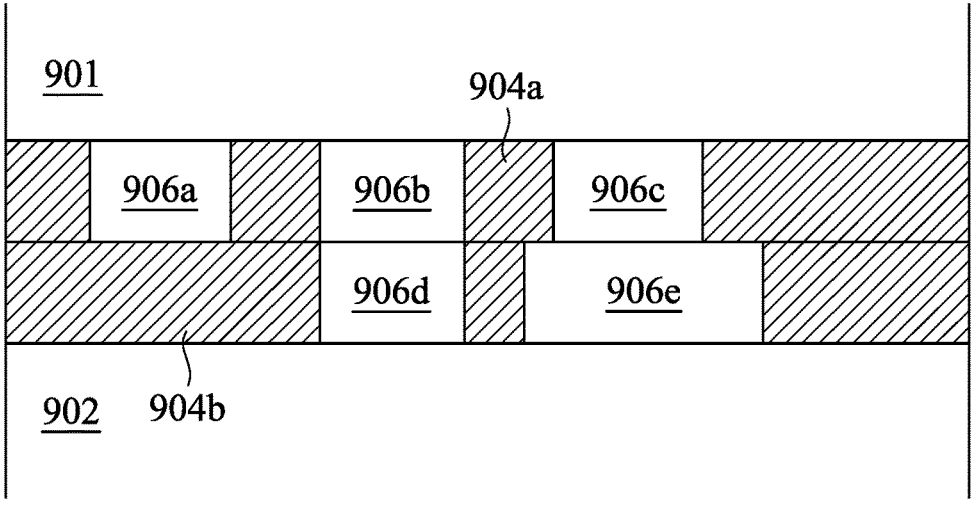

FIG. 9D shows, in some embodiments, some dummy patterns in accordance with the disclosure have multiple first portions (906*a* and 906*c* as shown in this example) are bonded to a single second portion 906*b*. FIG. 9E shows, in some embodiments, some dummy patterns in accordance with the disclosure have multiple first portions (906*a*, 906*c*, 906*e* as shown in this example) are bonded to multiple second portions (906*b* and 906*d* as shown). FIG. 9E shows, in some embodiments, some dummy patterns in accordance with the disclosure has a first portion (906*a*) not bonded to anything in the second bonding member portion 904*b*; has a first portion 906*b* bonded to a second portion 906*d* in equal size; has a first portion 906*c* bonded to a second 906*e* in different sizes; and/or any other combinations thereof.

FIG. 10 illustrates a method 1000 for fabricating a semiconductor package in accordance with the present disclosure. It will be described with reference to FIGS. 1-9. It should be understood while operations described in FIG. 10 are shown in order, they are not intended to be limited to the order shown. In some other examples, one or more operations shown in FIG. 10 may be performed before or after their positions shown in FIG. 10.

At 1002, a first portion of a bonding member is arranged on a first die. In some implementation, the first portion of the bonding member at 1002 may be the same as or substantially similar to the first portion 602*a* shown in FIG. 6B and the first die at 1002 may be the same as or substantially similar to the first die 620 shown in FIG. 6B.

At 1004, bonding pads are arranged in the first portion of the bonding member arranged at 1002. In some implementation, the bonding pas may be the same as or substantially similar to the bonding pads 604 shown in FIG. 6B.

At 1006, a first portion of a dummy structure is arranged in the first portion of the bonding member. In some implementation, the first portion of the dummy structure arranged at 1006 may be the same as or substantially to the first portion of 906*a* of dummy structure 906 shown in FIG. 9A.

At 1008, a second portion of a bonding member is arranged on a second die. In some implementation, the second portion of the bonding member at 1008 may be the same as or substantially similar to the second portion 602*b* shown in FIG. 6B and the second die at 1008 may be the same as or substantially similar to the second die 622 shown in FIG. 6B.

At 1010, bonding pads are arranged in the second portion of the bonding member arranged at 1008. In some implementation, the bonding pas may be the same as or substantially similar to the bonding pads 604 shown in FIG. 6B.

At 1012, a second portion of the dummy structure is arranged in the second portion of the bonding member. In some implementation, the second portion of the dummy structure arranged at 1012 may be the same as or substantially to the first portion of 906*b* of dummy structure 906 shown in FIG. 9A.

At 1014, the first portion and second portion of the bonding member are bonded together to create a stacked structure having the first die on top of the second die. In implementation, the stacked structure may be the same as or substantially to the die group structure 50A shown in FIG. 5A.

Various embodiments provide protection structures for through silicon vias (TSVs) in a multi-die structure. In those embodiments, a protection structure in accordance with the disclosure is arranged around a particular TSV to cover the TSV. In those embodiments, the protection structure in accordance with the disclosure includes one or more layers of materials configured to shield the particular TSV. In some embodiments, these layers of the materials are deposited in the multi-die structure in a back-end-of-line (BEOL) fabrication stage of the multi-die structure. The particular TSV is identified in those embodiment to be protected using such a protection structure because the particular TSV spans vertically across the multi-die structure susceptible to structure defects during fabrication of the multi-die structure. In those embodiments, the protection structure may include one or more protection portions filled with metallic materials such as copper, and the protection portion(s) is configured to have a metal connect with a metal line in the multi-die structure to provide a signal channel.

Various embodiments provide a method for arranging protection structures for TSVs in a multi-die structure. In those embodiments, a location of a particular TSV in the multi-die structure is identified for arranging a protection structure around the particular TSV before fabricating the multi-die structure. In those embodiments, layers of dielectric layers are then arranged on a substrate a die in the multi-die structure. An individual one of the dielectric layers includes one or more metal pads and one or more a layer in the protection structure. In some embodiments, the layer in the protection structure is filled with metallic materials such as copper to form a guard ring around the particular TSV. In some embodiments, a metal connect is arranged between the guard ring and a metal pad in the dialectical layer. After the dielectric layers are arranged, the particular TSV is formed in the location identified, e.g., within the protection structure. In some embodiments, after the TSV is formed, a layer of metallic material is arranged on top of the TSV and the protection structure to cover the TSV.

Exemplary embodiments described herein relate to multi-die structures having stacked dies mounted on a base substrate or a package substrate. As used herein, chips and dies are used interchangeably and refer to pieces of a semiconductor wafer, to which a semiconductor manufacturing process has been performed, formed by separating the semiconductor wafer into individual dies. A chip or die can include a processed semiconductor circuit having a same hardware layout or different hardware layouts, same functions or different functions. In general, a chip or dies has a substrate, a plurality of metal lines, a plurality of dielectric layers interposed between the metal lines, a plurality of vias electrically connecting the metal lines, and active and/or passive devices. The dies can be assembled together to be a multi-chip device or a die group. As used herein, a chip or die can also refer to an integrated circuit including a circuit configured to process and/or store data. Examples of a chip, die, or integrated circuit include a field programmable gate array (e.g., FPGA), a processing unit, e.g., a graphics processing unit (GPU) or a central processing unit (CPU), an application specific integrated circuit (ASIC), memory devices (e.g., memory controller, memory), and the like.

Example Die and Multi-Die Structures

Figure 11:
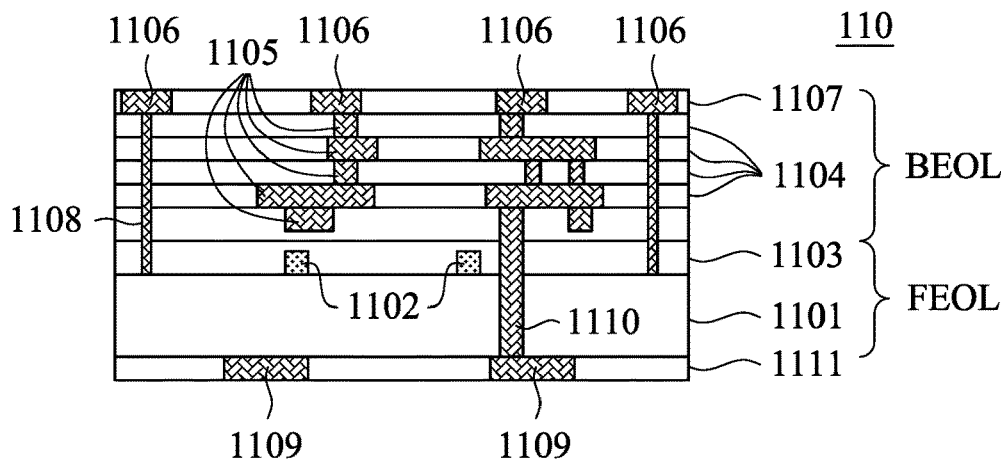
FIG. 11 is a simplified cross-sectional view of a die according to some exemplary embodiments.

FIG. 11 is a simplified cross-sectional view of a die 110 of interest to the present disclosure Referring to FIG. 11, the die 110 includes a front-end-of-line (FEOL) representing a first portion of the fabrication of an integrated circuit (die), where individual devices (e.g., transistors, capacitors, diodes, resistors, inductors, and the like) 1102 are formed in and on a substrate 1101. The substrate 1101 can be a semiconductor substrate or a non-semiconductor substrate. For example, the substrate 1101 may include a bulk silicon substrate. In some embodiments, the substrate 1101 may include an elementary semiconductor, such as silicon or germanium in a crystalline structure, a compound semiconductor, e.g., silicon germanium, silicon carbide, gallium arsenic, gallium phosphide, indium phosphide, indium arsenide, and/or indium antimonide, or combinations thereof. Possible substrate 1101 may also include a semiconductor-on-insulator (SOI) substrate. In an embodiment, the substrate 1101 is a silicon layer of an SOI substrate. The substrate 1101 can include various doped regions depending on design requirements, e.g., n-type wells or p-type wells. The doped regions are doped with p-type dopants, e.g., boron, n-type dopants, e.g., phosphorous or arsenic, or combination thereof.

An FEOL may include defining active regions in upper surface portions of the semiconductor substrate 1101, forming trench isolation structures isolating the individual devices, performing implants for forming wells, forming gate structures and source and drain regions, and forming an interlayer dielectric layer (ILD) 1103 on the semiconductor substrate 1101 and active devices 1102. The die 110 also includes a back-end-of-line (BEOL) representing a second portion of the fabrication of the die after the FEOL. A BEOL includes forming metal and via patterns based on positions of the formed individual devices. For example, a plurality of intermetal dielectric layers (IMD) 1104 are formed on the interlayer dielectric layer 1103, with a plurality of patterned metal lines and vias subsequently formed in the IMD layers 1104. The interlayer dielectric layers (IMD) each may include a dielectric or insulating material.

In an embodiment, the die 110 also includes metal pads 1106 on the IMD layers 1104 and a passivation layer 1107 having a dielectric material that electrically isolates the metal pads 1106. In an embodiment, the die 110 further includes a seal ring 1108 that surrounds the die 110 and extends from a metal pad 1106 through the IMD layers 1104 and ILD layer 1103 to a surface of the substrate 1101. The seal ring 1108 is configured to prevent moisture, water, and other pollutant from entering the die. In an embodiment, the die 1110 also includes a plurality of contact pads 1109 on the bottom surface of the substrate 1101, the contact pads are electrically connected to the metal lines and vias 1105 through one or more through-substrate vias 1110. The die 110 also includes a dielectric layer 1111 containing one or more bond pads disposed on the bottom surface of the substrate 1101.

Figure 12:
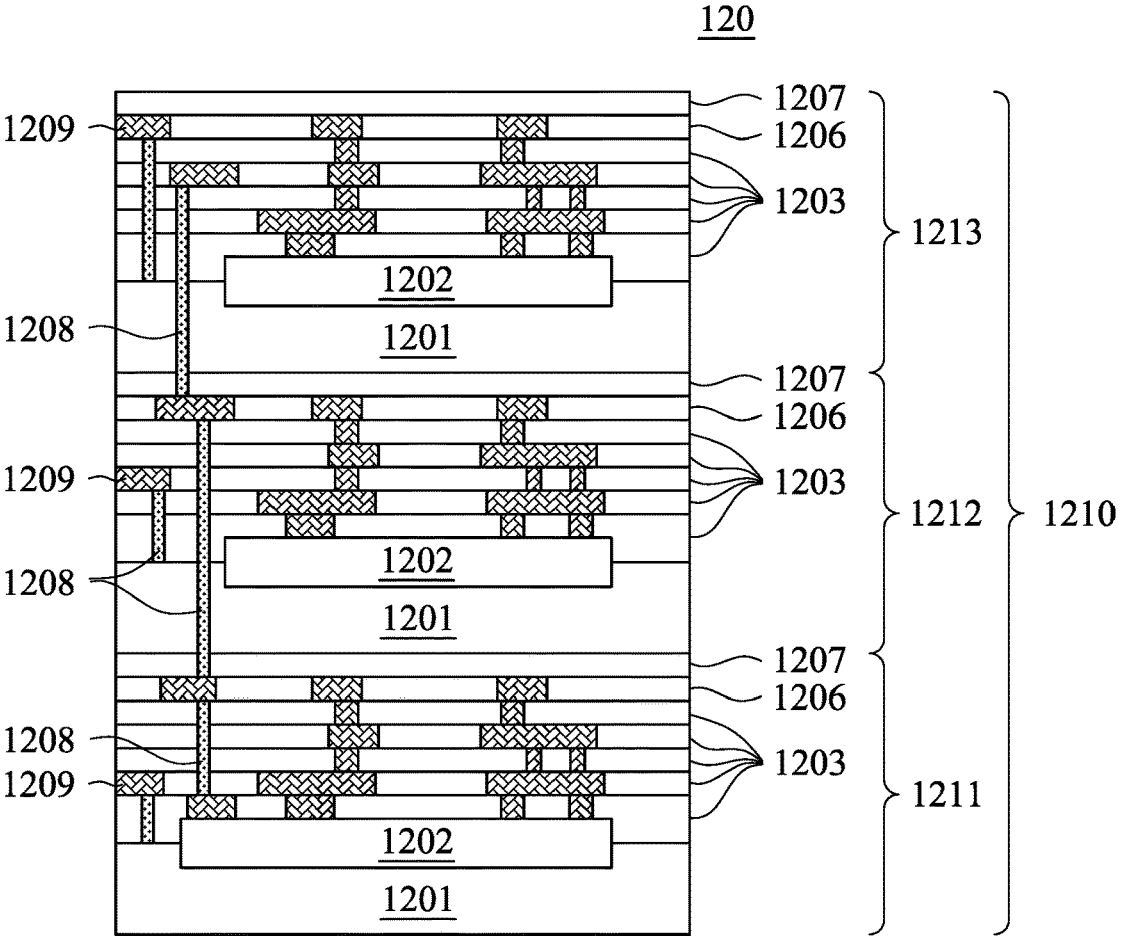
FIG. 12 is a cross-sectional view of a multi-die structure having a plurality of dies stacked with each other according to some exemplary embodiments.

FIG. 12 is a simplified cross-sectional view of a multi-die structure 120 having a plurality of dies stacked with each other according to some exemplary embodiments. Referring to FIG. 12, The multi-die structure 120 includes a stacked die structure 1210 having a plurality of dies 1211, 1212, and 1213 stacked on top of each other in a substantially horizontal arrangement. In an embodiment, each of the dies can be a semiconductor device similar to the die 110 of FIG. 11. For example, each of the stacked dies 1211, 1212, and 1213 includes a substrate 1201, an active region 1202 formed on a surface of the substrate 1201, a plurality of dielectric layers 1203, a plurality of metal lines and a plurality of vias 1204 formed in the dielectric layers 1203, and a passivation layer 1207 on a top intermetal layer 1206. In an embodiment, a stacked die can also include passive devices, such as resistors, capacitors, diodes, inductors, and the like. In an embodiment, the stacked dies are bonded to one another at a bonding surface of a passivation layer 1207 by fusion bonding. In an embodiment, one or more bond pads are embedded in the passivation layer 1207 of the die 1211, and a dielectric layer containing one or more bond pads is disposed on the lower surface of the die 1212, such that the dies 1211 and 1212 are hybrid bonded between the passivation layer on the upper surface of the die 1211 and the dielectric layer on the lower surface of the die 1212.

The substrate 1201 can be a semiconductor substrate or a non-semiconductor substrate. For example, the substrate 1201 may include a bulk silicon substrate. In some embodiments, the substrate 1201 may include an elementary semiconductor, such as silicon or germanium in a crystalline structure, a compound semiconductor, e.g., silicon germanium, silicon carbide, gallium arsenic, gallium phosphide, indium phosphide, indium arsenide, or combinations thereof. Possible substrate 1201 may also include a semiconductor-on-insulator (SOI) substrate. In an embodiment, the substrate 1201 is a silicon layer of an SOI substrate. The substrate 1201 can wells. The doped regions are doped with p-type dopants, e.g., boron, n-type dopants, e.g., phosphorous or arsenic, or combination thereof. The active region 1202 may include transistors. The dielectric layers 1203 may include interlayer dielectric (ILD) and intermetal dielectric (IMD) layers. The ILD and IMD layers may be low-k dielectric layers which have dielectric constants (k values) smaller than a predetermined value, e.g., about 3.9, smaller than about 3.0, smaller than 2.5 in some embodiments. In some other embodiments, the dielectric layers 1203 may include non-low-k dielectric materials having dielectric constants equal to or greater than 3.9. The metal lines and vias may include copper, aluminum, nickel, tungsten, or alloys thereof.

In this example, the multi-die structure 120 includes one or more through silicon vias (TSVs) or through oxide vias (TOVs) 1208 configured to electrically connect one or more of the metal lines in the stacked dies 1211, 1212, and 1213 with each other. The one or more through silicon vias or through oxide vias 1208 may include copper, aluminum, tungsten, or alloys thereof. In some embodiments, each of the stacked dies 1211, 1212, and 1213 may also include a side metal interconnect structure 1209 on a sidewall of the stack dies. The side metal interconnect structure 1209 may include one or more metal wirings extending through an exposed surface of the plurality of dielectric layers 1203. The side metal interconnect structure 1209 may be formed at the same time as the metal layers and exposed to the side surface of the multi-die structure 120 after the different dies 1211, 1212, and 1213 have been bonded together and the side surface is polished by a chemical mechanical polishing (CMP) process.

In some embodiments, the multi-die structure 120 can be formed by bonding a plurality of wafers together using fusion bonding, eutectic bonding, metal-to-metal bonding, hybrid bonding processes, and the like. A fusion bonding includes bonding an oxide layer of a wafer to an oxide layer of another wafer. In an embodiment, the oxide layer can include silicon oxide. In an eutectic bonding process, two eutectic materials are placed together, and are applied with a specific pressure and temperature to melt the eutectic materials. In the metal-to-metal bonding process, two metal pads are placed together, a pressure and high temperature are provided to the metal pads to bond them together. In the hybrid bonding process, the metal pads of the two wafers are bonded together under high pressure and temperature, and the oxide surfaces of the two wafers are bonded at the same time.

In some embodiments, each wafer may include a plurality of dies, such as semiconductor devices of FIG. 11. The bonded wafers contain a plurality of die groups having a plurality of stacked dies. The bonded wafers are singulated by mechanical sawing, laser cutting, plasma etching, and the like to separate into individual die groups that can be the multi-die structure 120 as shown in FIG. 12.

Figure 13A:
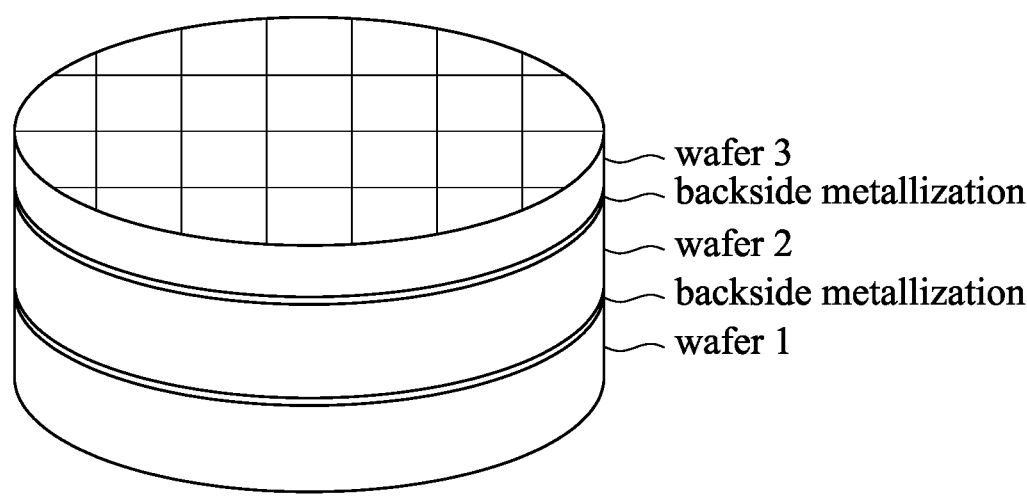
FIG. 13A is a simplified perspective view illustrating a plurality of wafers stacked on top of each other in a three-dimensional (3D) configuration according to some embodiments.

FIG. 13A is a simplified perspective view illustrating a plurality of wafers stacked on top of each other in a three-dimensional (3D) configuration according to some embodiments. Referring to FIG. 13A, in an exemplary embodiment, a first wafer "wafer 1" is a base wafer on which a plurality of dies can be formed. A second wafer "wafer 2" is an intermediate wafer on which a plurality of dies can be formed, and a third wafer "wafer 3" is a top wafer on which a plurality of dies can be formed. The wafers may have through substrate vias (TSVs) and/or through oxide vias (TOVs) and backside bonding layer (e.g., metallization layer and/or dielectric layer) and are bonded together to form a 3D stacked wafer configuration using any known bonding techniques, e.g., fusion bonding, eutectic bonding, metal bonding, hybrid bonding, and the like. The three wafers (wafer 1, wafer 2, and wafer 3) are electrically connected to each other through substrate vias, through oxide vias, and/or backside metallization layer and dielectric layer. The wafers each can have different dies. For example, wafer 1 may include dies of central processing units, graphics processing units, and logic; wafer 2 may include dies of memory devices and memory controllers; and wafer 3 may include dies of bus interfaces, input/output ports, and communication and networking devices. In the example shown in FIG. 13A, three wafers are used, but it is understood that the number is illustrative only and is chosen for describing the example embodiment and should not be limiting. In some embodiments, a passivation layer is formed on the upper surface of each of the wafers and includes a thickness to provide separation between the substrate and the metallization layer. In an embodiment, the passivation layer includes an oxide material.

Figure 13B:
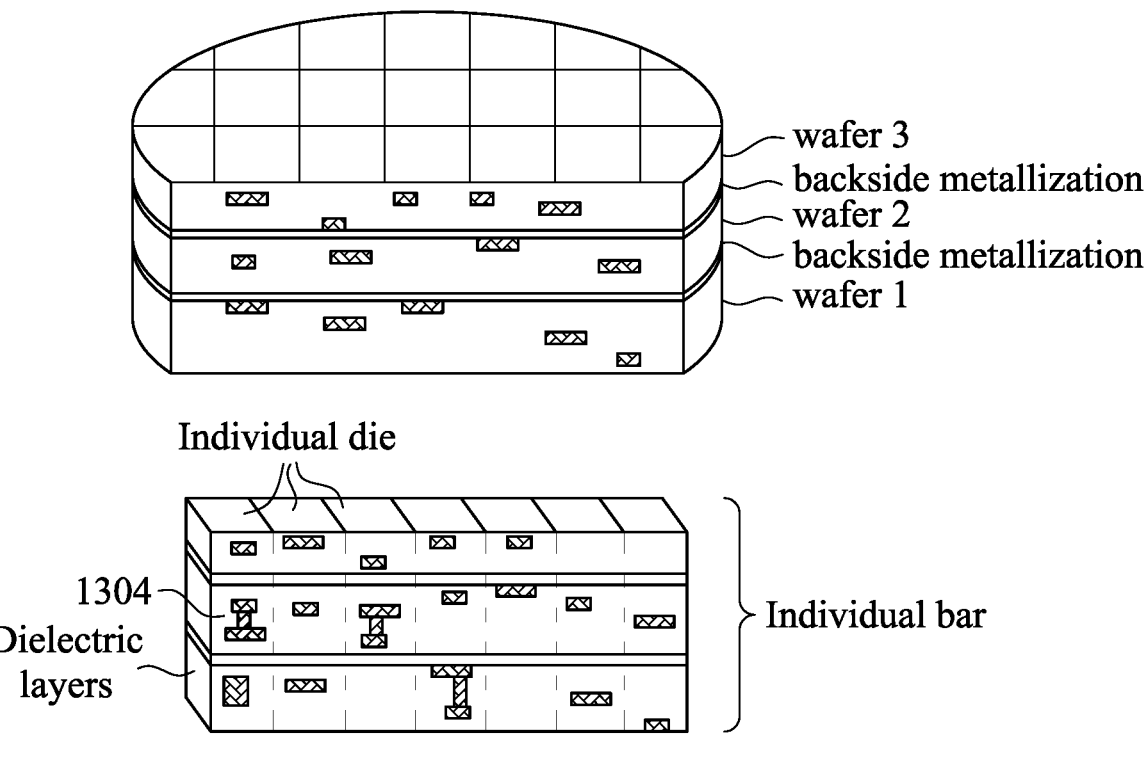
FIG. 13B is a simplified perspective view illustrating the stacked wafer configuration of FIG. 13A.

FIG. 13B is a simplified perspective view illustrating the stacked wafer configuration of FIG. 13A that has been cut and separated into individual bars according to an exemplary embodiment. For example, the stacked wafers can be cut into individual bars and individual die groups by mechanical sawing, plasma etching, laser cutting, and the like. Referring to FIG. 13B, each of the wafers include a substrate, a plurality of dielectric layers including interlayer dielectric layers (ILDs) and intermetal dielectric layers (IMDs), and a plurality of metal lines and a plurality of vias 1304 formed in the dielectric layers. The dies of the stacked wafers are electrically coupled to each other through substrate vias and through oxide vias. In some embodiments, the individual bars are placed on a polishing board, and the surfaces of the bars are polished prior to being diced or singulated into dies.

Figure 13C:
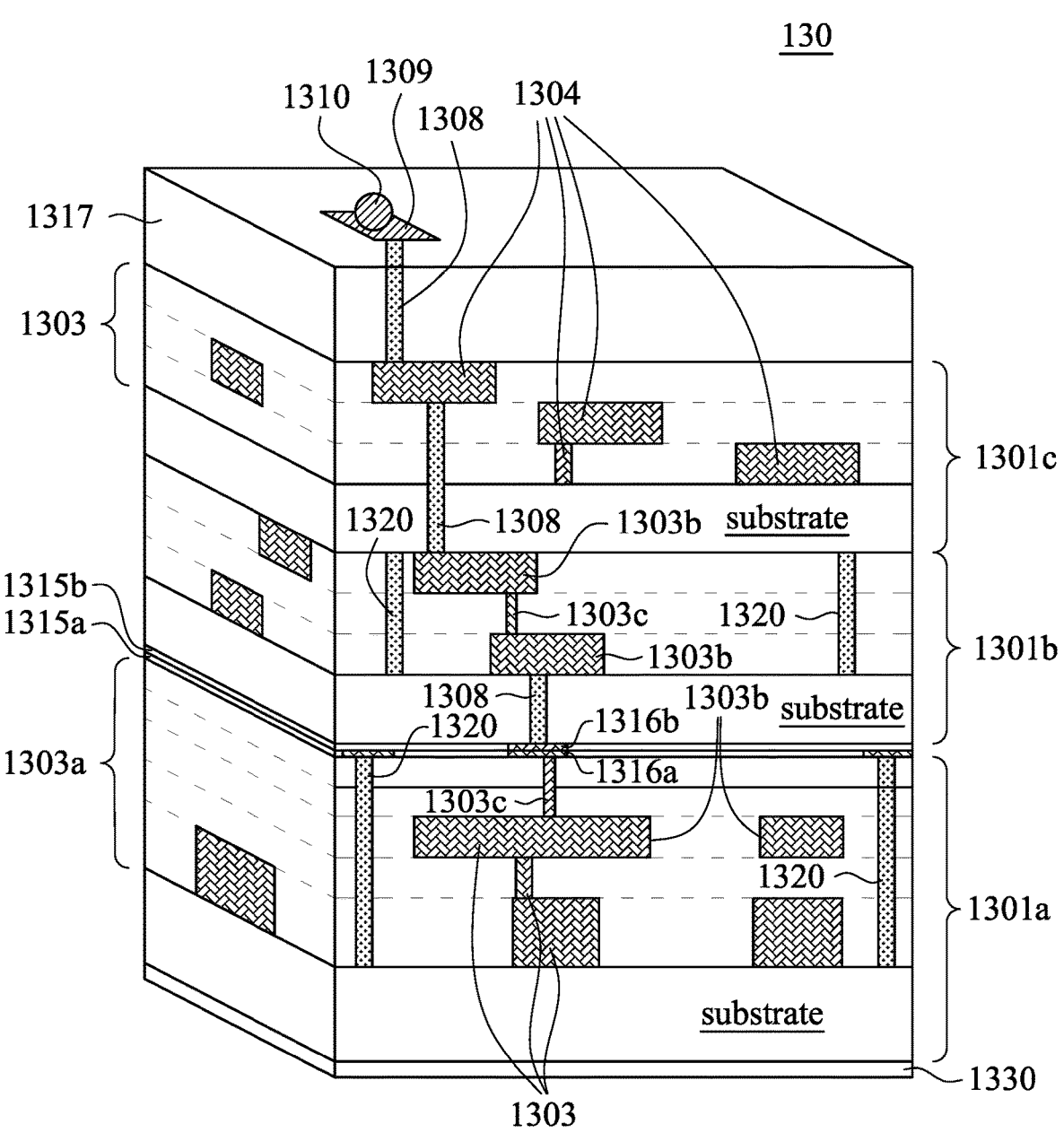
FIG. 13C is a simplified perspective view of an individual die group including a plurality of stacked dies according to an exemplary embodiment.

FIG. 13C is a simplified perspective view of an individual die group 130 including a plurality of stacked dies according to an exemplary embodiment. Referring to FIG. 13C, the die group 130 includes a first die 1301a, a second die 1301b, and a third die 1301c stacked on top of each other. Each of the first, second, and third dies may include a substrate, an active region including a plurality of active devices (not shown), an interconnect structure 1303 formed on the substrate and configured to electrically connect the active region of each die with each other. The interconnect structure 1303 may include a plurality of dielectric layers 1303a, metal lines 1303b formed in the dielectric layers 1303a, and vias 1303c connecting metal lines 1303b in different layers. In some embodiments, the dielectric layers 1303a include silicon oxide, silicon nitride, silicon carbide, silicon oxynitride, and/or combinations thereof. In some embodiments, the dielectric layers 1303a may include one or more low-k dielectric layers having low k values. In some embodiments, the k values of the low-k dielectric materials may be lower than about 3.0.

In some embodiments, the dies are electrically coupled to each other by through substrate vias (TSVs) and through oxide vias (TOVs) 1308. In some embodiments, the die group 130 also includes a bonding layer 1317 including an oxide material, e.g., silicon oxide. In some embodiments, the bonding layer 1317 may include a plurality of bonding films and electrical connectors 1309 having a plurality of solder regions. In some embodiments, the electrical connectors 1309 include copper posts, solder caps, and/or electrically conductive bumps 1310 configured to electrically coupled to other electronic circuits on a printed circuit board or other substrates. In some embodiments, the die group 130 includes a plurality of semiconductor dies or chips similar to those of FIG. 12. In an embodiment, the stacked dies of the die group 130 include logic devices, input/output (IO) devices, processing units, e.g., data processing units, graphics processing unit, application specific integrated circuits (ASIC), field programmable gate arrays (FPGA), other applicable types of devices. In some embodiment, the die group 130 is a system-on-integrated circuits (SoIC) device that includes multiple functions. In the example shown in FIG. 13A, three dies are shown, but it is understood that the number is illustrative only and is chosen for describing the example embodiment and should not be limiting. For example, the die group 130 can include a single die, two dies, or more than three dies. In some embodiments, the die group 130 may be bonded to a package substrate (e.g., an interposer, a printed circuit board) through flip-chip bonding using the electrical connectors 1309.

In some embodiments, the dies are bonded to each other by a hybrid bonding process. In an embodiment, the first die 1301a has a first bonding surface formed on its upper surface including a first bonding dielectric layer 1315a and a first conductive contact structure 1316a. The second die 1301b has a second bonding surface formed on a bottom of its substrate, the second bonding surface includes a second bonding dielectric layer 1315b and a conductive contact structure 316b. In an embodiment, the first and second conductive contact structures 1316a, 1316b may be electrically coupled to the interconnect structure 1303. In another embodiment, the first and second conductive contact structures 1316a, 1316b may not be electrically coupled to the interconnect structure 1303. In an embodiment, the first die 1301a and the second die 1301b are directly hybrid bonded together, such that the first and second conductive contact structures 1316a, 1316b are bonded together, and the first and second bonding dielectric layers 1315a, 1315b are bonded together. In an embodiment, the first and second bonding dielectric layers 1315a, 1315b each include silicon oxide, and the first and second conductive contact structures 1316a, 1316b each include copper.

In an embodiment, the dies also include a seal ring 1320 configured to stop cracks generated by stress during the bonding processes and/or the singulation. The seal ring 1320 is also configured to prevent water, moisture, and other pollutant from entering the dies. In an embodiment, the seal ring 1320 includes copper configured to suppress electromagnetic noise. In an embodiment, the first die 1301a may include a bonding dielectric layer 1330 configured to be bonded to a carrier substrate by fusion bonding.

Figure 14:
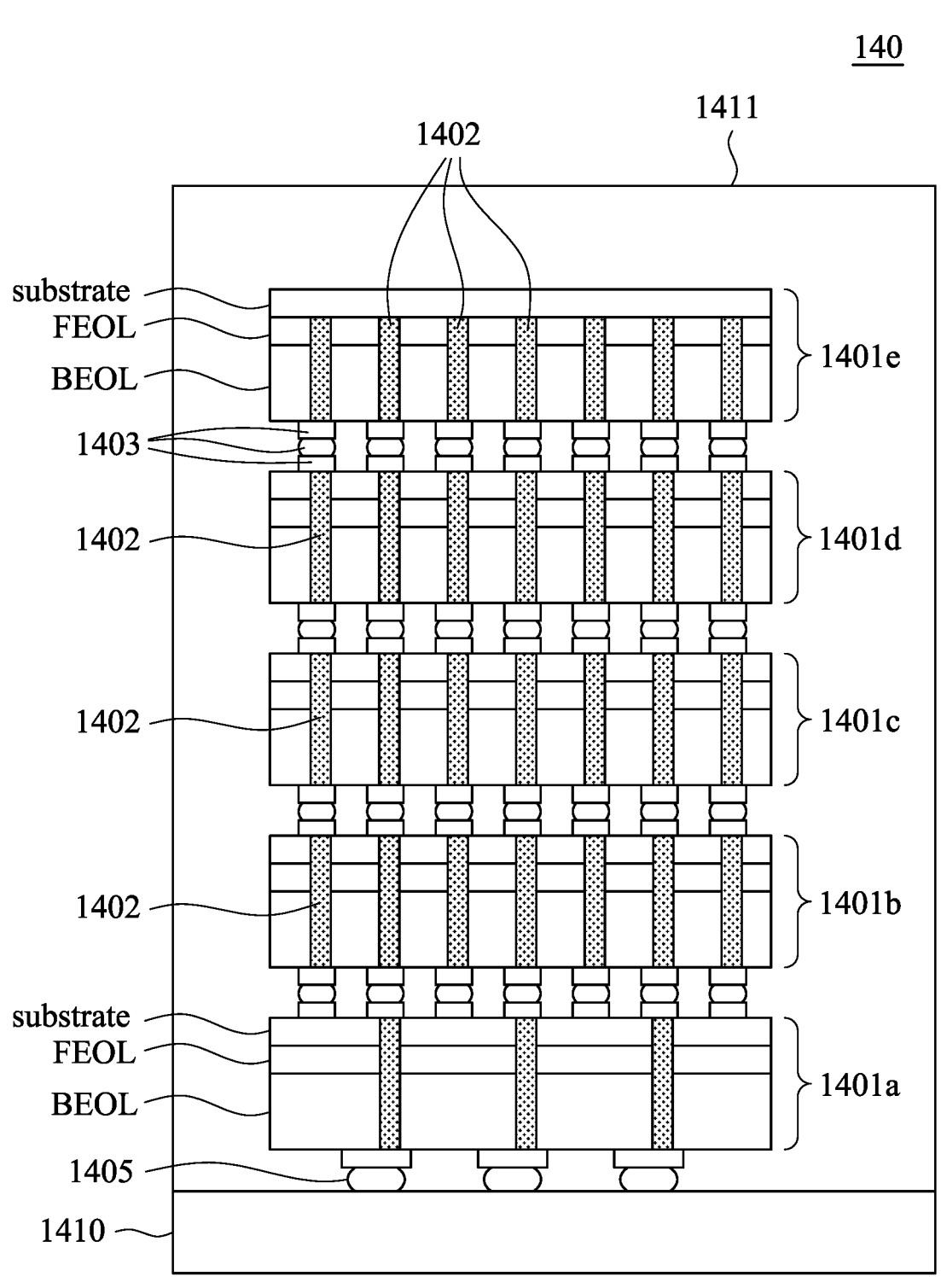
FIG. 14 is a simplified cross-sectional view of a die group including a plurality of stacked dies according to an exemplary embodiment.

FIG. 14 is a simplified cross-sectional view of a die group 140 including a plurality of stacked dies according to an exemplary embodiment. Referring to FIG. 14, the die group 140 includes a plurality of dies that are stacked on top of each other. In an exemplary embodiment, the die group 140 includes dies 1401a, 1401b, 1401c, 1401d, and 1401e. In an exemplary embodiment, each die includes a substrate, a front-end-of-line (FEOL) structure, and a back-end-of-line structure. The FEOL structure generally includes a first portion of a fabrication of an integrated circuit, such as forming trench isolation structures, performing implants for forming wells, forming active regions, e.g., source/drain regions, gate structures, and interlayer dielectric layers. The BEOL structure generally includes forming electrically conductive lines, vias in intermetal dielectric layers to electrically couple electronic circuits formed on the substrate. In some embodiments, the dies 1401a, 1401b, 1401c, 1401d, and 1401e are memory dies. The memory dies may include memory devices, such as static random access memory (SRAM) devices, dynamic random access memory (DRAM) devices, other suitable devices, or a combination thereof. In some embodiments, the die 1401a is a memory controller die that is electrically connected to the memory dies 1401b, 1401c, 1401d, and 1401e disposed thereon. In some embodiments, the die group 140 may function as a high bandwidth memory (HBM). In the example shown in FIG. 14, five dies are shown, but it is understood that the number is illustrative only and is chosen for describing the example embodiment and should not be limiting. For example, the die group 140 can include fewer or more than five dies in some embodiments.

In some embodiments, the die group 140 also includes a plurality of conductive features 1402 extending through the dies 1401a to 1401e and electrically coupled to a plurality of conductive bonding structures 1403 disposed between the dies 1401a, 1401b, 1401c, 1401d, and 1401e to electrically bond them together. The conductive features 1402 are configured as through-substrate vias (TSVs) to electrically connect the dies with each other. In an embodiment, the conductive bonding structures 1403 include tiny solder bumps, such as controlled collapse chip connection (C4) bumps or ball grid array (BGA) bumps and pillars formed on an upper surface of a die using various process steps. In some embodiments, the die group 140 also includes a bonding structure 1405 formed on a surface of the BEOL structure of the die 1401a and configured to bond the die group 140 to a substrate 1410. The die group 140 is flipped over and mounted on the substrate 1410. In some embodiments, the die group 140 also includes a molding compound layer 1411 that encapsulates the dies 1401a, 1401b, 1401c, 1401d, and 1401e. The molding compound layer 1411 includes an epoxy-based resin or other suitable material. In some embodiments, the molding compound layer 1411 fills the air gaps between the dies 1401a, 1401b, 1401c, 1401d, and 1401e and surrounds the conductive bonding structures 1403 and 1405.

Structure Stress Effects to a Particular TSV

It is observed that in some situations, one or more TSVs in a multi-die structure, such as multi-die structure 120 shown in FIG. 12 may have structure stress build-up leading to cracks or nodules on those TSVs. This structure stress build-up in the TSVs may be caused by a number of factors in connection with each other or separately independently. For example, during fabrication of the multi-die structure, processes such as CMP, wet etching, and/or any other processes may introduce water in one or more intermediate stages of the multi-die structure. Such water may become moisture accumulated within the multi-die structure and/or spread to the TSVs within the multi-die structure. Moisture on a particular TSV, over time, can cause structure defect to that TSV. This may be magnified when the particular TSV is through one or more dies in the multi-die structure. This particular TSV thus becomes lengthy vertically and moisture can cause stress build-up on multiple parts of the particular TSV. As mentioned above, such stress build-up on the particular TSV can cause cracks on the TSV. One phenomenon observed is ELK (extra-low-K) delamination on the particular TSV such that certain portions of the TSV are collapsed. Another phenomenon observed is copper nodule on the TSV leading to barrier liner in the TSV to escape from the TSV, which may in turn cause barrier oxidation. Still another phenomenon observed is variations of TSVs in the fabrication. Because moisture spreading is not controlled and largely dictated by internal structure of the multi-die structure, its impact to the TSVs are varied among TSVs, which can cause the TSVs not in uniform shapes as intended within the substrate. Other phenomenon are observed.

Figure 15:
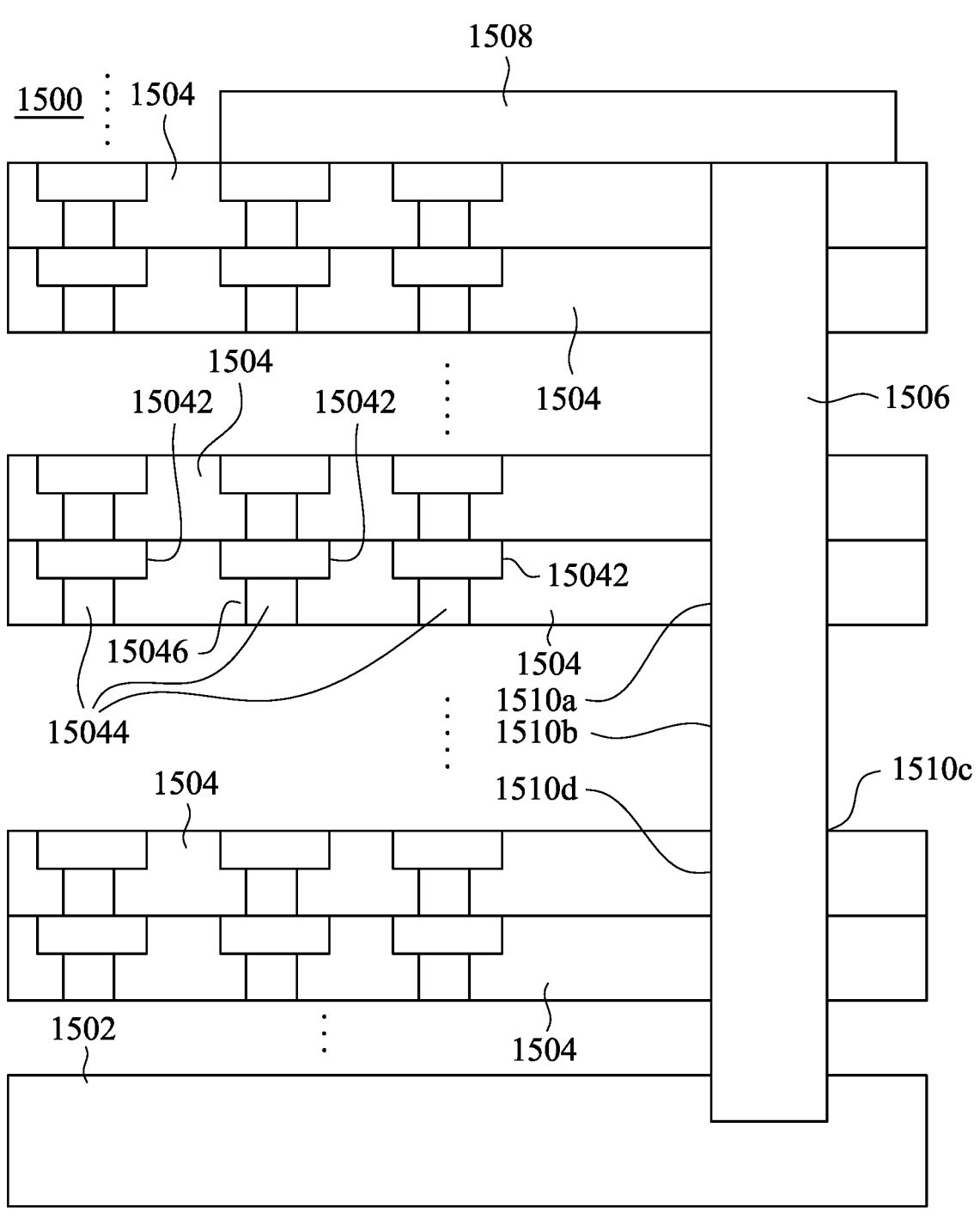
FIG. 15 illustrates one example of the aforementioned effects within an example multi-die structure.

FIG. 15 illustrates one example of the aforementioned effects within an example multi-die structure 1500. The view shown in FIG. 15 is a cross-sectional view of a portion of the multi-die structure 1500. In various implementation, the multi-die structure 1500 may be similar to or the same as the multi-die structures shown in FIGS. 12-14. As shown in this example, the multi-die structure 1500 includes a substrate 1502, dielectric layers 1504, a TSV 1506, a metal interconnect structure 1508, and/or any other components.

The substrate 1502 can be a semiconductor substrate or a non-semiconductor substrate. For example, the substrate 1502 may include a bulk silicon substrate. In some embodiments, the substrate 1502 may include an elementary semiconductor, such as silicon or germanium in a crystalline structure, a compound semiconductor, e.g., silicon germanium, silicon carbide, gallium arsenic, gallium phosphide, indium phosphide, indium arsenide, and/or indium antimonide, or combinations thereof. Possible substrate 1502 may also include a semiconductor-on-insulator (SOI) substrate. In an embodiment, the substrate 1502 is a silicon layer of an SOI substrate. The substrate 1502 can include various doped regions depending on design requirements, e.g., n-type wells or p-type wells. The doped regions are doped with p-type dopants, e.g., boron, n-type dopants, e.g., phosphorous or arsenic, or combination thereof.

The dielectric layers 1504 shown in this example may be within a single die in the multi-die structure 1500 or may be across more than one die in the multi-die structure 1500. In a case where the dielectric layers 1504 shown are across multiple dies, a vertical dotted line is shown in FIG. 15 where two of the multiple dies are bonded together. This vertical dotted line may represent a bonding interface for the dies in the multi-die structure 1500. As shown, the individual one of the dielectric layers 1504 includes a plurality of metal lines 15042, vias 15044, a dielectric material, and/or any other components. As mentioned, in some implementation, the dielectric layers 1504 shown in this example may be IMD layers. However, this is not necessarily the only case. One skilled in the art will understand that the present disclosure will also apply to other types of multi-die structures.

As shown in this example, the TSV 1506 is arranged across the dielectric layers 1504 shown in FIG. 15 and through into the substrate 1502. As mentioned, the TSV 1506 is configured to inter-connect the metals lines 15042 in the dielectric layers 1504 through a top metal interconnect structure 1508 as shown. It should be understood, although 6 dielectric layers 1504 are shown in this example, this is not intended to be limiting. The multi-die structure 1500 in accordance with the disclosure can have more or less than 6 dielectric layers 1504 in other examples. It is understood that the dielectric layers 1504 shown in this example is to illustrate the TSV 1506 is configured to across those dielectric layers 1504 and interconnects the metal lines 15042 in those dielectric layers 1504.

As mention earlier, moisture caused by one or more processes, such as CMP, wet etching, and/or any other processes, can impact the TSV 1506 at various locations, for example, 1510*a*, 1510*b*, 1510*c*, and 1510*d* shown in FIG. 15. As also mentioned, such moisture effects on the TSV 1506 can cause ELK delamination on one or more portions of the TSV 1506, copper nodule to cause barrier oxidation, TSV variation, and/or any other defects within the multi-die structure 1500.

Novel TSV Protection Structure

For addressing the aforementioned effects to a TSV within a multi-die structure in accordance with the disclosure, a novel TSV protection structure is provided. In various embodiments, the novel TSV protection structure includes protection portions around the TSV in the dielectric layers where the TSV is located. In those embodiments, the protection portions are filled with a metallic material such as copper for shielding the TSV from moisture impacts. s will be described, in various embodiments, the protection portions in the novel TSV protection structure may be of a variety shapes based on design and functional considerations.

Figure 16A:
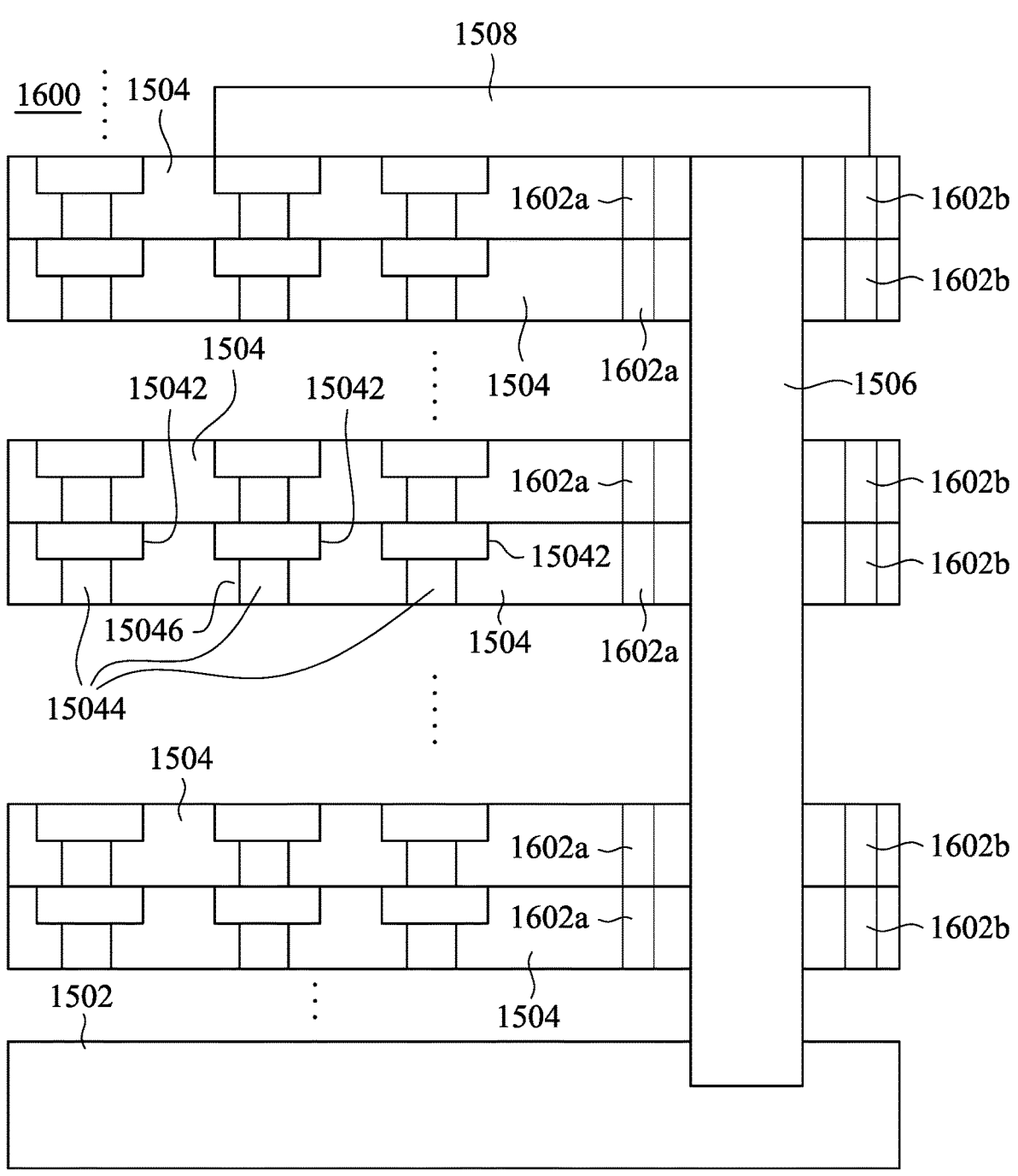
FIG. 16A illustrates an example TSV protection structure in a multi-die structure in accordance with the disclosure.

FIG. 16A illustrates an example TSV protection structure 1602 in a multi-die structure 1600 in accordance with the disclosure. It will be described with reference to FIG. 15. As shown, various components in the multi-die structure 1600 are shown in FIG. 15, please reference FIG. 15 and its associated texts herein for their descriptions. In this example, as can be seen, the TSV protection structure 1602 has two portions, 1602*a* and 1602*b*, around the TSV 1506. As mentioned earlier, metallic materials such as copper, aluminum, nickel, tungsten, or alloys thereof may be filed in the protection structure 1602 to shield the TSV from moisture impacts.

Figure 16B:
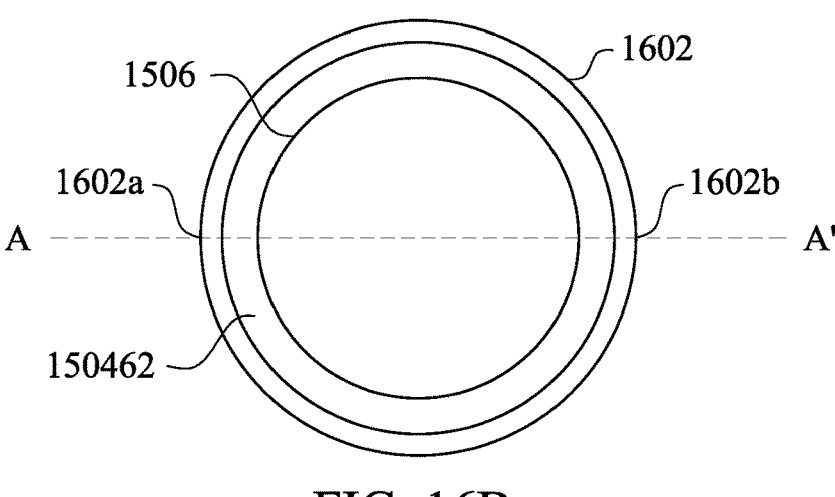
FIG. 16B illustrates a top view of one example implementation of the TSV protection structure 1602 shown in FIG. 16A, which is a cross-sectional view of FIG. 16B along cut line A-A'.

FIG. 16B illustrates a top view of one example implementation of the TSV protection structure 1602 shown in FIG. 16A, which is a cross-sectional view of FIG. 16B along cut line A-A'. As can be seen, in this implementation, the TSV protection structure 1602 is of a circular shape encircling the TSV 1506 to protect the TSV 1506 from moisture and/or any other effects. As can be seen, in implementation, the TSV protection structure 1602 may be arranged around the TSV 1506 with dielectric material buffer 150462 in between. The dielectric material buffer 150462 can serve as another layer of protection, for example, to prevent the aforementioned barrier oxidation. In various implementation, a diameter of the TSV 1506 may be of value. In some implementation, a diameter of the TSV 1506 is around 2 um because of a design choice for the multi-die structure 1600. In various implementation, the TSV protection structure 1602 may have a width of any value. In some implementation, the width of the TSV 1506 may be a fraction of the width of the TSV 1506 between 1/20 to 1/2. A size of the dielectric material buffer 150462 is not limited in the present disclosure. It is understood the size of the dielectric material buffer 150462 may be a design choice.

Figure 16C:
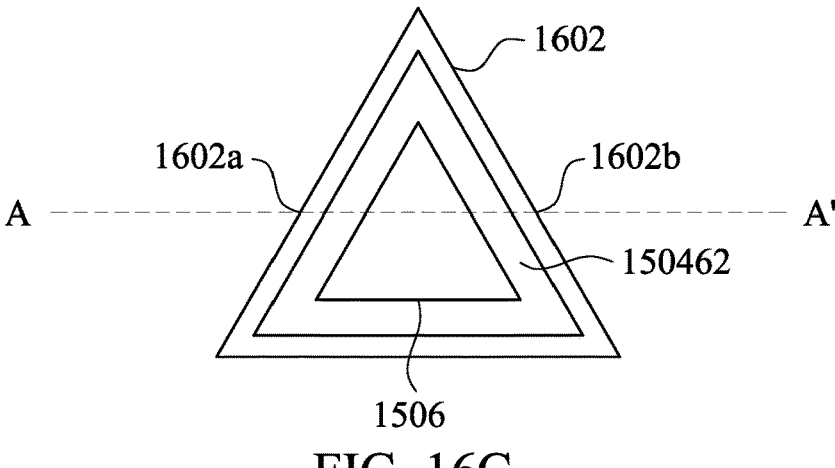
FIG. 16C illustrates a top view of another example implementation of the TSV protection structure 1602 shown in FIG. 16A, which is a cross-sectional view of FIG. 16C along cut line A-A'.
Figure 16D:
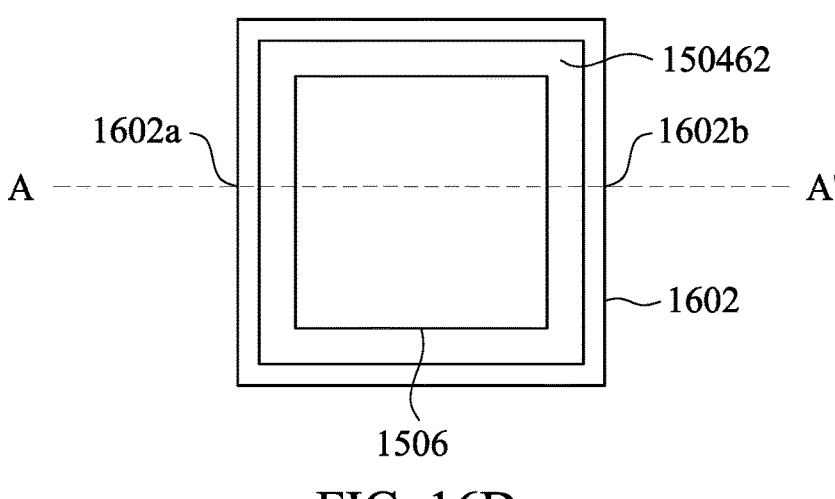
FIG. 16D illustrates a top view of yet another example implementation of the TSV protection structure 1602 shown in FIG. 16A, which is a cross-sectional view of FIG. 16D along cut line A-A'.

FIG. 16C illustrates a top view of another example implementation of the TSV protection structure 1602 shown in FIG. 16A, which is a cross-sectional view of FIG. 16C along cut line A-A'. As can be seen, in this example, the TSV protection structure 1602 has a triangular shape. FIG. 16D illustrates a top view of yet another example implementation of the TSV protection structure 1602 shown in FIG. 16A, which is a cross-sectional view of FIG. 16C along cut line A-A'. As can be seen, in this example, the TSV protection structure 1602 has a rectangular shape. Other shapes of the TSV protection structure 1602 are contemplated. It is understood that a shape of the TSV protection structure 1602 may be a design choice depending on a shape of the TSV 1506, and/or functional and cost considerations for the multi-die structure 1600.

In some examples, the TSV protection structure in accordance with the present disclosure includes non-uniform shaped portions. For example, certain parts of the TSV protection structure in accordance with the present disclosure can be narrower or wider than other parts of the TSV protection structure in accordance with the present disclosure. FIGS. 7A-D illustrate such a non-uniform shaped TSV protection structure in accordance with the disclosure.

Figure 17A:
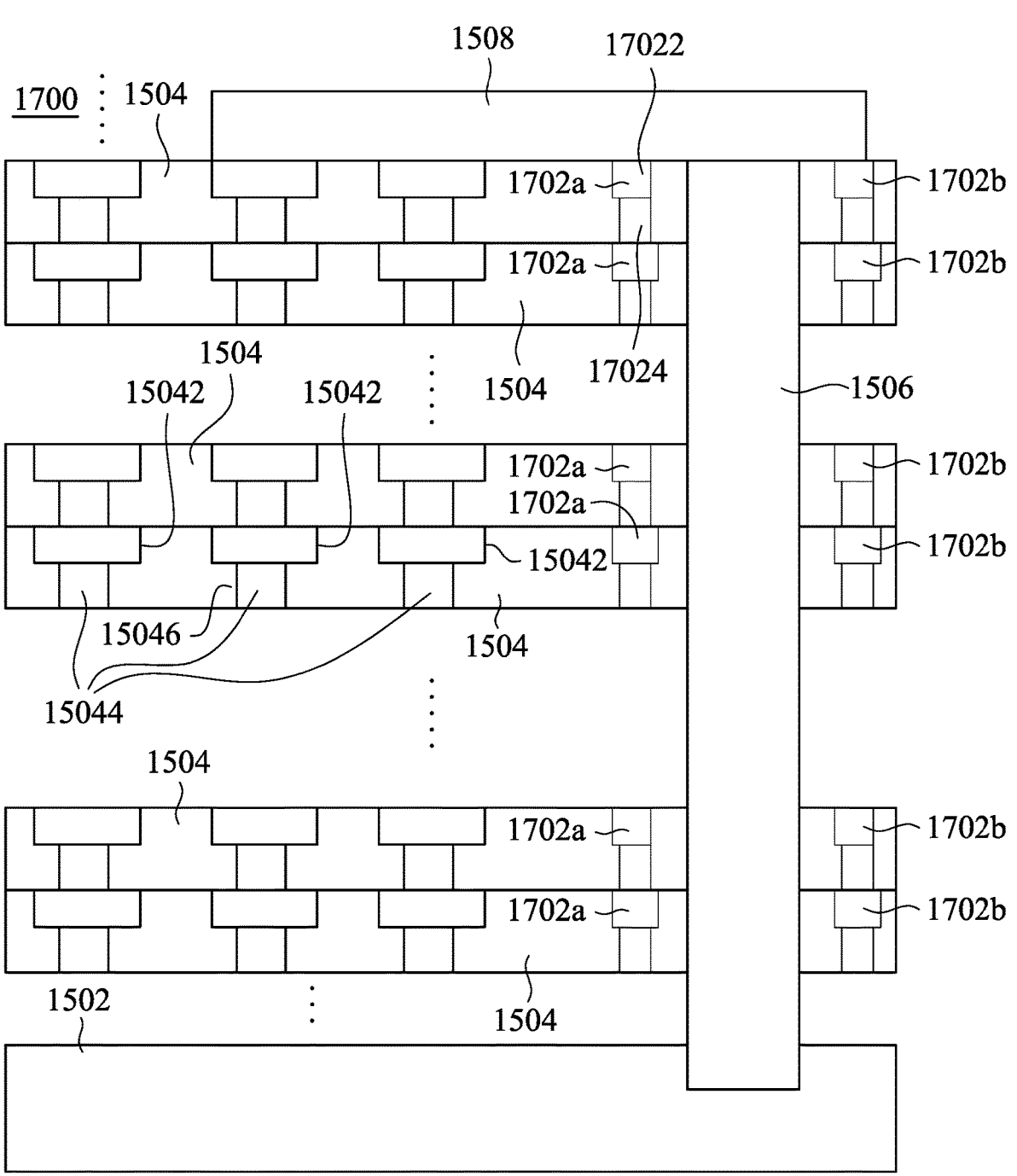
FIG. 17A illustrates an example TSV protection structure in a multi-die structure in accordance with the disclosure.

FIG. 17A illustrates an example TSV protection structure 1702 in a multi-die structure 1700 in accordance with the disclosure. It will be described with reference to FIG. 15. As shown, various components in the multi-die structure 1600 are shown in FIG. 15, please reference FIG. 15 and its associated texts herein for their descriptions. In this example, as can be seen, the TSV protection structure 1702 has two portions, 1702*a* and 1702*b*, around the TSV 1506. The TSV protection structure 1702 in this example has two shapes within a single dielectric layer 1504 as shown. The top portion 17022 is wider than the bottom portion 17024 in the dielectric layer 1504 as can be seen from FIG. 17A. In implementation, the top portion 17022 can be formed in a same process for forming the metal lines 15042, and the bottom portion 17024 can be formed in a same process for forming the vias 15044.

Figure 17B:
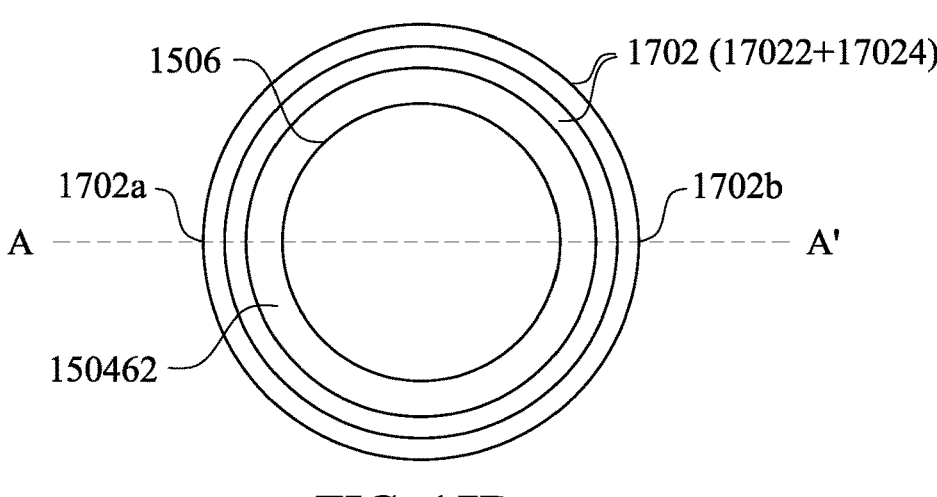
FIG. 17B illustrates a top view of one example implementation of the TSV protection structure 1702 shown in FIG. 17A, which is a cross-sectional view of FIG. 17B along cut line A-A'.
Figure 17C:
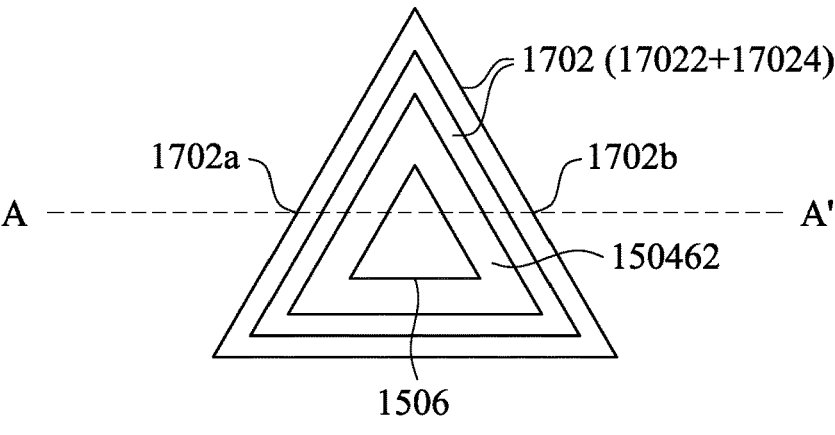
FIG. 17C illustrates a top view of another example implementation of the TSV protection structure 1702 shown in FIG. 17A, which is a cross-sectional view of FIG. 17C along cut line A-A'.
Figure 17D:
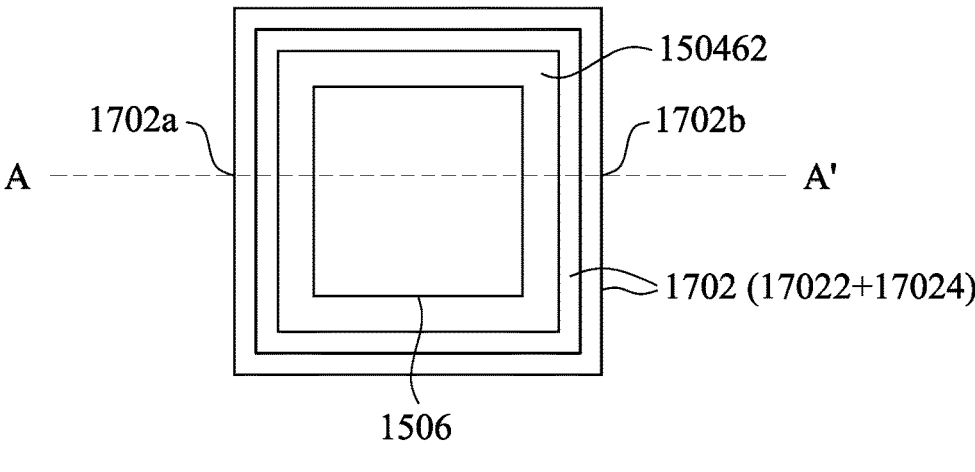
FIG. 17D illustrates a top view of yet another example implementation of the TSV protection structure 1702 shown in FIG. 17A, which is a cross-sectional view of FIG. 17D along cut line A-A'.

FIG. 17B illustrates a top view of one example implementation of the TSV protection structure 1702 shown in FIG. 17A, which is a cross-sectional view of FIG. 17B along cut line A-A'. As can be seen, in this implementation, the TSV protection structure 1702 is of a circular shape encircling the TSV 1506 to protect the TSV 1506 from moisture and/or any other effects. The protection structure 1702 includes a top portion 17022 (solid fill) and a bottom portion 17024 (patterned fill) as also shown in FIG. 17A. The pattern filled bottom portion 17024 is so illustrated to show it is under the top portion 17022, not intended to show it is next to the top portion 17022. Similarly, FIG. 17C and FIG. 17D illustrate the TSV protection structure 1702 shown in FIG. 17A can have triangular or square shapes.

Figure 18A:
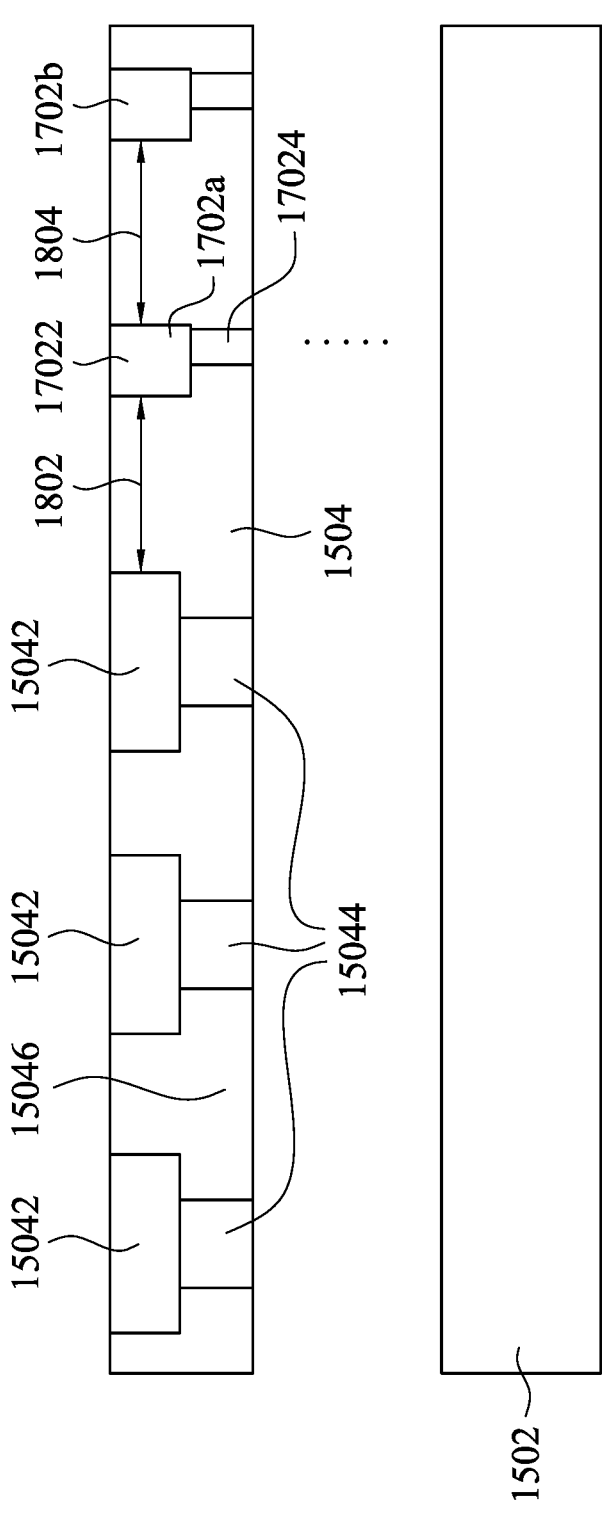
FIG. 18A shows a first stage of the fabrication of the multi-die structure, where one or more of a dielectric layer is arrange above a substrate.

Example Process for Fabricating the TSV Protection Structure in Accordance with the Disclosure Attention is now directed to FIGS. 18A-18D, where an example process for fabricating the TSV protection structure in a multi-die structure in accordance with the disclosure is illustrated. They will be described with reference to FIGS. 11-17. FIG. 18A shows a first stage of the fabrication of the multi-die structure, where one or more of a dielectric layer 1504 is arrange above a substrate 1502. As mentioned above, in implementation, the formation of dielectric layer 1504 may be performed at BEOL. As shown, forming the dielectric layer 1504 includes arranging a plurality of patterned metal lines 15042 and vias 15044 in the dielectric layer. The dielectric layer 1504 includes a dielectric material 15046. Examples of suitable dielectric materials include silicon oxide, doped silicon oxide, various low-k dielectric and high-k dielectric materials known in the art, and combination thereof. The dielectric layer 1504 may be formed by conventional techniques, such as, chemical vapor deposition (CVD), plasma enhanced CVD (PECVD), physical vapor deposition (PVD), or by other deposition methods. Metal lines and vias 15042 and 15044 are formed in the dielectric layer 1504 to provide an electrical connection to devices arranged in dies in the multi-die structure. In an embodiment, the metal lines and vias 15042 and 15044 include copper, aluminum, nickel, tungsten, cobalt, or alloys thereof.

As also can be seen, the formation of the dielectric layer 1504, in accordance with the disclosure, includes forming TSV protection structure 1702 in the dielectric layer 1504. In this example, the TSV protection structure 1702 is formed layer by layer along with the one or more of the dielectric layer 1504 above the substrate 1502. In implementation, the top portion 17022 of the TSV protection structure 1702 is formed in a same or similar process as/to the metal line 15042; and the bottom portion of the TSV protection structure 1702 is formed in a same or similar process as/to the vias 15044. In this way, existing steps for forming metal lines/vias in the dielectric layers 1504 can be used to form the TSV protection structure 1702 during the fabrication of the multi-die structure. In various embodiments, the location of the TSV protection structure 1702 is selected based on a number of considerations: including a size and shape of the TSV to be protected, a minimum distance 1802 needed between a portion of the TSV protection structure and neighboring metal lines/vias 15042 and dielectric layers 1504, and/or any other considerations. As shown, in this example, space 1804 represents where the to-be-protected TSV is arranged. The space 1804 can be identified from a layout of the multi-die structure prior to the fabrication of the multi-die structure. In general, as mentioned above, the space 1804 may be determined to include space for the to-be-protected TSV, a dielectric material buffer, and/or any other components needed to be within the space 1804. The size of space 1804 is a design choice and is not specially limited in the present disclosure. In some embodiments, a width of 1-10 um is used for space 1804.

Another consideration for the TSV protection structure 1702 is a minimum distance between the a portion of the TSV protection structure 1702 and nearest neighboring metal lines/vias 15042 and 15044. In various embodiments, this minimum distance is determined according a functional consideration for the multi-die structure. For example, parasitic capacitance could be avoided with such a minimum distance. However, it should be understood, the present disclosure does not limit the space 1802 between the TSV protection structure 1702 and metal lines/vias 15042 and 15044 to a specific value. As mentioned, this distance is design choice.

Figure 18B:
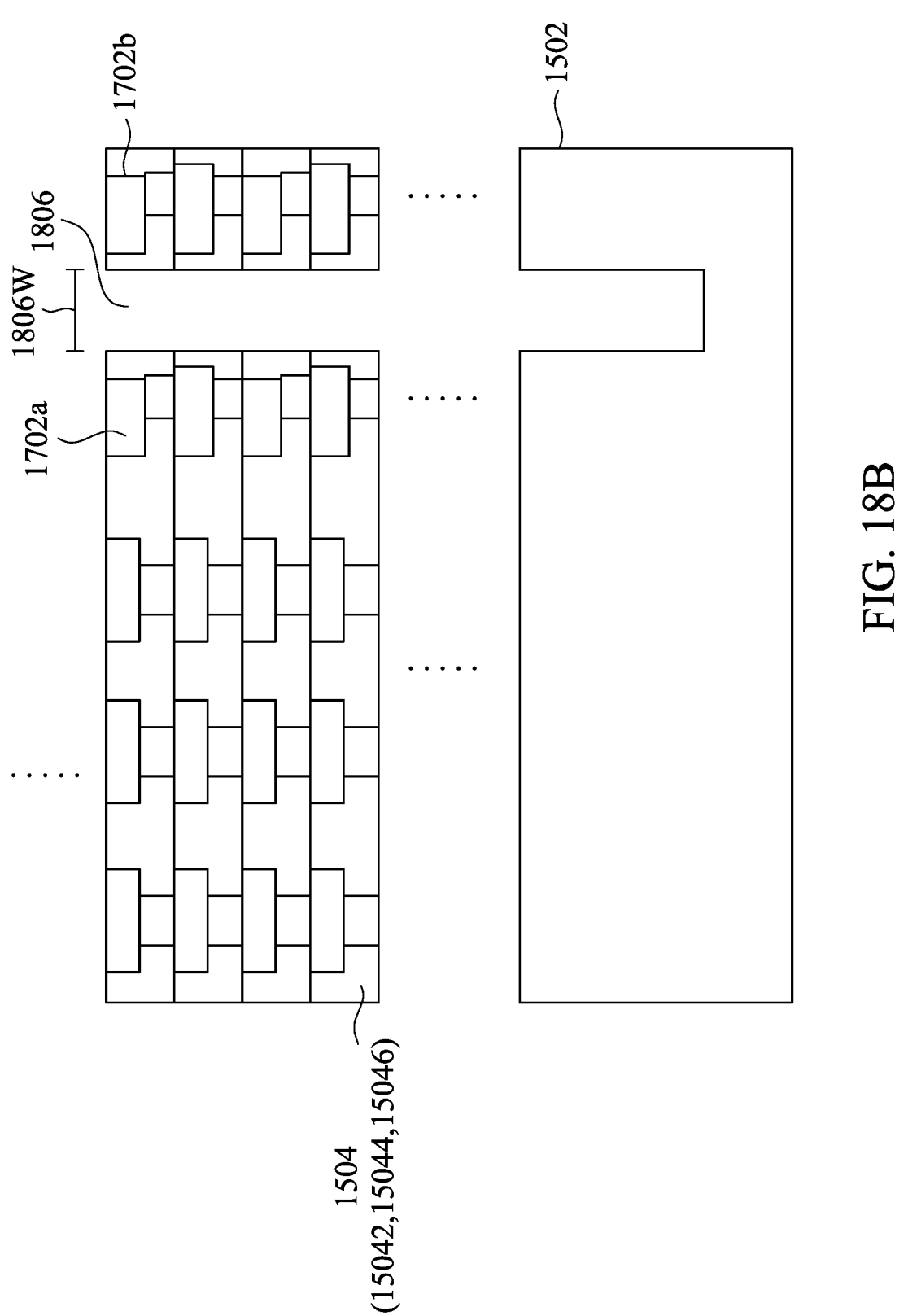
FIG. 18B illustrates TSV opening is formed in the space 1804 shown in FIG. 18A.

FIG. 18B illustrates TSV opening 1806 is formed in the space 1804 shown in FIG. 18A. As shown, the TSV opening 1806 is through multiple of formed dielectric layers 1504 and into substrate 1502. In implementation, the width 1806W of the TSV opening 1806 may be smaller than the width of the space 1804 to account for dielectric material buffer zone and/or any other components may be arranged within the space 1804. In implementation, forming the TSV opening 1806 may include performing etching using the photo resist. TSV opening 1806 may be formed by, for example, dry etch, although other methods such as laser drilling may also be used. After the formation of TSV opening 1806, the photo resist is removed. In various embodiments, TSV opening 1806 may have an aspect ratio (the ratio of depth D to width W) greater than about 7, greater than about 8, or even greater than about 10. However, this is not intended to be limiting. TSV opening's size is not specifically limited in the present disclosure.

Figure 18C:
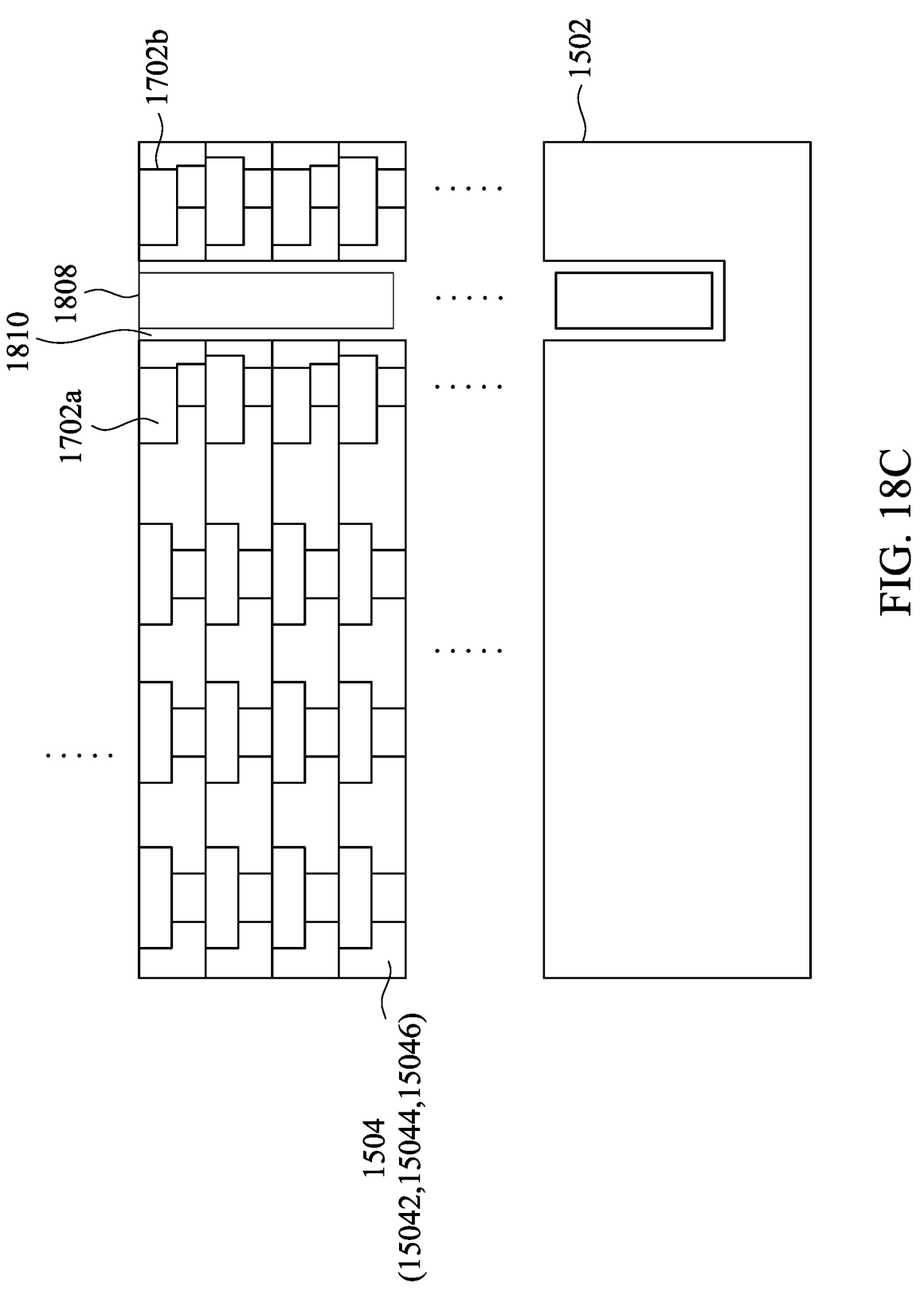
FIG. 18C illustrates a TSV is formed within a TSV opening and a TSV liner is also formed within a via.

FIG. 18C illustrates a TSV 1808 is formed within TSV opening 1806 and a TSV liner 1810 is also formed within via 1806. As mentioned above, forming TSV 1808 may include filling copper, aluminum, tungsten, or alloys thereof into the TSV opening 1816. In an embodiment, the formation of TSV liner 1810 is performed using spin-on coating. The spin-on coating process involves spraying a chemical. In an exemplary embodiment, the chemical includes tetra-ethyl-ortho-silicate (TEOS), methyltriethoxysilane (MTES), or combinations thereof. The chemical may go through a SOL-GEL process to form a polymer, which process results in an increase in the cross-links in the chemical. The chemical in the form of a polymer is then dissolved in a solvent. In an exemplary embodiment, the solvent comprises ethanol, isopropyl alcohol, acetone, ether, tetrahydrofuran (THF), and/or the like. The solvent is easy to evaporate. The evaporation of the solvent affects the formation of TSV liner 1810, and with the evaporation of the solvent, the viscosity of the chemical increases. The evaporation rate of the chemical, after the solvent is added, may be measured using equilibrium vapor pressure.

Figure 18D:
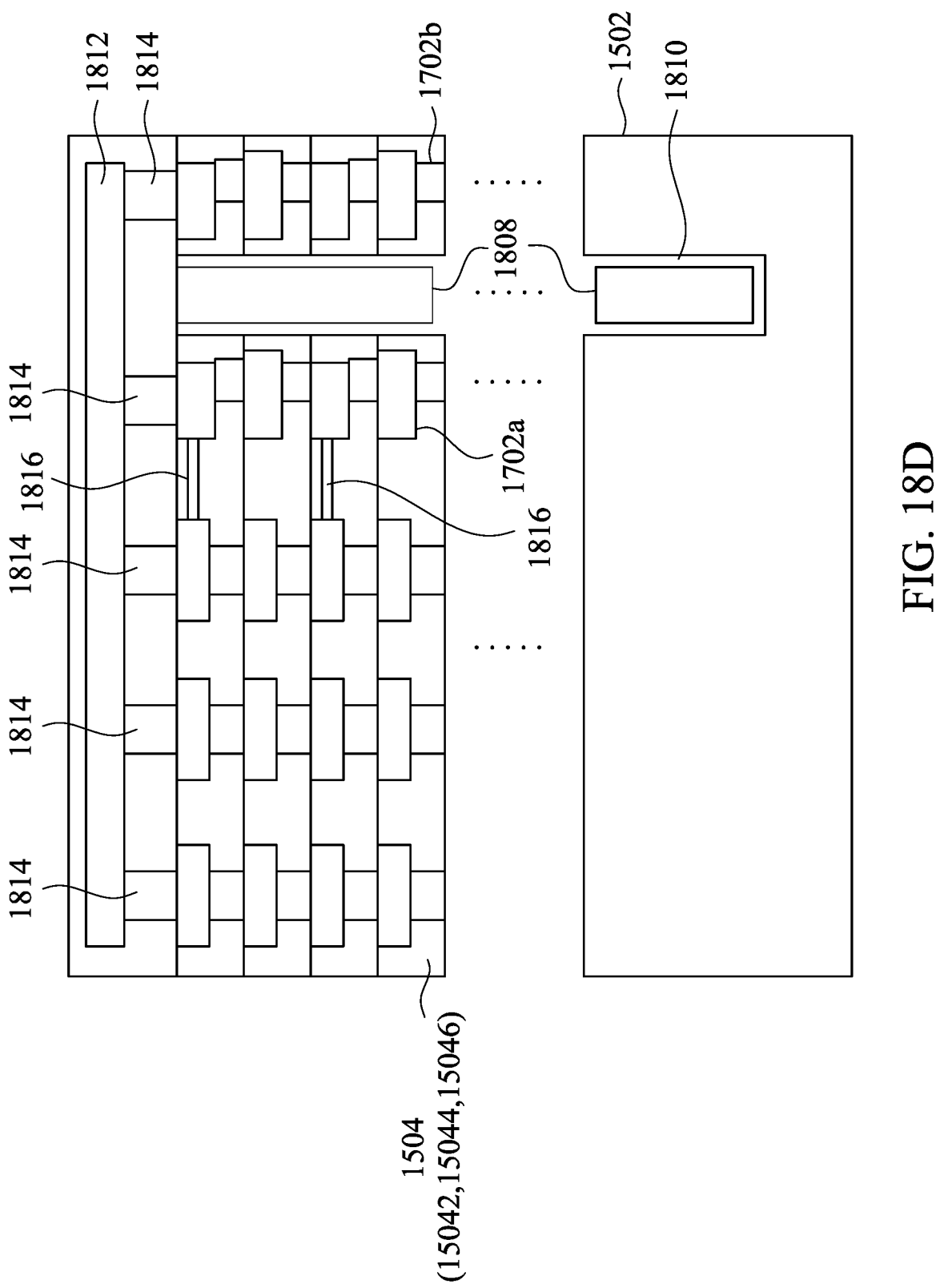
FIG. 18D illustrates a metal interconnect structure is formed across metal lines, a TSV protection structure, and a TSV.

FIG. 18D illustrates a metal interconnect structure 1812 is formed across the metal lines 15042, TSV protection structure 1702, and TSV 1808. As shown, the metal interconnect structure 1812 connects these components through vias 1814 formed under the metal interconnect structure 1812. As mentioned, the metal interconnect structure 1812 can provide electrical connections to the metal lines 15042 in the multi-die structure. Also shown in this example is that one or more of a metal interconnect structure 1814 may be arranged between a top portion of the TSV protection structure 1702a and metal line 15042. The metal interconnect structure 1814 can provide an additional electrical connection for the metal lines 15042 within the multi-die structure.

Example Semiconductor Device

Figure 19A:
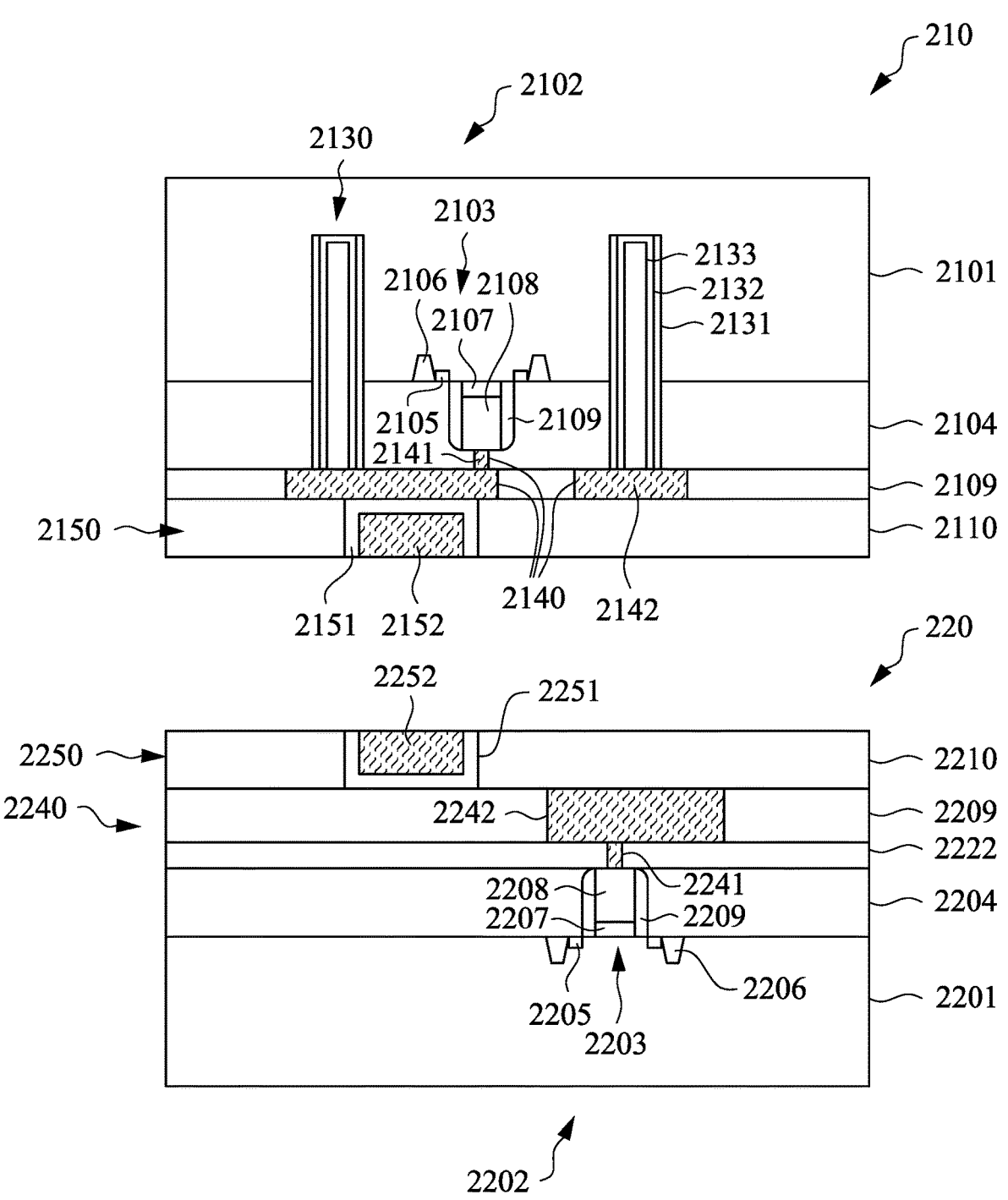
FIGS. 19A and 19B are cross-sectional views illustrating various stages of forming an example semiconductor device of interest to the present disclosure.
Figure 19B:
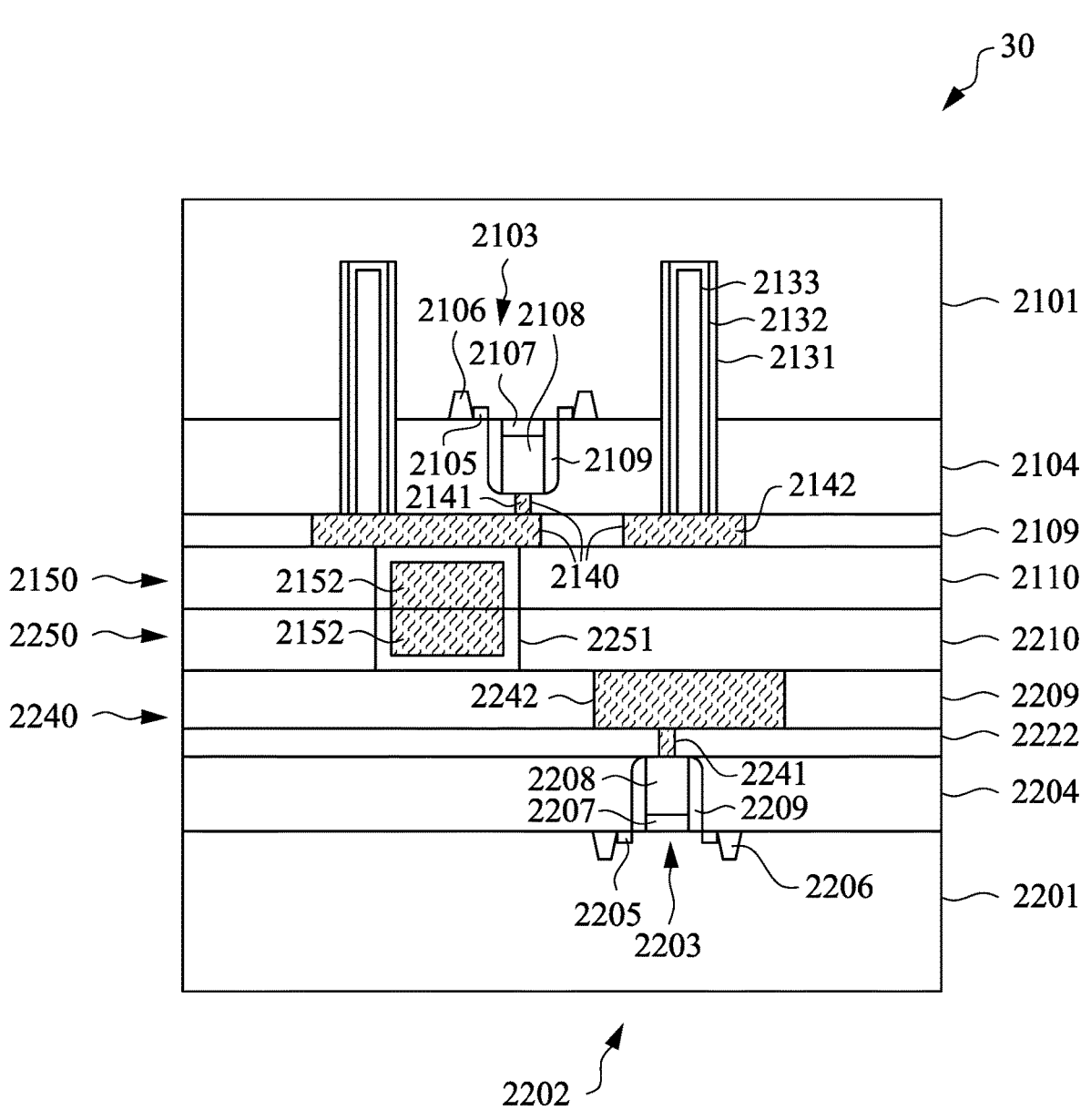

FIGS. 19A and 19B are cross-sectional views illustrating various stages of forming an example semiconductor device of interest to the present disclosure. FIG. 19A shows a cross-sectional view of a portion of a first semiconductor wafer 210 and a portion of a second semiconductor wafer 220 according to an embodiment. The first semiconductor wafer 210 includes a substrate 2101, and the second semiconductor wafer 220 includes a substrate 2201. In an embodiment, each of the substrates 2101 and 2201 may include silicon or other semiconductor materials. In another embodiment, each the substrates 2101 and 2201 may include other elementary semiconductor materials, such as germanium. In some embodiments, each the substrates 2101 and 2201 may include a compound semiconductor, such as silicon carbide, gallium arsenic, indium arsenide, or indium phosphide. In some other embodiments, each the substrates 2101 and 2201 may include an alloy semiconductor, such as silicon germanium, silicon germanium carbide, gallium arsenic phosphide, or gallium indium phosphide. In some embodiments, the substrate 2101 and/or substrate 2201 may include an epitaxial layer, e.g., the substrate 2101 and/or substrate 2201 includes an epitaxial layer overlying a bulk semiconductor.

The first semiconductor wafer 210 includes a device region 2102 formed on the substrate 2101. The device region 2102 includes a gate structure 2103 embedded in a dielectric layer 2104, source/drain regions 2105, and isolation (e.g., shallow trench isolation) structures 2106. The gate structure 2103 includes a gate dielectric layer 2107, a gate electrode 2108, and possibly insulating materials 2109. The device region 2102 shown in FIG. 19A is merely for illustration only and not limiting. Other structures may be formed in the device region 2102. Other transistors (e.g., FinFETs, NMOS, PMOS transistors) and devices (capacitors, resistors, diodes, inductors, and the like) may also be formed on the substrate 2101.

Referring still to FIG. 19A, the dielectric layer 2104 is disposed on the substrate 2101 and covering the device region 2102. The first semiconductor wafer 210 also includes a plurality of through-substrate vias (TSVs) 2130 in the dielectric layer 2104 and extending into the substrate 2101. The TSVs 2130 are configured to provide electrical connection to the second semiconductor wafer 220. It is noted that two TSVs are shown for illustration only, the number of TSVs can be any integer number according to actual applications.

In an embodiment, each TSV can include a liner 2131, a diffusion barrier layer 2132, and a conductive material 2133. The liner 2131 may include an insulating material, e.g., oxides or nitrides and may be formed by a plasma enhanced chemical vapor deposition (PECVD) process or other deposition processes. The liner 2131 may be a single layer or multi-layers. The diffusion barrier layer 2132 may include Ta, TaN, Ti, TiN, CoW, or a combination thereof. In an embodiment, the diffusion barrier layer 2132 is formed by a physical vapor deposition (PVD) process. The conductive material 2133 may include copper (Cu), copper alloy, aluminum (Al), aluminum alloys, or combinations thereof. Alternatively, other applicable materials may also be used. In an embodiment, the conductive material 2133 is formed by plating.

The first semiconductor wafer 210 further includes a metallization structure 2140 on the TSVs and the device region 2102 to connect the TSVs to the device region 2102. In an embodiment, the metallization structure 2140 includes an interconnect structure, such as contact plugs 2141 and conductive features 2142. The conductive features 2142 are embedded in an insulating material 2109. In some embodiment, the insulating material 2109 includes multiple layers of a dielectric material, such as an oxide, e.g., silicon oxide, the contact plugs 2141 include copper, aluminum, tungsten, combinations thereof, or the like, and the conductive features 2142 include a metallic material, such as copper, copper alloy, aluminum, aluminum alloy, or combinations thereof.

The first semiconductor wafer 210 further includes a bonding structure 2150 on the metallization structure 2140. In some embodiments, the bonding structure 2150 includes a barrier layer 2151 and a conductive material 2152. The barrier layer 2151 and the conductive material 2152 are embedded in a bonding layer 2110 disposed on the insulating material 2109. In some embodiments, the bonding layer 2110 includes an oxide or polymer material. The conductive material 2152 includes a metallic material, such as copper, copper alloy, aluminum, aluminum alloy, or combinations thereof. When the conductive material 2152 includes copper, which can diffuse into the insulating material 2109, the barrier layer 2151 is formed between the conductive material 2152 and the insulating material 2109. The barrier layer 2151 may include silicon nitride (SiN), silicon oxynitride (SiON), titanium nitride (TiN), tantalum nitride (TaN), aluminum nitride (AlN), TaN, Ta/TaN, CoP, CoW, or the like. In some embodiments, the bonding layer 110 includes a polymer material, such as benzocyclobutene (BCB) polymer, polyimide (PI), or polybenzoazole (PBO). In some embodiments, the polymer material is deposited over the substrate by spin coating.

The second semiconductor wafer 220 is similar to the first semiconductor wafer 210. The second semiconductor wafer 220 includes a device region 2202 on the substrate 2201. The device region is formed in the second semiconductor wafer 220 in a front-end-of-line (FEOL) process. In some embodiments, the device region includes a gate structure 2203 embedded in a dielectric layer 2204, source/drain regions 2205, and isolation structures 2206. The gate structure 2203 includes a gate dielectric layer 2207, a gate electrode 2208, and spacers 2209. It is noted that the gate structure 2203 is merely an example, and other structures may be formed in the gate structure 2203. In some embodiment, the gate structure 2203 may include various N-type metal oxide semiconductor (NMOS) and/or P-type metal oxide semiconductor (PMOS) devices, fin-type field-effect transistors (FinFETs), gate-all-around (GAA) devices, memories, and the like. Other devices, such as capacitors, diodes, resistors, photo-diodes, and the like can also be formed on the substrate 2201.

The second semiconductor wafer 220 further includes a metallization structure 2240 and a bonding structure 2250. The metallization structure 2240 includes contact plugs 2241 embedded in a dielectric layer 2222 and conductive features 2242 embedded in an insulating material 2209. The bonding structure 2250 is similar to the bonding structure 2150 and includes a barrier layer 2251 and a conductive material 2252 embedded in a polymer material 2210, such as benzocyclobutene (BCB) polymer, polyimide (PI), or polybenzoazole (PBO). The barrier layer 2251 is similar to the barrier layer 2151 and may include silicon nitride (SiN), silicon oxynitride (SiON), titanium nitride (TiN), tantalum nitride (TaN), aluminum nitride (AlN), TaN, Ta/TaN, CoP, CoW, or the like The conductive material 2252 is similar to the conductive material 2152 and includes a metallic material, such as copper, copper alloy, aluminum, aluminum alloy, or combinations thereof. A polishing, e.g., a chemical mechanical polishing (CMP), process is performed on the surface of the bonding layers 2110, 2210, of the first and second semiconductor wafers 210 and 220, respectively.

FIG. 19B shows a cross-sectional view of the portion of the first semiconductor wafer 210 and the portion of the second semiconductor wafer 220 of FIG. 19A after an alignment between the two portions and a bonding of the two portions are performed according to an embodiment. In an embodiment, the first and second semiconductor wafers 210 and 220 are hybrid bonded together by applying pressure and heat to form a stacked structure 230. In an exemplary embodiment, the hybrid bonding is performed at a temperature in a range between about 100° C. and 200° C., so that the polymer materials 2110 and 2210 become a non-confined viscous liquid and are reflowed. Thereafter, the stacked structure 230 is further heated to a higher temperature in a range between about 200° C. and about 400° C., so that the conductive materials 2152 and 2252 are interconnected by thermal compression bonding and polymer materials 2110 and 2220 are fully cured. In some embodiments, the pressure for hybrid bonding is in a range between about 0.7 bar to about 10 bar. The hybrid bonding process may be performed in an inert environment, e.g., with an inert gas including $N_2$, Ar, He, or combinations thereof.

Hybrid bonding involves at least two types of bonding, such as metal-to-metal bonding and non-metal-to-non-metal bonding. During a CMP process, corrosion of a copper or copper alloy layer or copper dishing may occur, i.e., a portion of the conductive material 2152 and portion of the conductive material 2252 may be removed causing a decrease in the electrical interconnection between the first and second conductor wafers 210 and 220.

Dishing Effect

Figure 20:
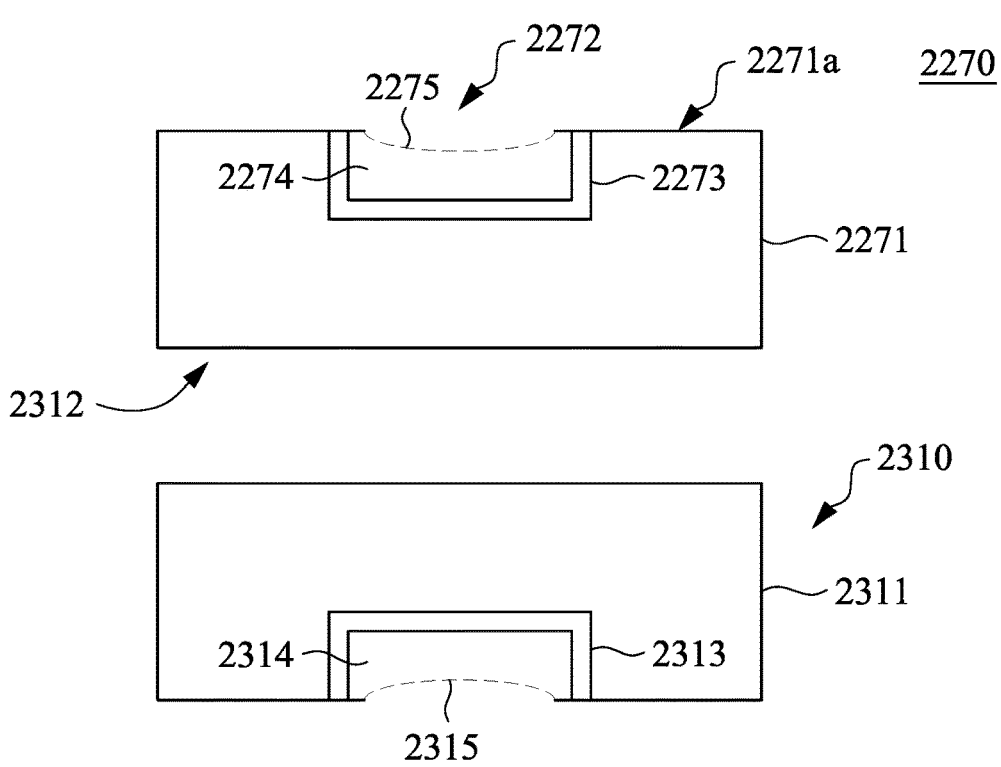
FIG. 20 shows a cross-sectional view of a portion of a bonding structure and bonding structure after a polishing process has been performed according to an embodiment.
Figure 21:
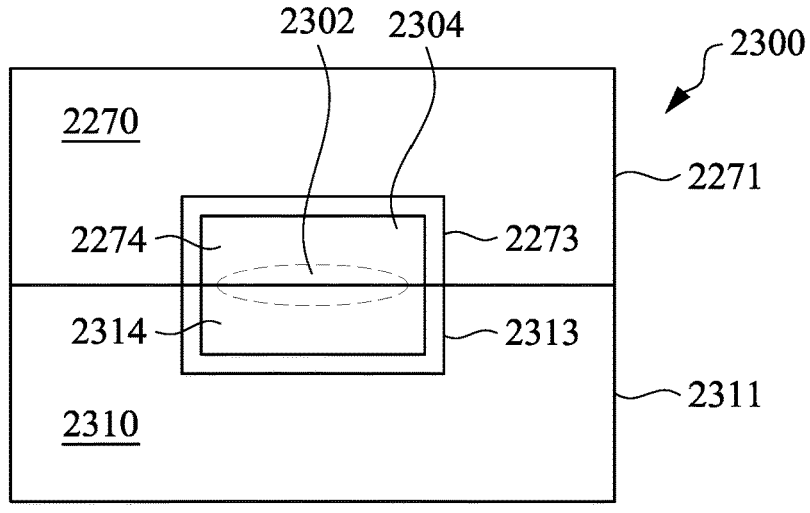
FIG. 21 illustrates a cross-sectional view a bonded structure in accordance with the disclosure.

In an ideal scenario, bonding between conductive material 2152 and conductive material 2252 should result in a seamless bonded active region without void or dish. However, it is observed that voids or dishes can exist in the bonded active region due to the following factors. For example, during a CMP process to make the a surface of the conductive material 2152 level with a bottom surface of the bonding structure 2150, the conductive material 2152 may not be entirely level after the CMP and thus can lead to such a void after the bonding. This can be caused due to imperfection of CMP, especially for miniaturized area for the conductive material 2152. Similar can happen to the conductive material 2252 after the CMP of the conductive material 2252. As another example, the CMP of either conductive material 2152 or 2252 can cause scratch effect to leave pockets of scratch on the conductive material 2152 or 2252. Still as another example, during wafer wet clean process, copper may be lost at the exposed surface of the conductive material 2152 or 252. FIGS. 20-21 illustrates a dishing effect at the bonded conductive material in a bonding structure.

FIG. 20 shows a cross-sectional view of a portion of a bonding structure 2270 and bonding structure 2310 after a polishing process has been performed according to an embodiment. The bonding structures 2270 and 2310 reflects an intermediate fabrication of the bonding structure 2150 and 2250 shown in FIG. 19A. As can be seen, at this stage of the fabrication, the bonding structure 2270 includes a dielectric layer 2271 having an opening 2272, a barrier layer 2273 on the bottom and sidewalls of the opening 2272, and a conductive layer 2274 on the barrier layer 2273 and filling the opening 2272. After the polishing process (e.g. CMP) has been performed, the upper surface of the conductive material 2274 of the bonding structure 2270 may be recessed relative to an upper surface 2271a of the dielectric layer 2271. The polishing process may remove a portion of the barrier layer and a portion of the conductive material 2274 to form a recess 2275 (indicated by the dotted line). As mentioned above, a number of factor can cause the recess 2275.

As also can be seen, the bonding structure 2310 includes a first dielectric layer 2311 having an opening 2312, a first barrier layer 2313 on the opening 2312, and a first conductive material 2314 on the first barrier layer 2313 and filling the opening 2312. In some embodiments, after a polishing process has been performed on the first bonding structure 2310, a recess 2315 may be formed in the first conductive material 2314.

FIG. 21 illustrates a cross-sectional view a bonded structure 2300 in accordance with the disclosure. As can be seen, in FIG. 21, the bond structures 2270 and 2310 shown in FIG. 20 are bonded together to form the bond structure 2300. As can be seen, the recess 2275 and 2315 shown in FIG. 20 form a dish 2302 in the conductive material region 2304 within the bond structure.

Novel Techniques for Addressing the Dishing Effect

Figure 22A:
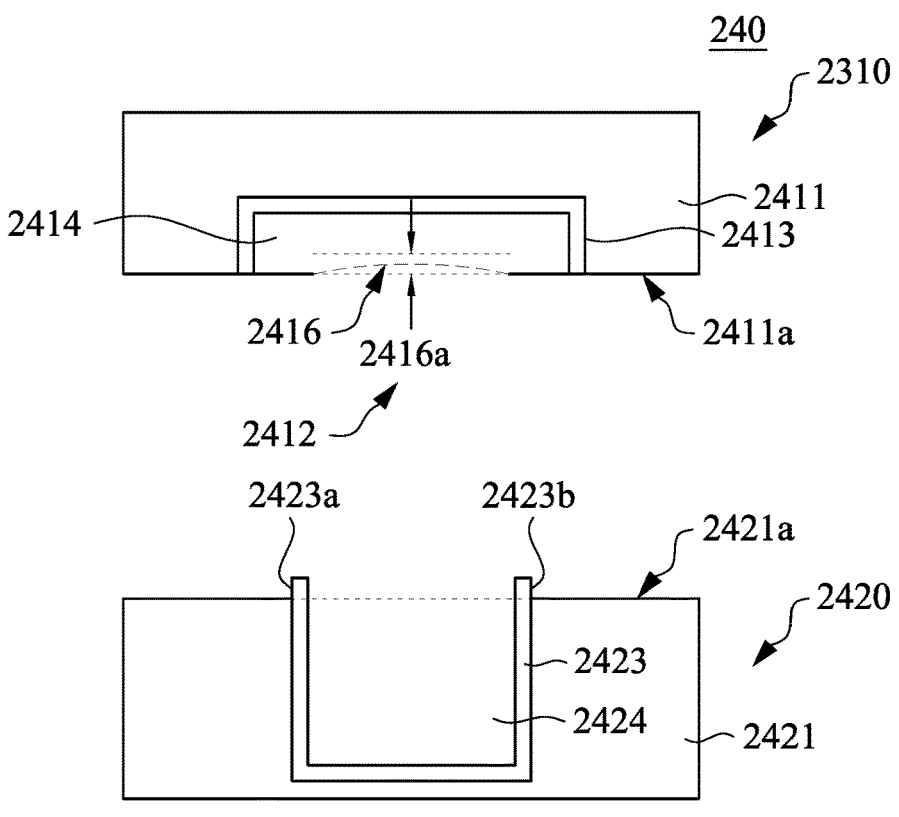
FIG. 22A is a cross-sectional view of a bonded structure including a first bonding structure and a second bonding structure according to an embodiment.
Figure 22B:
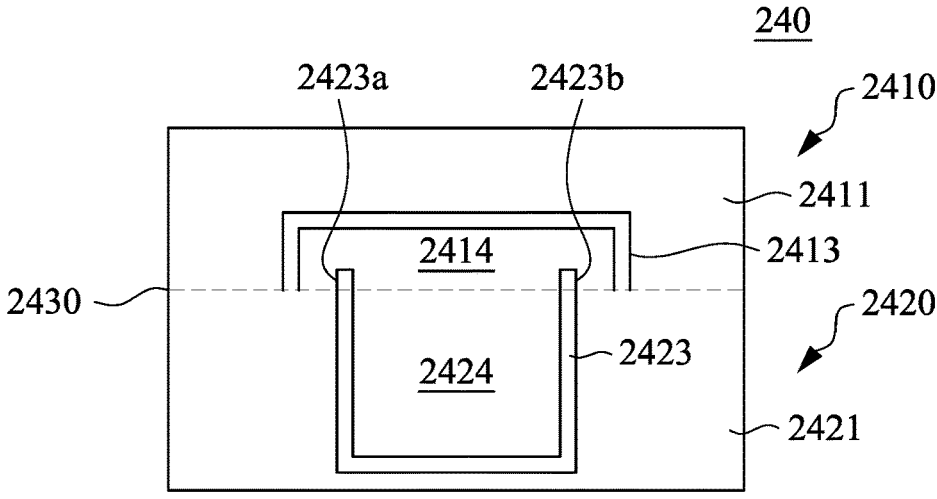
FIG. 22B is a cross-sectional view of a bonded structure by bonding structures shown in FIG. 22A.

In various embodiments, techniques are provided for addressing the aforementioned dishing effect in a conductive material region within a bonded structure. In some embodiments, wet etching is applied to conductive material in bonding structures (such as bond structure 2270 or 2310 shown in FIG. 20) before the bonding structures are bonded together to form the bonded structure. In those embodiments, the wet etching removes dielectric material, barrier material and as well as the conductive material in a bonding structure such that one or more portions of the barrier layer are exposed above both dielectric material and conductive material in the bonding structure. The exposed portion(s) of the barrier layer in this bonding structure is then pressed into the recess part in another bonding structure (may be referred to as a mating bonding structure) when the two bonding structures are bonded together to avoid or reduce dishing in the bonded structure. FIGS. 22A-22B illustrates one example of such a technique.

Exposed Barrier Layer in an Example Bonding Structure for Forming an Example Bonded Structure FIG. 22A is a cross-sectional view of a bonded structure 240 including a first bonding structure 2410 having a recess 2416 and a second bonding structure 2420 having exposed barrier layer 2423 according to an embodiment. Referring to FIG. 22A, the first bonding structure 2410 includes a first dielectric region 2411 having an opening 2412, a first barrier layer 2413 on sidewalls and bottom of the opening 2412, and a first conductive material 2414 on the first barrier layer 2413 and filling the opening 2412. As mentioned, due to various factors, a recess 2416 may be formed in the bonding structure 2410. In an embodiment where the opening 2412 has a circular shape, the first conductive material 2414 has a diameter equal to the diameter of the opening minus two times the thickness of the first barrier layer 2413. In an embodiment where the opening 2412 has a rectangular shape having a width and a length, the first conductive material 2414 has a width equal to the width of the opening minus the side thickness of the first barrier layer 2413 and a length equal to the length of the opening minus the side thickness of the first barrier layer 2413. In an embodiment where the opening 2412 has a square shape, the first conductive material 2414 has a width equal to the width minus two times the side thickness of the first barrier layer 2413. It will be appreciated that the opening can have other regular and non-regular shapes.

As mentioned, recognizing that bonding structures, such as bonding structure 2410 may have a recess such as recess 2416 in the conductive material region, may cause a dishing effect in the bonded structure, additional processes may be performed to bonding structures. In example implementation, for an individual bonding structure 2410, a mating bonding structure is first identified. That is, the bonding structure to be bonded to the bonding structure 2410 is identified. FIG. 22A illustrates such a bonding structure, which is shown as bonding structure 2420. As can be seen, the bonding structure 2420 includes a dielectric layer 2421 having an opening, a barrier layer 2423 on sidewalls and bottom of the opening, and a conductive material 2424 on the barrier layer 2423 and filling the opening. As can be seen, the barrier layer 2423 has two portions, 2423a and 2423b, exposed above the dielectric layer 2421 and the conductive material 2424. As will be described, one or more steps such as wet etching may be performed to form the exposed portion(s) of the barrier layer 2423.

Regarding a shape of the exposed portion(s) of barrier layer 2423, such as portion 2423a or portion 2423b, it is not limited by the present disclosure. A goal of the exposed portion 2423a and/or 2423b is that they are inserted into the conductive material 2414 of first bonding structure when the bonding structure 2420 is bonded to the bonding structure 2410. A bonding force will press the portion 2423*a* and/or 2423*b* into the conductive material 2414. In this way, void in the bonded structure formed by bonding structures 2410 and 2420 can be avoided or reduced. In some embodiments, it is observed that at least some voids in the bonded structure are avoided in this way.

Although it is shown in this example the shape of the portion 2423*a* or 2423*b* is rectangular, this is not intended to be limiting. It should be appreciated that the shape of a barrier layer portion in a bonding structure in accordance with the disclosure may be of other shapes such as triangular, circular, and/or a combination thereof. Different shape choices of exposed barrier portion may have different cost and effectiveness considerations. For example, it is understood that certain geometry shapes may be more difficult to be formed in terms processes needed than other shapes for the exposed barrier portion, but those shapes may also achieve a better reduction of voids in the bonded structure than the other shapes. It is also understood that a specific geometry shape for the exposed barrier portion is a design choice based on such cost and effectiveness factors, and thus is not limited in the present disclosure. That is, an insight of the present disclosure is that a exposed barrier portion in one of two bonding structures is formed so to reduce voids in a bonded structure formed by the two bonding structure. It should not be construed that the present invention merely describes certain shapes of the exposed barrier portion for reducing the aforementioned dishing effect in the bonding structure.

FIG. 22B is a cross-sectional view of a bonded structure 240 by bonding structures 2410 and 2420 shown. Referring to FIG. 22B, the first dielectric region 2411 and the second dielectric layer 2421 of bonding structures 2410 and 2420 are bonded together at the bonding interface 2430 for an oxide-to-oxide bonding. As can be seen, because the exposed barrier portion 2423*a* and 2423*b* protrude from the bonding interface 2430, they are inserted into conductive material 2414 when a force is applied during the bonding of structures 2410 and 2420. Thus this can help avoid and reduce voids in the bonded structure 240. It is understood that the shape of the exposed barrier portion 2423*a* or 2423*b* can affect one or more directions to which it will be pressed into the conductive material 2414 of the bonding structure 2410. In implementation, the shape of the exposed barrier portion 2423*a* or 2423*b* can be controlled according to a design and/or functional consideration. For example, in certain situations, a half-curved dome shape may be selected for exposed barrier portion 2423*a* or 2423*b* so to have it expand side way to cover side areas in the conductive material 2414. However, as mentioned, this is not necessarily the only situations. It is understood, for some bonding structures to be bonded together, the bottom bonding structure may be larger than the top bonding structure. In those situations, a triangular shape may be selected for the exposed barrier portion 2423*a* or 2423*b*. Other situations and shapes for the exposed portions 2423*a* or 2423*b* are contemplated.

In various implementation, the bonding structure 2420 is identified to be processed to have the barrier portion(s) exposed by virtue of the fact that it is to be bonded with bonding structure 2410. As mentioned above, during fabrication of bonding structures 2410 and 2420, one or both of them may have one or more of a recess 2416 in the conductive materials due to various factors mentioned herein. It is an insight of the present disclosure not all of the bonding structures in the bonded structures are to be further processed to expose the barrier layer. In some implementation, as shown here, the bonding structure 2420 is identified because it has a smaller conductive material region than the bonding structure 2410, and thus can create a better meshing/migration effect through one or more exposed barrier portions than the bonding structure 2410. Another consideration is cost. Smaller bonding structure in the two may require less processing than larger bonding structure to expose portions of the barrier layer, which may be slight from a single bonding structure perspective. However, the cost consideration may be sufficient when there are many bonding structures in a layout of semiconductor to be mass produced on wafers. Of course, another consideration is location, depending on a functional or design choice, a bottom or top of the bonding structure may be selected for further processing to form the exposed barrier portion(s). For example, if the top bonding structure is surrounded by other metal connects which may also need further processing or formation, the top bonding structure may be selected to form the exposed barrier portion together with the processing/formation for the aforementioned metal connects. Other scenarios are contemplated.

It should be understood although, in this example, two portions of the barrier layer 2423, 2423*a* and 2423*b*, are exposed, this is not intended to be limiting. In various other embodiments, only one portion of the barrier layer 2423 is exposed, for example portion 2423*a*. It is understood that one or two portions of the barrier layer 423 to be exposed is a design choice and thus is not specifically by the present disclosure. It is also understood that a height of the exposed barrier portion 2423*a* or barrier portion 2423*b* above dielectric layer 2421 and/or the conductive material 2424 is not specifically limited by the present disclosure. In some embodiments, a height of the barrier portion 2423*a* or barrier portion 2423*b* is greater or equal to 1 nanometer (nm) above the conductive material 2424 because of a size of the bonding structure 410 or bonding structure 2420. In some embodiments, a height of the barrier portion 2423*a* or barrier portion 2423*b* is greater or equal to 1.5 nm above the dielectric layer 2421. This being said, heights of the exposed barrier portion 2423*a* or 2423*b* relative to the dielectric layer 2421 and conductive material 2424 can be the same or different. For example, it is contemplated that the height of the exposed barrier portion 2423*a* relative to the dielectric layer 2421 can be less than the height of the exposed barrier portion 2423*a* relative to the conductive material 2424. It is also understood that the heights of the exposed barrier portions 2423*a* and 2423*b* with respect to the conductive material 2424 do not have to be the same. For example, it is contemplated the height of the barrier portion 2423*a* with respect to the conductive material 424 may be greater than the height of the barrier portion 2423*b* with respect to the conductive material 2424. Similarly, it is also understood that the heights of the exposed barrier portions 2423*a* and 2423*b* with respect to the dielectric layer 2421 do not have to be the same. For example, it is contemplated the height of the barrier portion 2423*a* with respect to the dielectric layer 2421 may be greater than the height of the barrier portion 2423*b* with respect to the dielectric layer 2421.

Figure 23A:
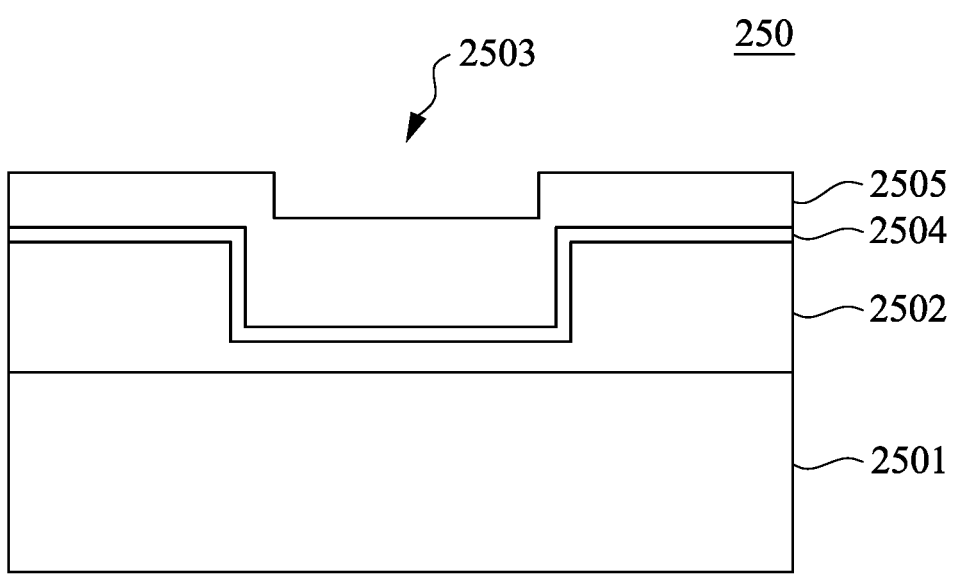
FIGS. 23A-23B illustrate simplified a fabrication process of a first bonding structure.
Figure 23B:
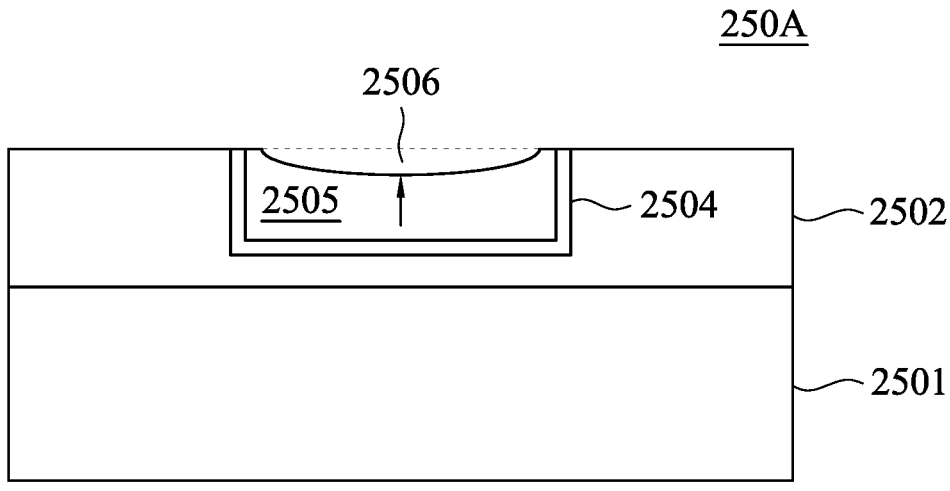

An Example Process for Fabricating a Bonded Structure in Accordance with the Disclosure Attention is now directed to FIGS. 23A-14C, which illustrate an example process for fabricating a bonded structure in accordance with the disclosure. They will be described with reference to FIGS. 19A-22B. FIGS. 23A-23B illustrate simplified a fabrication process of a first bonding structure 250A. Referring to FIG. 23A, at a first stage of the fabrication process, the first bonding structure 250 includes a substrate 2501, an dielectric layer 2502 including an opening 2503 on the substrate 2501, a barrier layer 2504 on the surface of the dielectric layer 2502, and a conductive layer 2505 cover the opening 2503. The opening 2503 can have a regular geometric or non-regular (irregular) geometric shape. Some examples of regular geometric shapes can include squares, rectangles, circles, ellipses, polygons, and the likes having the same or different sizes. In some embodiments, the opening 2503 can include a plurality of regular, irregular geometric shapes and combinations thereof.

Due to the concern of copper diffusion in dielectric layer 2504, barrier layer 2504 is deposited to line the opening 2503. The barrier layer 2504 separates the copper-containing conductive layer 2505 from the insulating material dielectric layer 2504. According to one or more embodiments, the barrier layer 2504 is made of a copper diffusion barrier material. In some embodiments, barrier layer 2504 is made of TaN. In some embodiments, barrier layer 2504 has thickness in a range from about 10 Å to about 1000 Å.

Referring to FIG. 23B, at a second stage of the fabrication, a planarization (e.g., a chemical mechanical polishing) process is performed on the conductive layer 2505 to remove excess copper on the upper surface of the conductive layer 2505. As mentioned, the planarization process can create a recess 2506 due to various factors mentioned herein. In some embodiments, the thus formed first bonding structure 250A is similar or the same as the first bonding structure 2410 described and shown with reference to FIG. 22A.

Figure 24A:
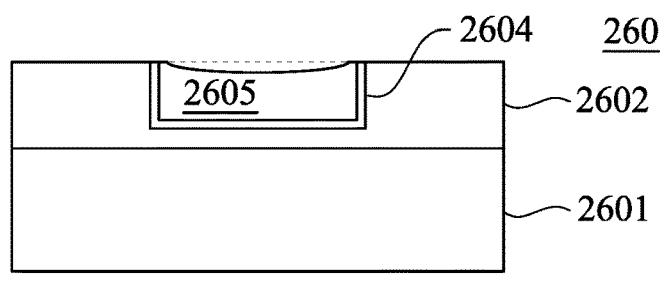
FIGS. 24A-24B are simplified cross-sectional views of a manufacturing process of a second bonding structure according to an embodiment.
Figure 24B:
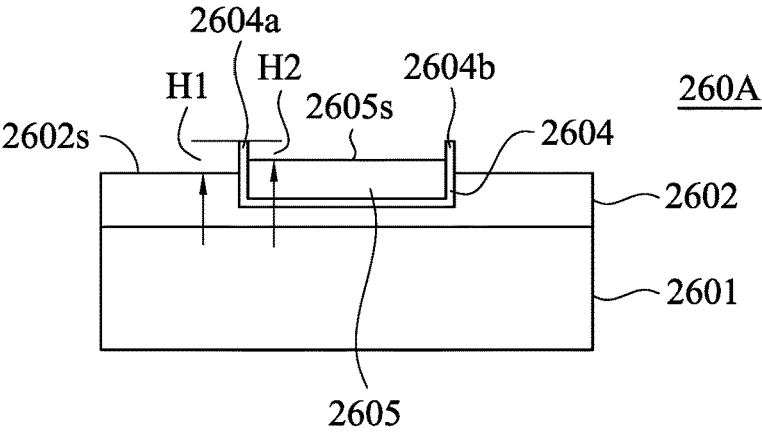

FIGS. 24A-24B are simplified views of a manufacturing process of a second bonding structure 260A according to an embodiment. The second bonding structure 260A can be similar or the same as the second bonding structure 2420. In an embodiment, the manufacturing process can include providing a substrate 2601, a dielectric layer 2602 including an opening 2603 on the substrate 2601, a barrier layer 2604 on the surface of the dielectric layer 2602, and a conductive layer 2605 on the barrier layer 2604 and covering the opening 2603. The manufacturing process also includes performing a CMP process on the conductive layer 2605 to remove excess copper on the upper surface of the conductive layer 2605 to obtain an intermediate bonding structure 260, as shown in FIG. 24A. In some embodiments, the intermediate bonding structure 260 can include a conductive layer 2605 having an upper surface substantially flush with the upper surface of the dielectric layer 2602. In some other embodiments, the intermediate bonding structure 260 can include a conductive layer 2605 similar to that of the bonding structure 250A of FIG. 23B. For example, the conductive layer 2605 may include a recess or a concave portion due to dishing effects.

Thereafter, referring to FIG. 24B, an etch process is performed to remove a portion of the dielectric layer 2602, the barrier layer 2604 and conductive layer 2605 so that portions 2604a and 2604b of the barrier layer 2604 are exposed as shown. The etch process can be dry etching, wet etching, or a combination of dry and wet etchings. In an embodiment, a wet etching can be carried out that has an etch rate selectivity so that etch rate for the dielectric layer 2602 is greater than that for the conductive layer 2605, which are both greater than that for the barrier layer 2604. In an exemplary embodiment, the wet etching includes a solution having a diluted hydrofluoric acid (e.g., 0.1% to 50%) for an etch time duration in a range between 1 second and 30 minutes.

Figure 24C:
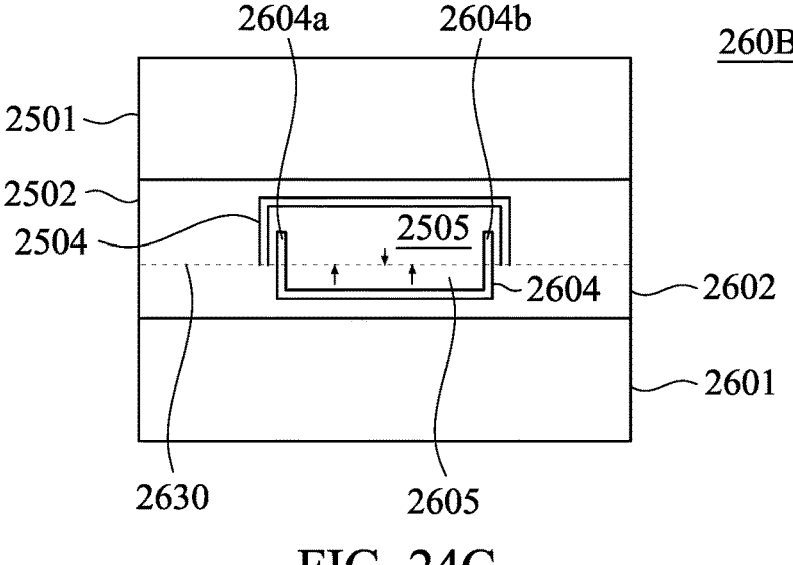
FIG. 24C is a simplified cross-sectional view of a manufacturing process bonding the first and the second bonding structures to form a bonded structure according to an embodiment.

In some embodiments, after the wet etching has been carried out, the barrier layer 2604 has one or more portions, such as exposed barrier portion 2604a and exposed barrier portion 2604b shown in this example, higher than an upper surface 2602s of the dielectric layer 2602. This is illustrated by the height difference H1 between the exposed barrier portion 2604a and the upper surface 2602s of the dielectric layer 2602. In some other embodiments, after the wet etching has been carried out, the barrier layer 2604 has one or more portions, such as exposed barrier portion 2604a and exposed barrier portion 2604b shown in this example, higher than an upper surface 2605s of the conductive layer 2605. This is illustrated by the height difference H2 between the exposed barrier portion 2604a and the upper surface 2605s of the conductive layer 2602. In some embodiments, etching can be controlled such that the values of H1 and H2 are controlled according to one or more design considerations. However, this is not necessarily the only case, in some embodiments, height H1 and/or H2 are not specifically controlled by the etching process. In one embodiment, a predetermined cycles of wet etching are performed to the bonding structure 260B to create exposed barrier portions 2604a and 2604b Next a bonding force is applied to bonding structure 250A and 260A to form a bonded structure 260B. FIG. 6C is a cross-sectional view of an example bonded structure 260B in accordance with the disclosure. As can be seen from FIG. 24C, because of the bonding force, a surface squeeze effect (illustrated by the arrows) takes place at bonding interface 2630 to cause the conductive layer 2605 in the bonding structure 260A and the exposed barrier portions 2604a and 2604b to be inserted into the conductive layer 2505 of the bonding structure 250A.

Next an annealing is performed at a temperature in a range between about 200° C. and 600° C. to bond the dielectric layers 2502, 2602 and the conductive layers 2505, 2605. The annealing process promotes copper migration and copper grain size increase to form a smooth interface and good electrical interconnection between the conductive layers 2505 and 2605 and a stable oxide-to-oxide bonding. In some embodiments, the bonding is performed under a pressure in a range between about 0.7 bar to about 10 bar. In some embodiments, the bonding process may be performed in an inert environment, e.g., with an inert gas including $N_2$, Ar, He, or combinations thereof. The resulting stack structure is similar to the stack structure as shown in FIG. 22B.

Figure 25:
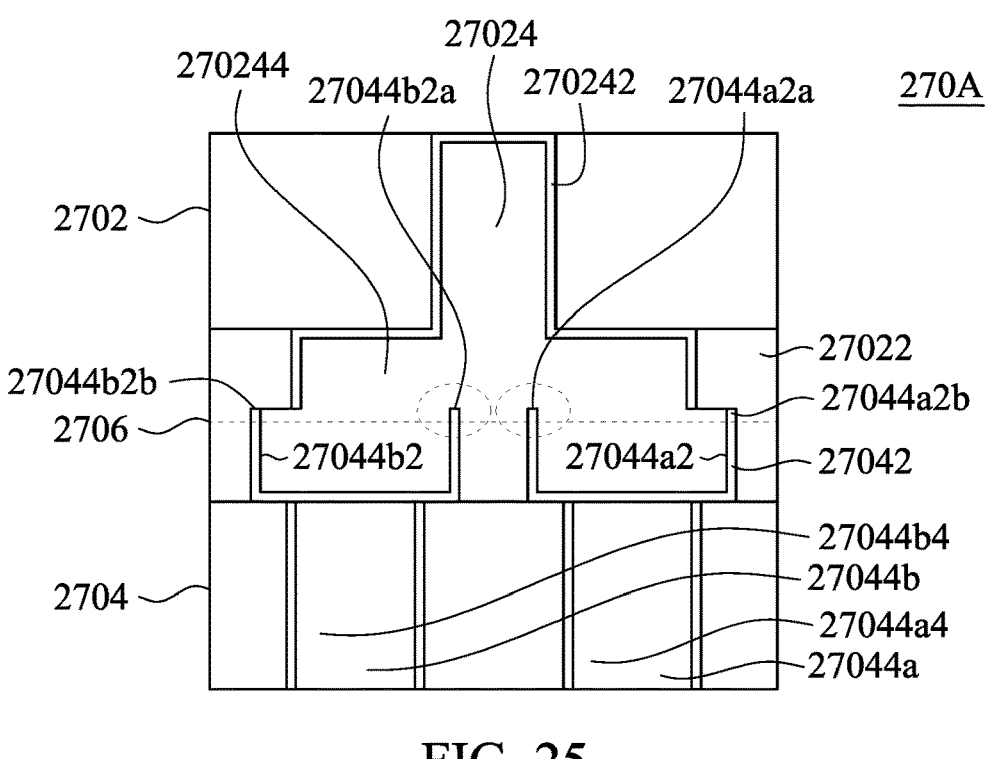
FIG. 25 illustrates another example of a bonded structure in accordance with the disclosure.
Figure 26:
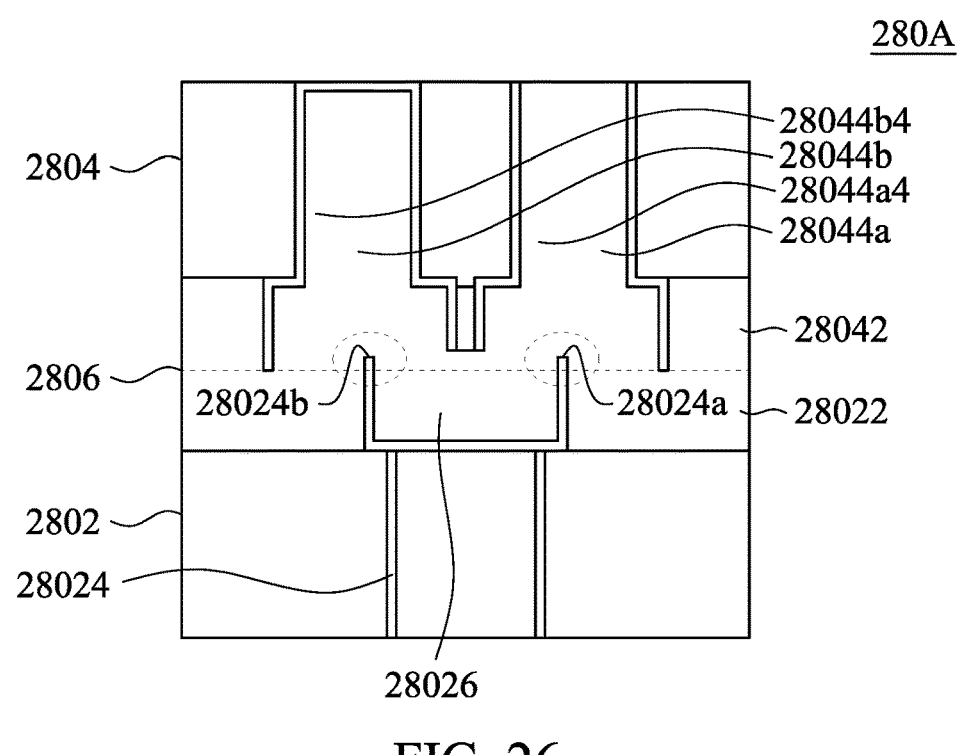
FIG. 26 illustrates another example of a bonded structure in accordance with the disclosure.
Figure 27:
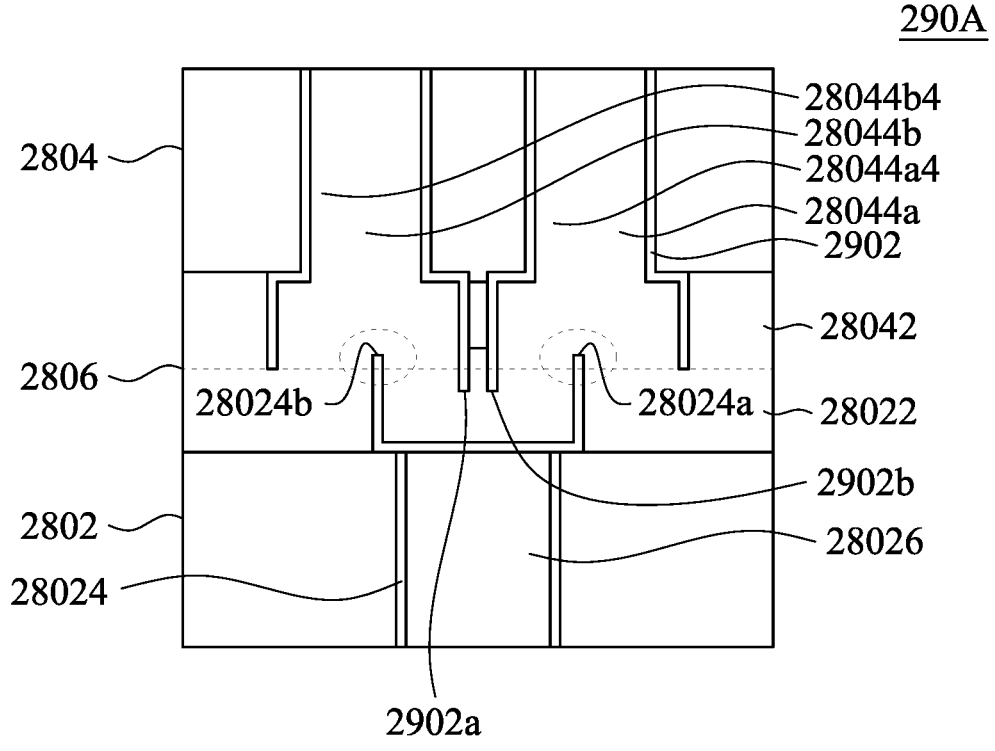
FIG. 27 illustrates still another example of a bonded structure in accordance with the disclosure.

FIGS. 25-27 show various examples of bonded structures in accordance with the disclosure. FIG. 25 is a cross-sectional view of a bonded structure 270A in accordance with the disclosure. As can be seen, the bonded structure 270A in this example has a first bonding structure 2702 and a bonding structure 2704 bonded together at bonding interface 2706. The first bonding structure 2702 has a dielectric layer 27022, a conductive material area 27024 and/or any other components. The conductive material area 27024 has conductive material 270244 and barrier layer 270242. This example illustrates that bonding in accordance with the present disclosure can have one-to-many bonding such that the bonding structure 2702 on the top has a single conductive material area 27024 and is bonded to two conductive material areas 27044a and 27044b of the second bonding structure 2704 at bonding interface 2706. As can be seen, the conductive material area 27024 is larger than the individual conductive material areas 27044a and 27044b.

In this example, as can be seen, the conductive areas 27044a has a conductive material 27044a4, which can be copper or a copper alloy; and the conductive area 27044b has a conductive material 27044*b*4, which can be copper or a copper alloy. As still can be seen, portions of conductive areas 27044*a* and 27044*b* are bonded with the conductive area 27024, and portions conductive areas 27044*a* and 27044*b* are bonded with the dielectric layer information collection component 27022 of the first bonding structure 2702. As still can be seen, portions of barrier layer 27044*b*2 are exposed to form exposed barrier portions 27044*b*2*a* and 27044*b*2*b*. In this example, the exposed barrier portion 27044*b*2*a* is inserted into conductive material 270244 in the conductive material area 27024 of the first bonding structure 2702. In this example, the exposed barrier portion 27044*b*2*b* is inserted into dielectric layer 27022 of the first bonding structure 2702. Similarly, the exposed barrier portion 27044*a*2*a* is inserted into the conductive material 270244 and the exposed barrier portion 27044*a*2*b* is inserted into the dielectric layer 27022.

FIG. 26 illustrates another example of a bonded structure 280A in accordance with the disclosure. In this example, the bonded structure 280A has two bonding structures 2802 and 2804 bonded at bonding interface 2806. This example can be viewed as an inverse of the example shown in FIG. 25. That is, the top bonding structure 2804 in this example has two conductive material areas, 28044*a* and 28044*b*, are bonded to a single conductive material area 28026 in the bottom bonding structure 2802. As can be seen, the conductive material area has a barrier layer 28024 having exposed portions 28024*b* and 28024*a* inserted into conductive materials in each of the conductive material areas, namely conductive materials 28044*b*4 and 28044*a*4. As still can be seen, portions of the conductive materials areas 28044*a* and 28044*b* are bonded to dielectric layer 28022 of the bottom bonding structure 2802; and portions of the dielectric layer 28042 of the top bonding structure 2804 is also bonded to the dielectric layer 28022. It is understood, a size of the conductive material area 28026 may be the same, smaller than or larger than the individual ones of conductive material areas 28044*a* and 28044*b*. This example is to show that bonding in accordance with the disclosure can have many-to-one structure as shown with the top bonding structure having conductive material areas bonded to both conductive material areas and dielectric layer of the bottom bonding structure.

FIG. 27 illustrates another example of a bonded structure 290A in accordance with the disclosure References are made to FIG. 26. Please refer to FIG. 26 for descriptions of reference numbers used in FIG. 26. In this example, as can be seen, the top bonding structure 2804 has a barrier layer 2902 in the conductive material areas 28044*a* and 28044*b*. As also can be seen, the barrier layer 2902 has a portion 2902*a* exposed in the conductive material area 28044*b* and is inserted into the conductive material area 28026; and has a portion 2902*b* exposed in the conductive material area 28044*a* and is inserted into the conductive material area 28026. This example illustrates that barrier layers on both bonding structures, 2802 and 2804, can be exposed and inserted into conductive material areas of the opposing bonding structure.

Figure 28:
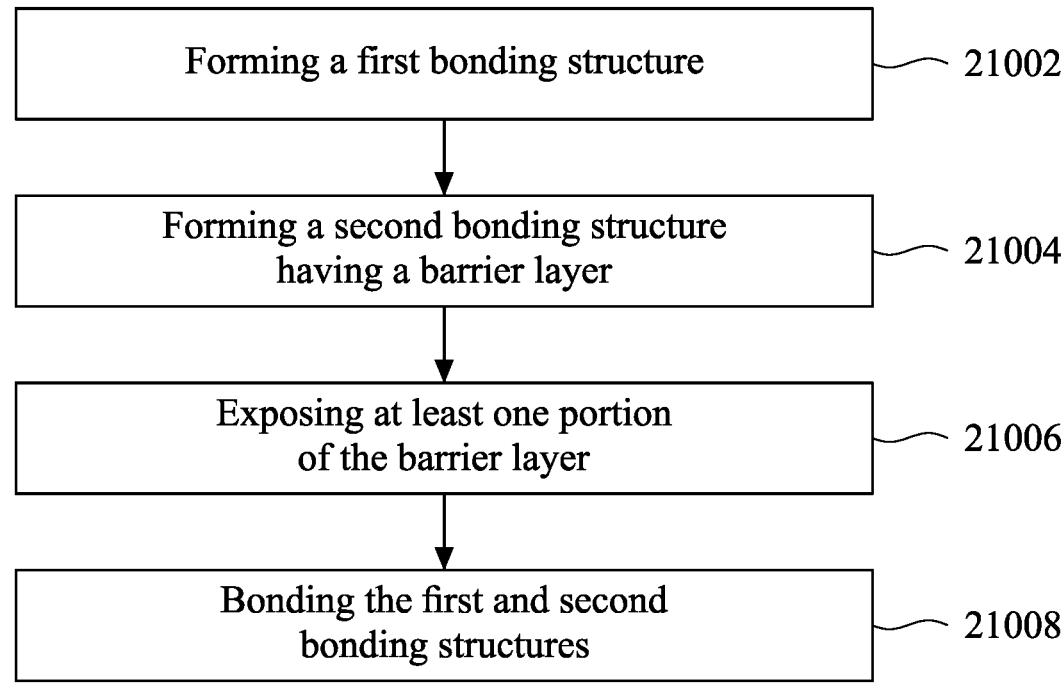
FIG. 28 illustrates an example method for forming a semiconductor package having a bonded structure in accordance with the disclosure.

FIG. 28 illustrates an example method 21000 for forming a semiconductor package having a bonded structure in accordance with the disclosure. It should be understood although operations illustrated in FIG. 28 are arranged in a sequence, this sequence is not intended to be limiting. One or more operations shown in FIG. 28 may be performed before or after their positions shown in FIG. 28 in some other examples.

At 21002, a first bonding structure is formed. An example of forming the first bonding structure is illustrated and described in connection with FIGS. 23A-23B.

At 21004, a second bonding structure is formed. The second bonding structure formed at 21004 has a barrier layer in a conductive material area of the second bonding structure. An example of forming the first bonding structure is illustrated and described in connection with FIG. 24A.

At 21006, at least one portion of the barrier layer in the second bonding structure is exposed. An example of exposing the at least one portion of the barrier layer is illustrated and described in connection with FIG. 24B.

At 21008, the first and second bonding structures are bonded together. An example of bonding the first and second bonding structure is described and illustrated in connection with FIG. 24C.

In accordance with embodiments of the disclosure, a semiconductor package is provided. The semiconductor package includes: a first die, a second die and a bonding member arranged between the first and second die, wherein the bonding member is configured to facilitate a bonding between the first and second die and comprises a first area and a second area. The first area is configured with a first set of bonding pads configured to provide electrical connections between the first and second dies. The second area is configured with a second set of bonding pads configured to provide electrical connections between the first and second die, wherein a quantity of bonding pads in the first set is larger than a quantity of bonding pads in the second set. The second area is configured with a dummy structure in one or more spaces where a bonding pad is not present in the second area, the dummy structure not providing an electrical connection between the first and second dies.

In accordance with embodiments of the disclosure, a semiconductor package is provided. The semiconductor package includes: multiple stacked dies having at least one substrate and dielectric layers above the substrate, the dielectric layers including a first dielectric layer comprising metal lines, vias, a part of a through-silicon-via (TSV) protection structure, wherein an individual one of the metal line is connected to a corresponding one of the vias in the first dielectric layer; a TSV arranged through the dielectric layers and into the substrate; and a metal interconnect structure arranged on top of the TSV to provide electrical connections to the metal lines in the dielectric layers; and, wherein the TSV protection structure is arranged to surround the TSV in the dielectric layers.

In accordance with embodiments of the disclosure, a semiconductor package is provided. The semiconductor package includes: a bonded structure having a first bonding structure and a second bonding structure, the first bonding structure and the second bonding structure being bonded to form the bonded structure, wherein the first bonding structure comprises a first conductive material area, a first barrier layer, a first dielectric layer, the first barrier layer surrounding the first conductive material area and the first dielectric are surrounding the first barrier layer; and the second bonding structure comprises a second conductive material area, a second barrier layer, a second dielectric area, the second barrier layer surrounding the second conductive material area and the second dielectric area surrounding the second barrier layer. At least a portion of the second barrier layer is exposed in the second bonding structure before the second bonding structure is bonded to the first bonding structure to facilitate the second bonding structure to be pressed into the first bonding structure, and the at least one portion of the second barrier layer is exposed above the second dielectric layer and the second conductive material layer, and is configured to be inserted into the first conductive material area when the first bonding structure is bonded to the second bonding structure.

The foregoing merely outlines features of embodiments of the disclosure. Various modifications and alternatives to the described embodiments will be apparent to those skilled in the art in view of the teachings herein. Those skilled in the art will appreciate that equivalent constructions do not depart from the scope of the present disclosure, and that they may make various changes, substitutions, and alterations herein without departing from the spirit and scope of the present disclosure.

What is claimed is:

1. A semiconductor package comprising:
a first die;
a second die; and
a bonding member arranged between the first and second die, wherein the bonding member is configured to facilitate a bonding between the first and second die and comprises a first area and a second area;
wherein the first area is configured with a first set of bonding pads configured to provide electrical connections between the first and second dies;
wherein the second area is configured with a second set of bonding pads configured to provide electrical connections between the first and second die, a quantity of bonding pads in the first set being larger than a quantity of bonding pads in the second set;
wherein the second area is configured with a dummy structure in one or more spaces where a bonding pad is not present in the second area, the dummy structure not providing an electrical connection between the first and second dies, wherein the dummy structure has a shape selected from the group consisting of an L-shape, an inverse L-shape, and an I-shape configured to occupy the one or more spaces to increase pattern density uniformity within the second area.

2. The semiconductor package of claim 1, wherein the dummy structure comprises a number of dummy pads arranged to cause a pattern density in the second area to be substantially the same as a pattern density in the first area.

3. The semiconductor package of claim 1, wherein the dummy structure comprises a trench structure filled with a metal, the trench being arranged to cause a pattern density in the second area to be substantially the same as a pattern density in the first area.

4. The semiconductor package of claim 1, wherein the dummy structure comprises a material of the bonding pads in the second set, wherein the material comprises at least one of copper, aluminum, or tungsten.

5. The semiconductor package of claim 1, wherein the dummy structure has a polygonal, non-angular, and/or combination polygonal shape.

6. The semiconductor package of claim 1, wherein a gap between the dummy structure and a neighboring bonding pad in the second set is greater than 0.1 um.

7. The semiconductor package of claim 1, wherein the dummy structure comprises a first portion and a second portion, the first portion being bonded to the second portion vertically in the bonding member.

8. The semiconductor package of claim 7, wherein the first portion has an equal size to the second portion.

9. The semiconductor package of claim 7, wherein the first portion has an unequal size to the second portion.

10. A semiconductor package comprising:
a first die;
a second die stacked on the first die; and
a hybrid bonding member arranged between the first die and the second die, the hybrid bonding member comprising a dielectric material, bonding pads and a dummy structure;
wherein the bonding pads are configured to provide electrical connections between the first and second dies and are surrounded by the dielectric material in the hybrid bonding member;
wherein the dummy structure is configured in one or more spaces where a bonding pad is not present in the hybrid bonding member, the dummy structure not providing an electrical connection between the first and second dies;
wherein the hybrid bonding member comprises a first area having a first pattern density defined by a first subset of the bonding pads therein and a second area having fewer bonding pads from a second subset of the bonding pads than the first subset, the dummy structure being located in the second area and having a shape selected from the group consisting of an L-shape, an inverse L-shape, and an I-shape configured to occupy the one or more spaces to increase pattern density uniformity within the second area relative to the first area.

11. The semiconductor package device of claim 10, wherein a gap between the dummy structure and a neighboring bonding pad is greater than 0.1 um.

12. The semiconductor package of claim 10, wherein the dummy structure comprises a first portion and a second portion, the first portion being bonded to the second portion vertically in the hybrid bonding member.

13. The semiconductor package of claim 12, wherein the first portion has an equal size to the second portion.

14. A method for fabricating a semiconductor package, comprising:
arranging bonding pads in a first portion of a bonding member on a first die, the bonding member comprising the first area and a second area;
arranging bonding pads in a second portion of the bonding member on a second die;
arranging a first portion of a dummy structure in the first portion of the bonding member;
arranging a second portion of the dummy structure in the second portion of the bonding member; and
bonding the first die and second die at the first portion and the second portion of the bonding member;
wherein the first area is configured with a first set of bonding pads configured to provide electrical connections between the first and second dies;
wherein the second area is configured with a second set of bonding pads configured to provide electrical connections between the first and second die, a quantity of bonding pads in the first set being larger than a quantity of bonding pads in the second set;
wherein the dummy structure is arranged in one or more spaces in the second area where a bonding pad is not present in the second area, the dummy structure not providing an electrical connection between the first and second die;
wherein the dummy structure has a shape selected from the group consisting of an L-shape, an inverse L-shape, and an I-shape configured to occupy the one or more spaces to increase pattern density uniformity within the second area.

15. The method of claim 14, the dummy structure comprises a number of dummy pads arranged to cause a pattern density in the second area to be substantially the same as a pattern density in the first area.

16. The method of claim 14, wherein the dummy structure comprises a trench structure filled with a metal, the trench being arranged to cause a pattern density in the second area to be substantially the same as a pattern density in the first area.

17. The method of claim 14, wherein a gap between the dummy structure and a neighboring bonding pad in the second set is greater than 0.1 um.

18. The method of claim 14, wherein the first portion of the bonding member has an equal size to the second portion of the bonding member.

19. The method of claim 14, wherein the dummy structure has a polygonal, non-angular, and/or combination polygonal shape.

20. The method of claim 14, wherein the dummy structure comprises a trench structure filled with a metal, the trench being arranged to cause a pattern density in the second area to be substantially the same as a pattern density in the first area.

* * * * *